(12) United States Patent
Eguchi et al.

(10) Patent No.: US 9,589,810 B2
(45) Date of Patent: Mar. 7, 2017

(54) MANUFACTURING METHOD OF POWER MOSFET USING A HARD MASK AS A CMP STOP LAYER BETWEEN SEQUENTIAL CMP STEPS

(71) Applicant: Renesas Electronics Corporation, Tokyo (JP)

(72) Inventors: Satoshi Eguchi, Kanagawa (JP); Daisuki Taniguchi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/950,200

(22) Filed: Nov. 24, 2015

(65) Prior Publication Data
US 2016/0079079 A1    Mar. 17, 2016

Related U.S. Application Data

(62) Division of application No. 14/154,260, filed on Jan. 14, 2014, now Pat. No. 9,240,464.

(30) Foreign Application Priority Data

Jan. 21, 2013    (JP) .................................. 2013-008213

(51) Int. Cl.
*H01L 21/306*    (2006.01)
*H01L 29/66*    (2006.01)
(Continued)

(52) U.S. Cl.
CPC .... *H01L 21/30625* (2013.01); *H01L 21/0217* (2013.01); *H01L 21/02164* (2013.01);
(Continued)

(58) Field of Classification Search
CPC ........... H01L 21/30625; H01L 21/3086; H01L 21/3081; H01L 21/02164; H01L 21/0217;
(Continued)

(56) References Cited

U.S. PATENT DOCUMENTS 6,297,534 B1    10/2001    Kawaguchi et al.
8,563,393 B2    10/2013    Eguchi et al.
(Continued)

FOREIGN PATENT DOCUMENTS

JP    2009-224606 A    10/2009
JP    2010-118536    *    5/2010
(Continued)

OTHER PUBLICATIONS

Official Action dated Nov. 10, 2016, issued in corresponding Japanese application (No. 2013-008213).

*Primary Examiner* — Minh-Loan Tran
*Assistant Examiner* — Farid Khan
(74) *Attorney, Agent, or Firm* — Womble Carlyle

(57) ABSTRACT

A manufacturing method of a power MOSFET employs a hard mask film over a portion of the wafer surface as a polishing stopper, between two successive polishing steps. After embedded epitaxial growth is performed in a state where a hard mask film for forming trenches is present in at least a scribe region of a wafer, primary polishing is performed by using the hard mask film as a stopper, and secondary polishing is then performed after the hard mask film is removed.

20 Claims, 40 Drawing Sheets

(51) Int. Cl.
*H01L 29/78* (2006.01)
*H01L 29/06* (2006.01)
*H01L 21/308* (2006.01)
*H01L 23/544* (2006.01)
*H01L 21/02* (2006.01)
*H01L 29/861* (2006.01)
*H01L 29/739* (2006.01)
*H01L 29/10* (2006.01)
*H01L 21/78* (2006.01)
*H01L 23/00* (2006.01)

(52) U.S. Cl.
CPC ...... *H01L 21/3081* (2013.01); *H01L 21/3083* (2013.01); *H01L 21/3086* (2013.01); *H01L 23/544* (2013.01); *H01L 29/0634* (2013.01); *H01L 29/66674* (2013.01); *H01L 29/66681* (2013.01); *H01L 29/66712* (2013.01); *H01L 29/66727* (2013.01); *H01L 29/7802* (2013.01); *H01L 29/7816* (2013.01); *H01L 21/78* (2013.01); *H01L 24/03* (2013.01); *H01L 24/05* (2013.01); *H01L 29/1095* (2013.01); *H01L 29/6634* (2013.01); *H01L 29/7395* (2013.01); *H01L 29/7396* (2013.01); *H01L 29/8611* (2013.01); *H01L 2223/5442* (2013.01); *H01L 2223/5446* (2013.01); *H01L 2223/54426* (2013.01); *H01L 2224/02166* (2013.01); *H01L 2224/0345* (2013.01); *H01L 2224/05624* (2013.01); *H01L 2924/00014* (2013.01); *H01L 2924/13055* (2013.01); *H01L 2924/13091* (2013.01)

(58) Field of Classification Search
CPC ........... H01L 21/3083; H01L 29/66674; H01L 29/66727; H01L 29/7802; H01L 29/0634; H01L 29/66681; H01L 29/7816; H01L 29/66712; H01L 23/544
See application file for complete search history.

(56) References Cited

U.S. PATENT DOCUMENTS

| | | | |
|---|---|---|---|
| 8,673,749 B2 | 3/2014 | Eguchi et al. | |
| 2006/0006458 A1* | 1/2006 | Motai | H01L 29/0634 257/330 |
| 2006/0157813 A1* | 7/2006 | Saito | H01L 29/0634 257/498 |
| 2006/0284248 A1* | 12/2006 | Saito | H01L 29/0634 257/341 |
| 2008/0050876 A1* | 2/2008 | Matocha | H01L 29/0634 438/269 |
| 2011/0115033 A1* | 5/2011 | Tamaki | H01L 29/7395 257/409 |
| 2011/0207330 A1* | 8/2011 | Ohuchi | H01L 21/3086 438/703 |
| 2011/0241111 A1* | 10/2011 | Tamaki | H01L 29/0634 257/342 |
| 2011/0287617 A1* | 11/2011 | Kodama | H01L 23/544 438/527 |
| 2011/0294278 A1* | 12/2011 | Eguchi | H01L 23/544 438/800 |

FOREIGN PATENT DOCUMENTS

| JP | 2010-118536 A | 5/2010 |
|---|---|---|
| JP | 2009-224606 | * 10/2013 |

* cited by examiner

MANUFACTURING METHOD OF POWER MOSFET USING A HARD MASK AS A CMP STOP LAYER BETWEEN SEQUENTIAL CMP STEPS

CROSS-REFERENCE TO RELATED APPLICATIONS

This is a Divisional of U.S. patent application Ser. No. 14/154,260, filed Jan. 14, 2014, now U.S. Pat. No. 9,240,464, which claims priority Japanese Patent Application No. 2013-008213 filed on Jan. 21, 2013. The contents of the aforementioned applications are incorporated by reference in their entirety.

BACKGROUND

The present application relates to a manufacturing method of a semiconductor integrated circuit device (or a semiconductor device), which can be applied, for example, to a manufacturing process of a power system semiconductor device.

Japanese Unexamined Patent Publication No. 2010-118536 (Patent Document 1) relates to embedded epitaxial growth for forming a super junction, etc., in a manufacturing process of a power system semiconductor device. In Patent Document 1, a technique is disclosed in a first example, in which a cap film comprised of a silicon oxide film is formed over the surface of a silicon substrate between the whole trenches in cell regions and around a target, and after embedded epitaxial growth is performed in that state, CMP (Chemical Mechanical Polishing) is performed. In this example, in order to leave the cap film around the target, only a first part of an overlying epitaxial layer is removed by the CMP, and then the remaining second part of the overlying epitaxial layer is removed by performing dry etch back on Si. On the other hand, a technique is disclosed in a second example, in which after trenches are formed by using a silicon oxide film as a mask, a cap film comprised of a silicon oxide film is left in a recess portion around a target, and after embedded epitaxial growth is performed in that state, the whole of an epitaxial layer is removed by performing CMP.

Japanese Unexamined Patent Publication No. 2011-249634 (Patent Document 2) relates to embedded epitaxial growth for forming super junction, etc., in a manufacturing process of a power system semiconductor device. In Patent Document 2, a technique is disclosed, in which after trenches for forming a super junction are formed, embedded epitaxial growth is performed in a state where the whole of a hard mask film for processing the trenches, such as a silicon oxide film, is left, and thereafter flattening of the surface is performed. Herein, in the flattening of the surface, after a first CMP treatment is first performed by using the hard mask film for processing the trenches as a stopper, the hard mask film is removed by wet etching, etc., and thereafter, a second CMP treatment is performed.

Japanese Unexamined Patent Publication No. 2009-224606 (Patent Document 3) relates to embedded epitaxial growth for forming a super junction, etc., in a manufacturing process of a power system semiconductor device. In Patent Document 3, a technique is disclosed, in which after trenches for forming super junction are formed, embedded epitaxial growth is performed in a state where the whole of a hard mask film for processing the trenches is removed, and thereafter CMP is performed.

PATENT DOCUMENTS

[Patent Document 1] Japanese Unexamined Patent Publication No. 2010-118536
[Patent Document 2] Japanese Unexamined Patent Publication No. 2011-249634
[Patent Document 3] Japanese Unexamined Patent Publication No. 2009-224606

SUMMARY

There are basically three methods in embedded epitaxial growth: (1) a method (referred to as a "whole mask remaining method") in which embedded epitaxial growth is performed in a state where almost the whole of a hard mask for processing trench is left; (2) a method (referred to as a "whole mask removed method") in which embedded epitaxial growth is performed in a state where almost the whole of a hard mask for processing trench is removed; and (3) a simple combination method in which the above two methods are simply combined.

In the whole mask remaining method, even if a variation in the speed of the embedded epitaxial growth in a wafer is large, a variation in the thickness can be absorbed by polishing using the hard mask for processing trench as a polishing stopper. On the other hand, if the thickness of an overgrowth layer in the embedded epitaxial growth is large, a crystal defect is caused near the surface due to a difference of the coefficients of thermal expansion between the hard mask for processing trench and a silicon substrate. In addition, the depth of the crystal defect becomes large in proportion to the thickness of the overgrowth layer.

In the whole mask removed method, such a crystal defect is not caused in principle, but it is difficult to reduce, by polishing, a variation in the thickness in the wafer plane, which is caused by embedded epitaxial growth.

In one simple combination method, after the embedded epitaxial growth is performed such that a hard mask for processing a trench is left only in a scribe region, primary flattening is performed by polishing using the hard mask as a stopper, and then secondary flattening is further performed by dry etch back. However, this has the problem that the flattening is not sufficiently performed because the secondary flattening is performed by dry etch back.

In another simple combination method, after embedded epitaxial growth is performed such that a hard mask for processing trench is left only in a recess portion of a scribe region, direct flattening is performed by the polishing using the hard mask for processing trench as a stopper. However, this has the problem that a process for forming, in the scribe region, a recess portion having a relatively large area is required.

Hereinafter, means for solving these problems, etc., will be described, and other problems and new features will be made clear from the description and the accompanying drawings in the present application.

Of the preferred embodiments disclosed in the present application, the outline of a typical one will be briefly described as follows.

That is, the outline of one embodiment of the present application is described as follows: in a manufacturing method of a power MOSFET, after embedded epitaxial growth is performed such that a hard mask film for processing trench is present in a hard mask remaining region of a scribe region, primary polishing is performed by using the hard mask film as a stopper, and then secondary polishing is performed such that the hard mask film is removed.

According to the one embodiment of the present application, occurrence of a crystal defect in a cell region can be reduced without making a process complicated and while securing flatness.

BRIEF DESCRIPTION OF THE DRAWINGS

Figure 2:
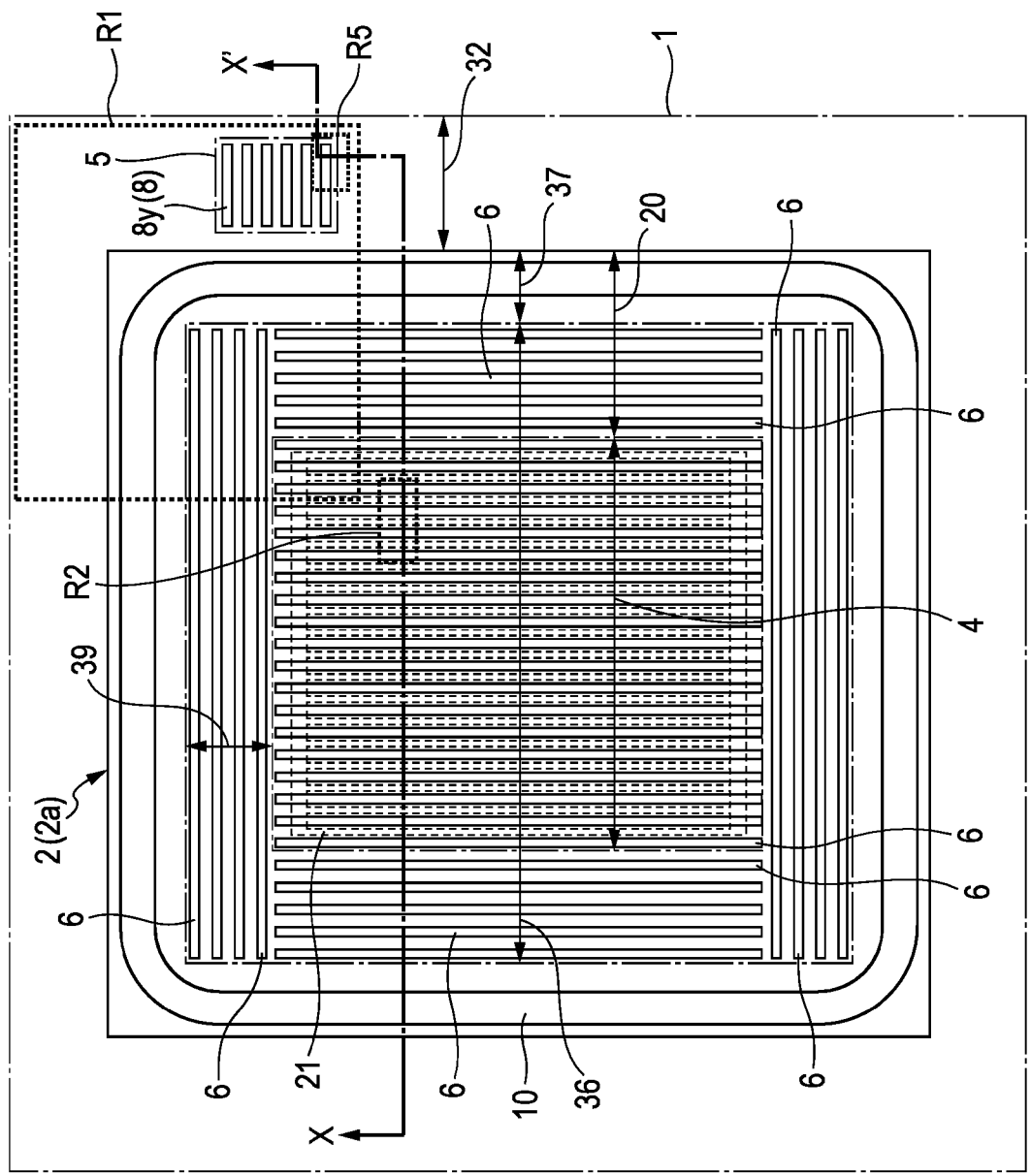
FIG. 2 is an enlarged plan view of a single chip region and a periphery thereof in FIG. 1 (where the device is almost completed, but a metal source electrode, etc., is omitted in order for a super junction structure, etc., to be seen easily)

FIG. 20 is a sectional view of the device approximately corresponding to the X-X' section of the cut-out region R2 of the active cell in FIG. 2, the device being during a manufacturing process (step of processing gate and introducing N+-type source region), by which a wafer process, etc., in the manufacturing method of a power MOSFET according to the one embodiment of the application is described;

Figure 4:
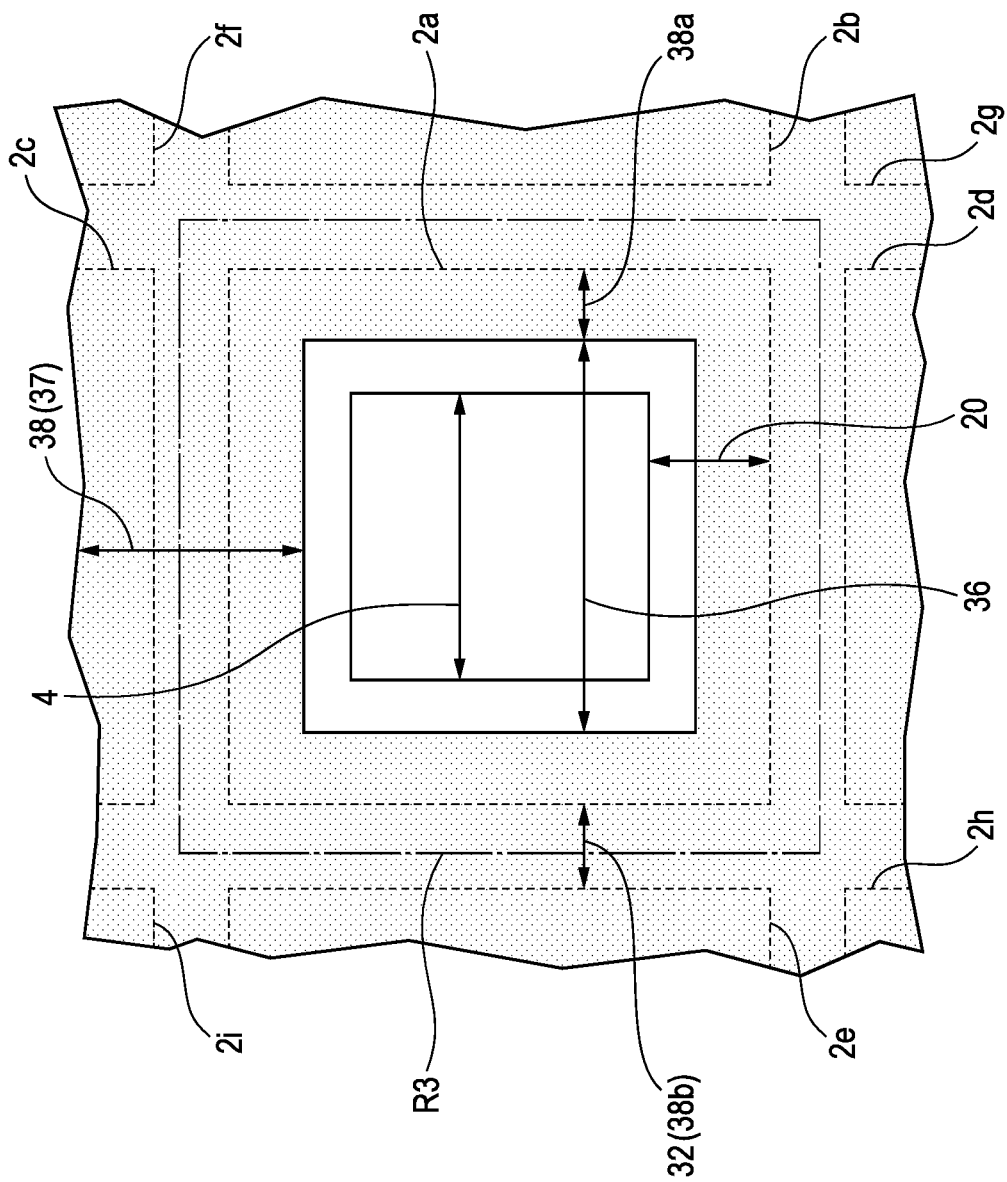
FIG. 4 is a top view of the wafer (however, the structure of an alignment mark region, etc., is omitted), in which the relationship between a hard mask remaining region and a cell region, etc., in a process of forming a trench in an area approximately corresponding to FIG. 2, is illustrated.
Figure 8:
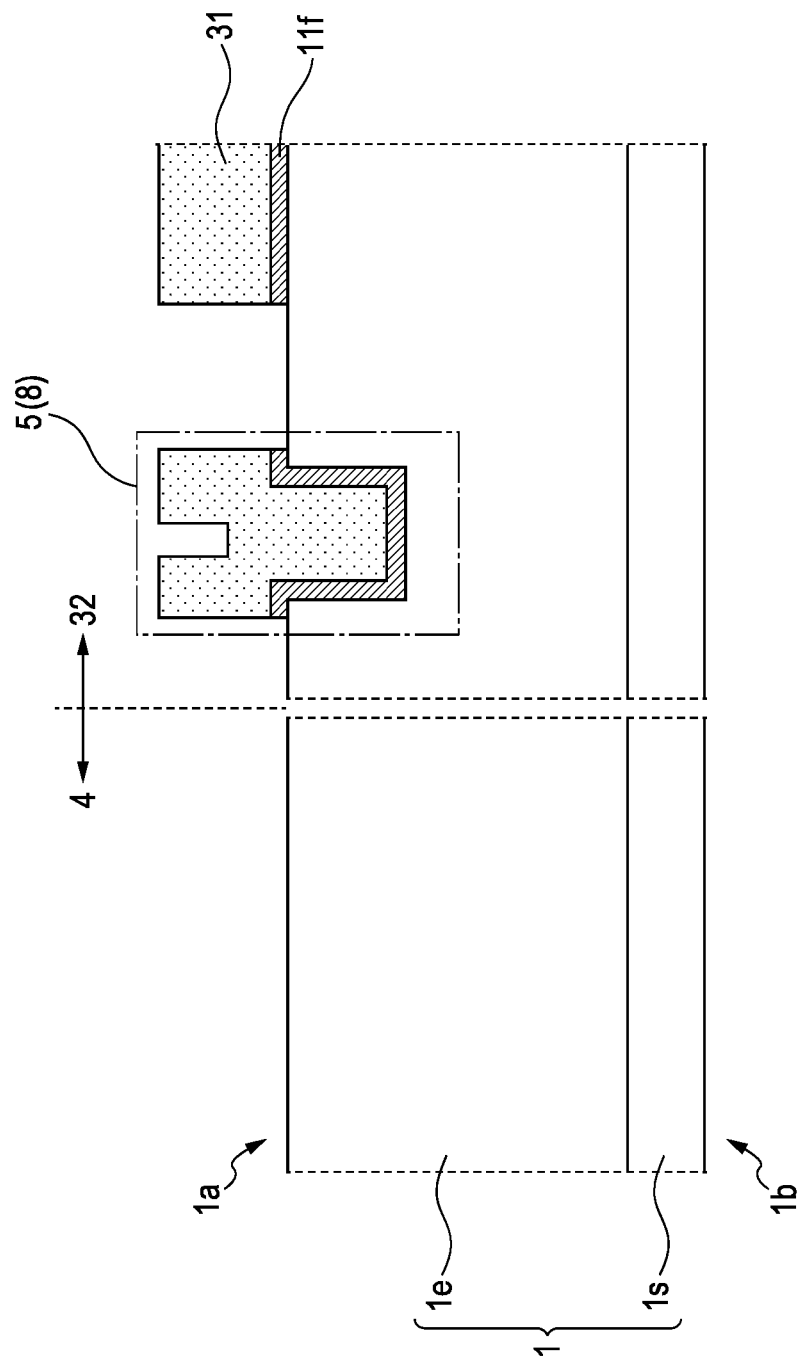
FIG. 8 is a sectional view (corresponding to the X-X' section in FIG. 2) of each of the cell region (or the super junction formation region) and the scribe region (including the alignment mark region) in the wafer during a manufacturing process (step of processing underlying hard mask for trench etch), by which a wafer process, etc., in the manufacturing method of a power MOSFET according to one embodiment of the application is described.
Figure 10:
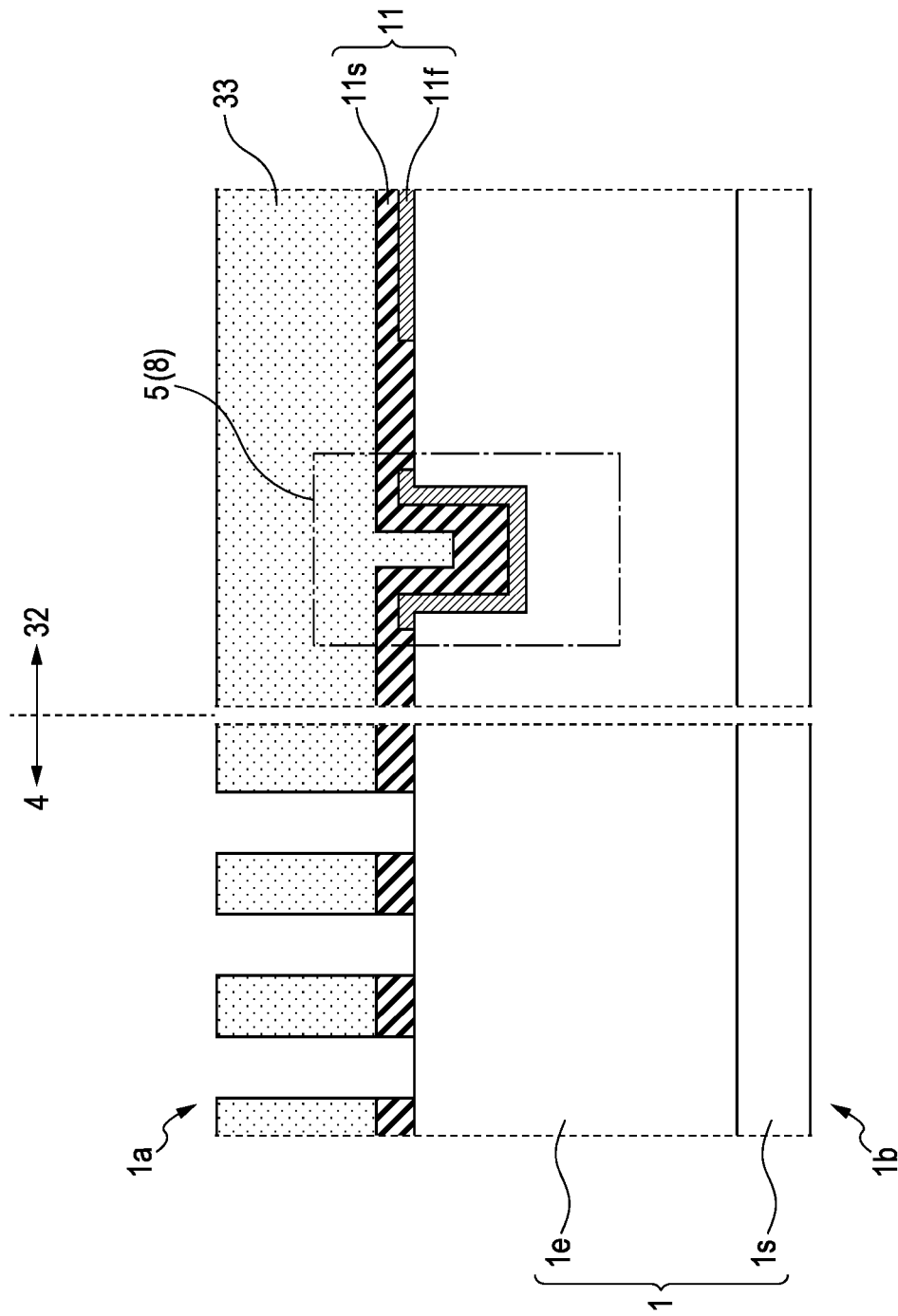
FIG. 10 is a sectional view (corresponding to the X-X' section in FIG. 2) of each of the cell region (or the super junction formation region) and the scribe region (including the alignment mark region) in the wafer during a manufacturing process (step of processing overlying hard mask for trench etch), by which a wafer process, etc., in the manufacturing method of a power MOSFET according to the one embodiment of the application is described.
Figure 12:
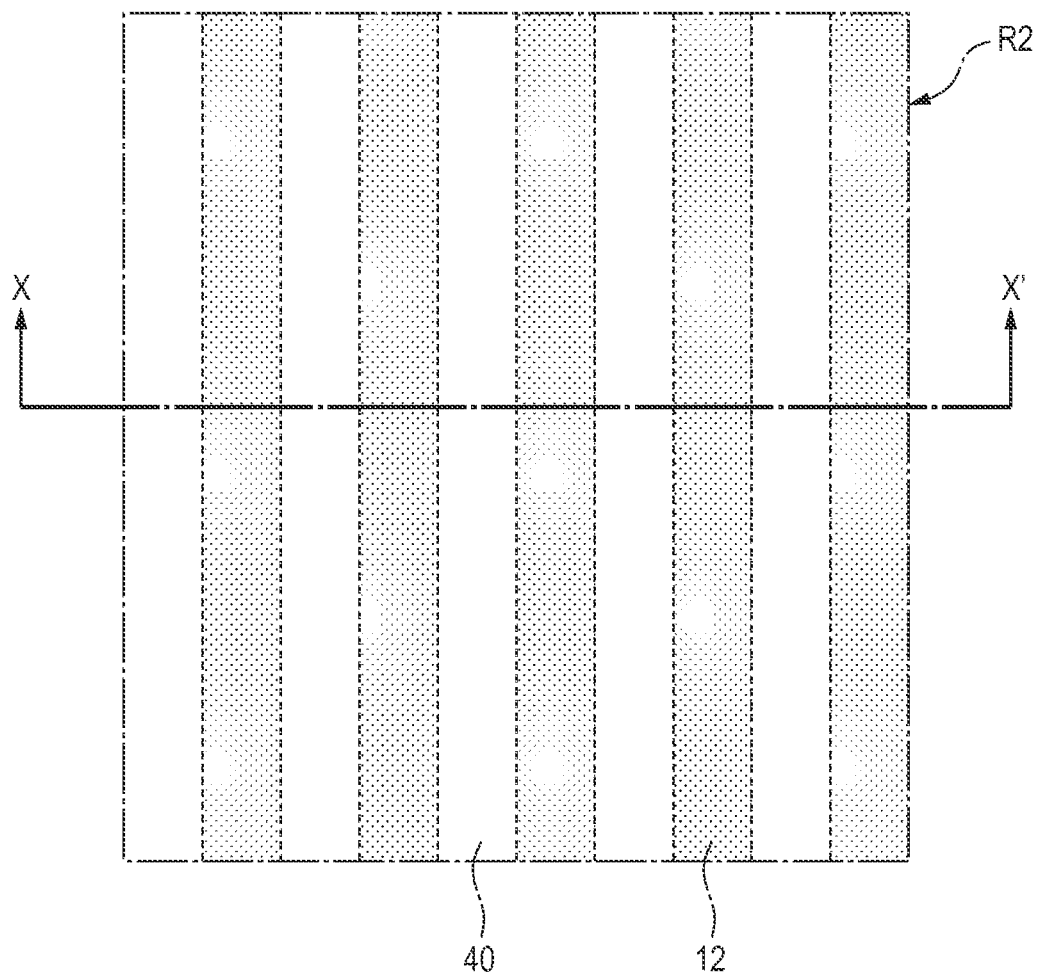
FIG. 12 is a plan view of a cell region in the step in FIG. 13 (corresponding to the cut-out region R2 of the active cell in FIG. 2)
Figure 13:
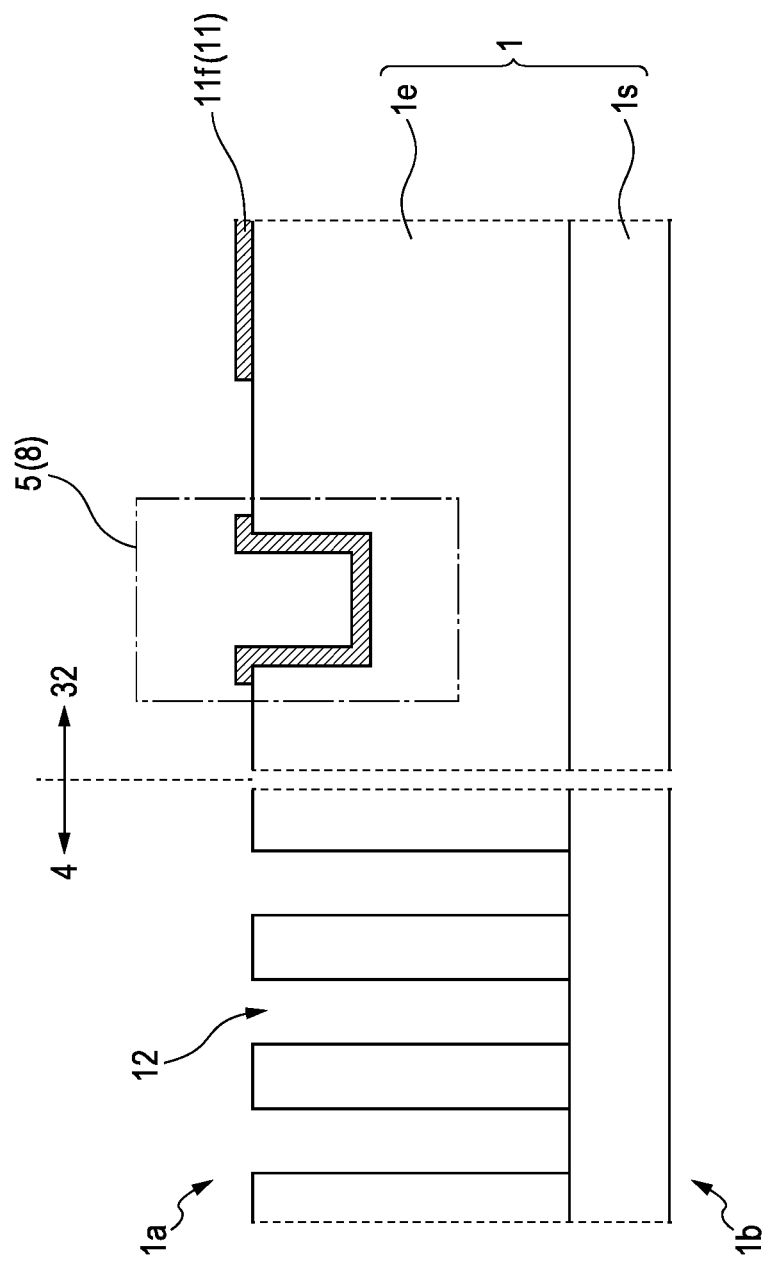
FIG. 13 is a sectional view (corresponding to the X-X' section in FIG. 2) of each of the cell region (or the super junction formation region) and the scribe region (including the alignment mark region) in the wafer during a manufacturing process (step of removing overlying hard mask for trench etch), by which a wafer process, etc., in the manufacturing method of a power MOSFET according to the one embodiment of the application is described.
Figure 14:
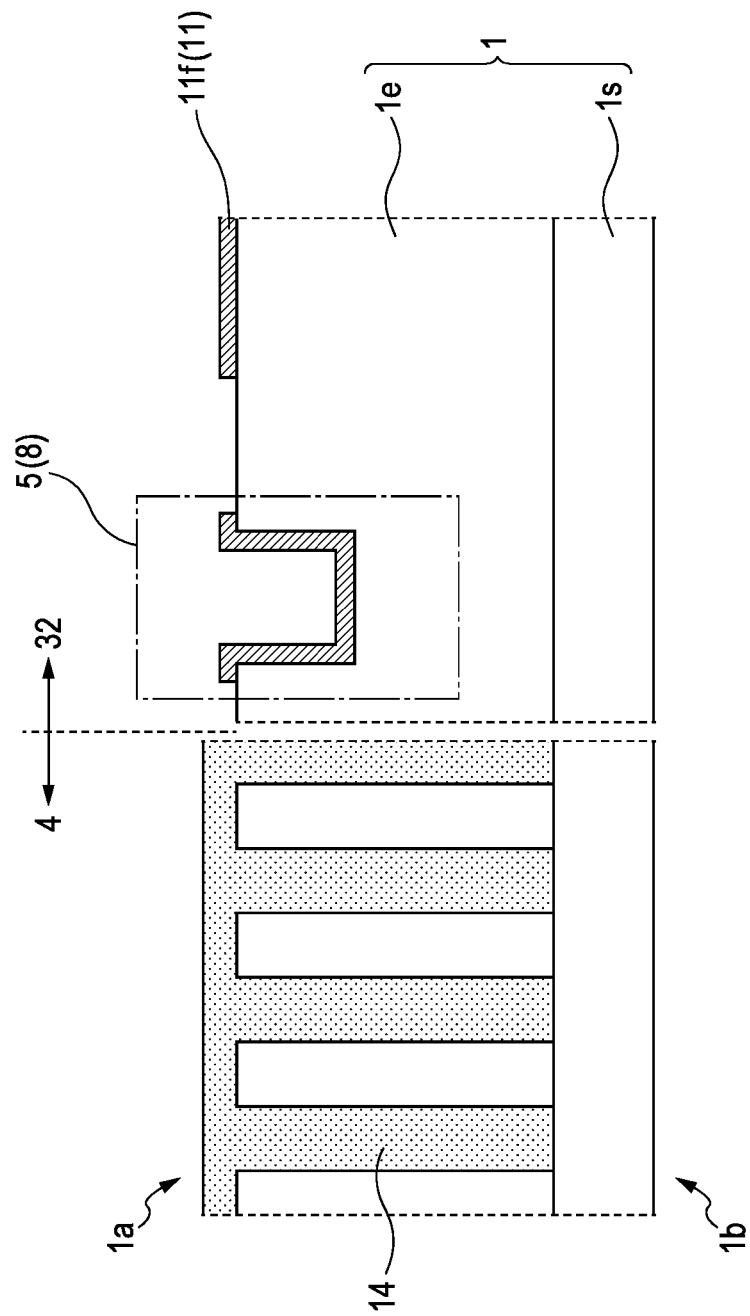
FIG. 14 is a sectional view (corresponding to the X-X' section in FIG. 2) of each of the cell region (or the super junction formation region) and the scribe region (including the alignment mark region) in the wafer during a manufacturing process (step of embedded epitaxial growth), by which a wafer process, etc., in the manufacturing method of a power MOSFET according to the one embodiment of the application is described.
Figure 15:
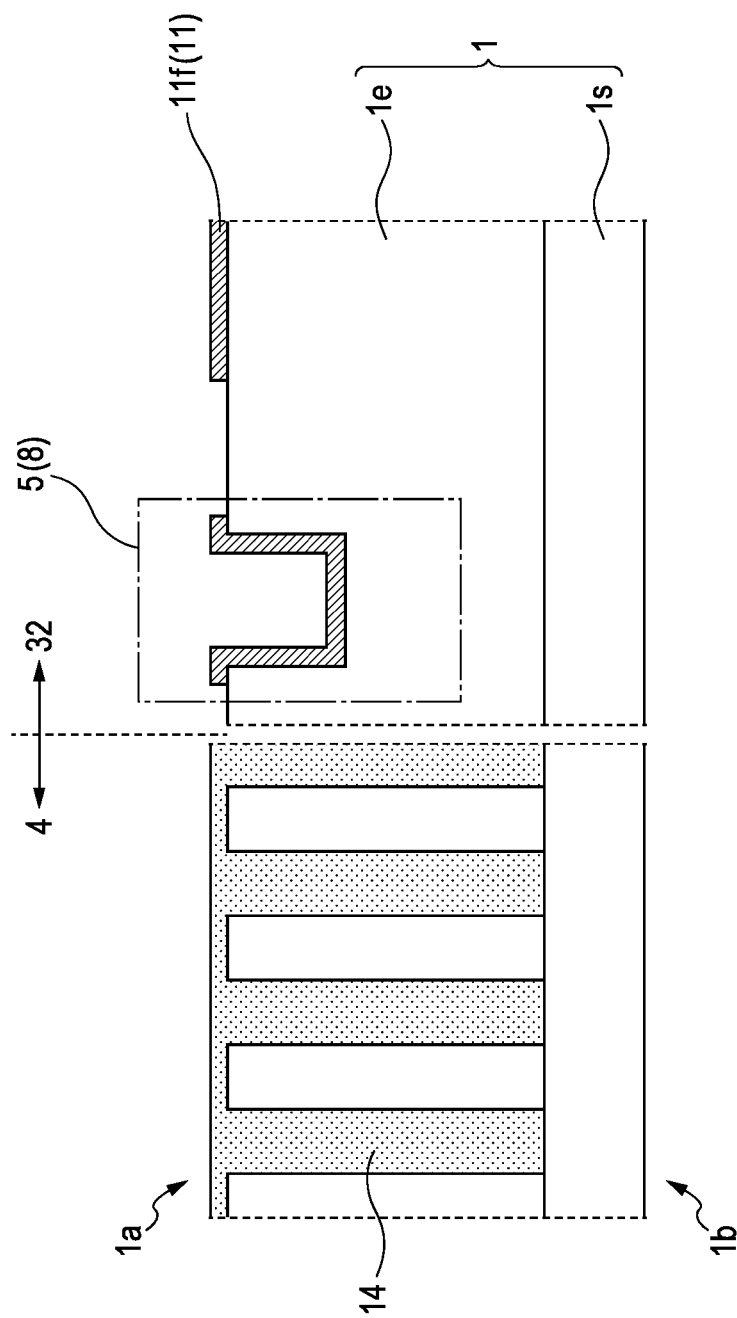
FIG. 15 is a sectional view (corresponding to the X-X' section in FIG. 2) of each of the cell region (or the super junction formation region) and the scribe region (including the alignment mark region) in the wafer during a manufacturing process (step of first CMP), by which a wafer process, etc., in the manufacturing method of a power MOSFET according to the one embodiment of the application is described.
Figure 16:
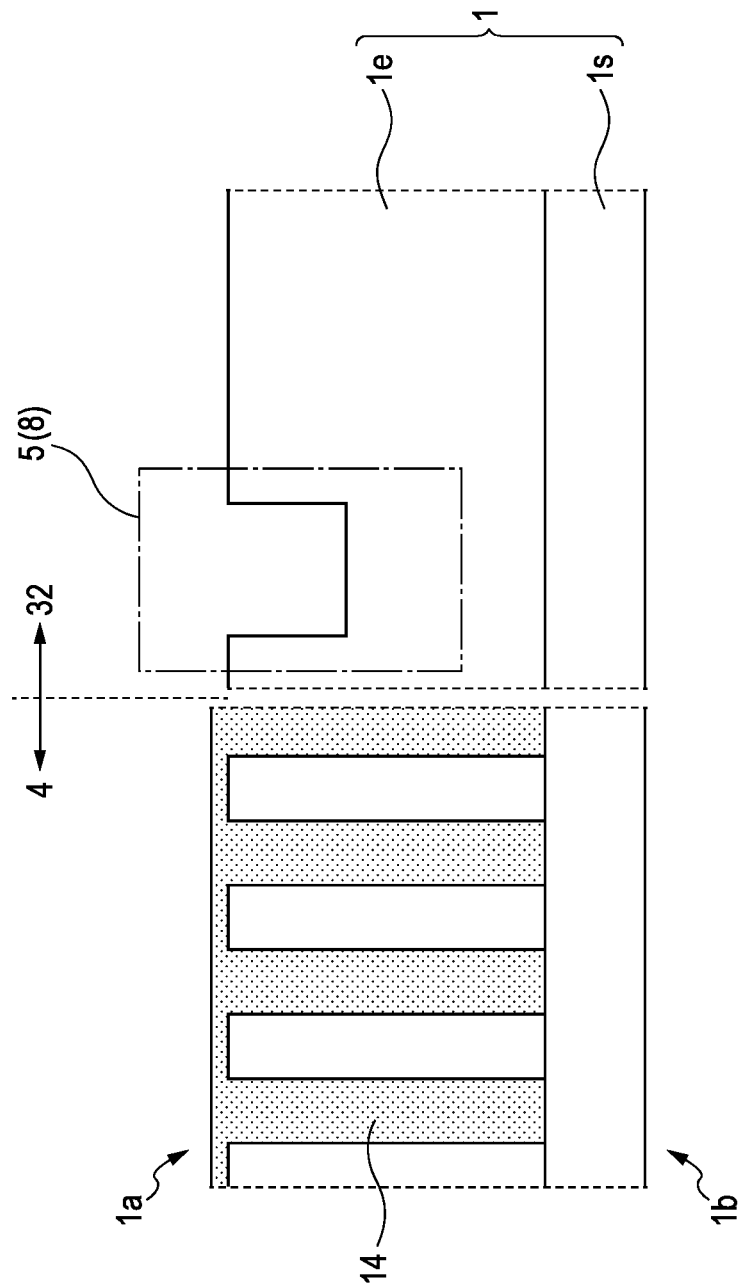
FIG. 16 is a sectional view (corresponding to the X-X' section in FIG. 2) of each of the cell region (or the super junction formation region) and the scribe region (including the alignment mark region) in the wafer during a manufacturing process (step of removing underlying hard mask for trench etch), by which a wafer process, etc., in the manufacturing method of a power MOSFET according to the one embodiment of the application is described.
Figure 17:
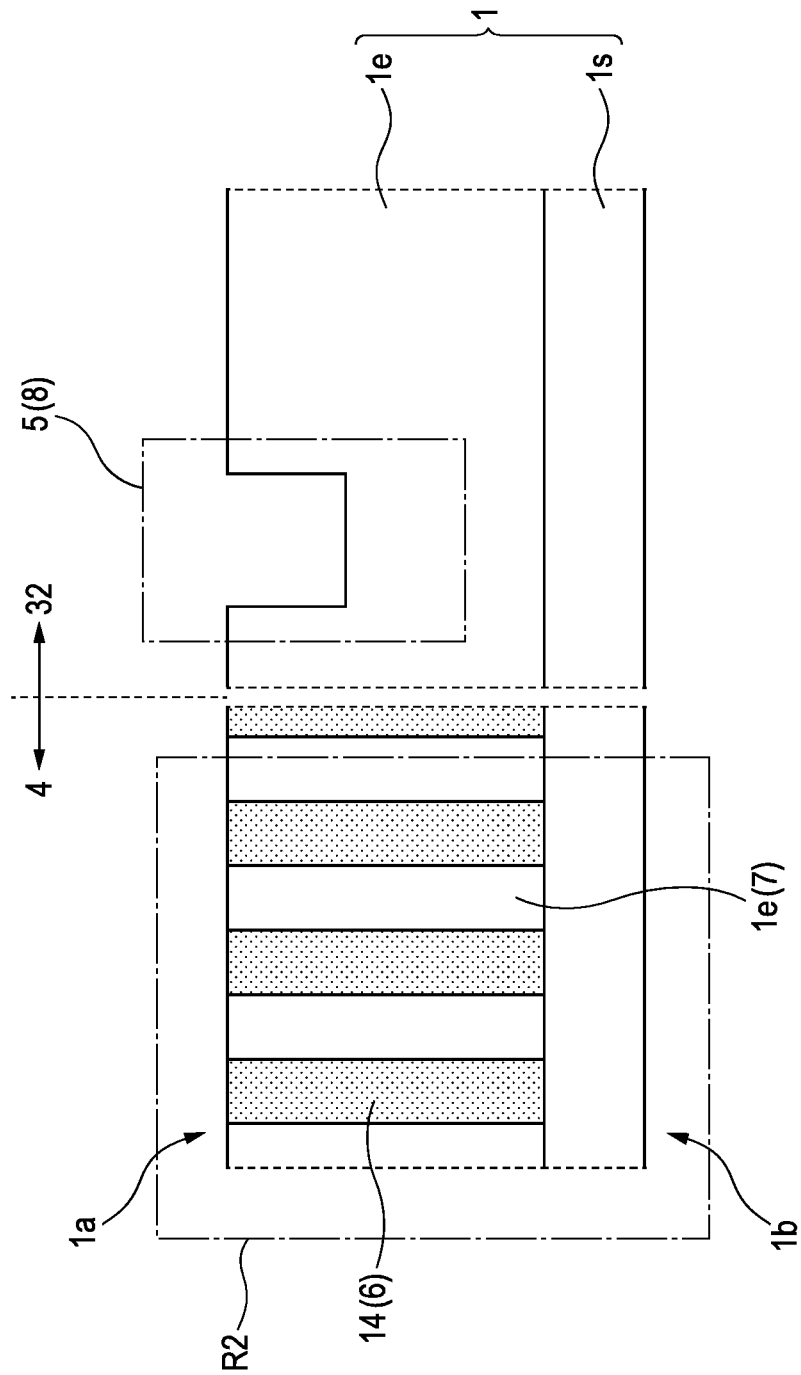
FIG. 17 is a sectional view (corresponding to the X-X' section in FIG. 2) of each of the cell region (or the super junction formation region) and the scribe region (including the alignment mark region) in the wafer during a manufacturing process (step of second CMP), by which a wafer process, etc., in the manufacturing method of a power MOSFET according to the one embodiment of the application is described.
Figure 21:
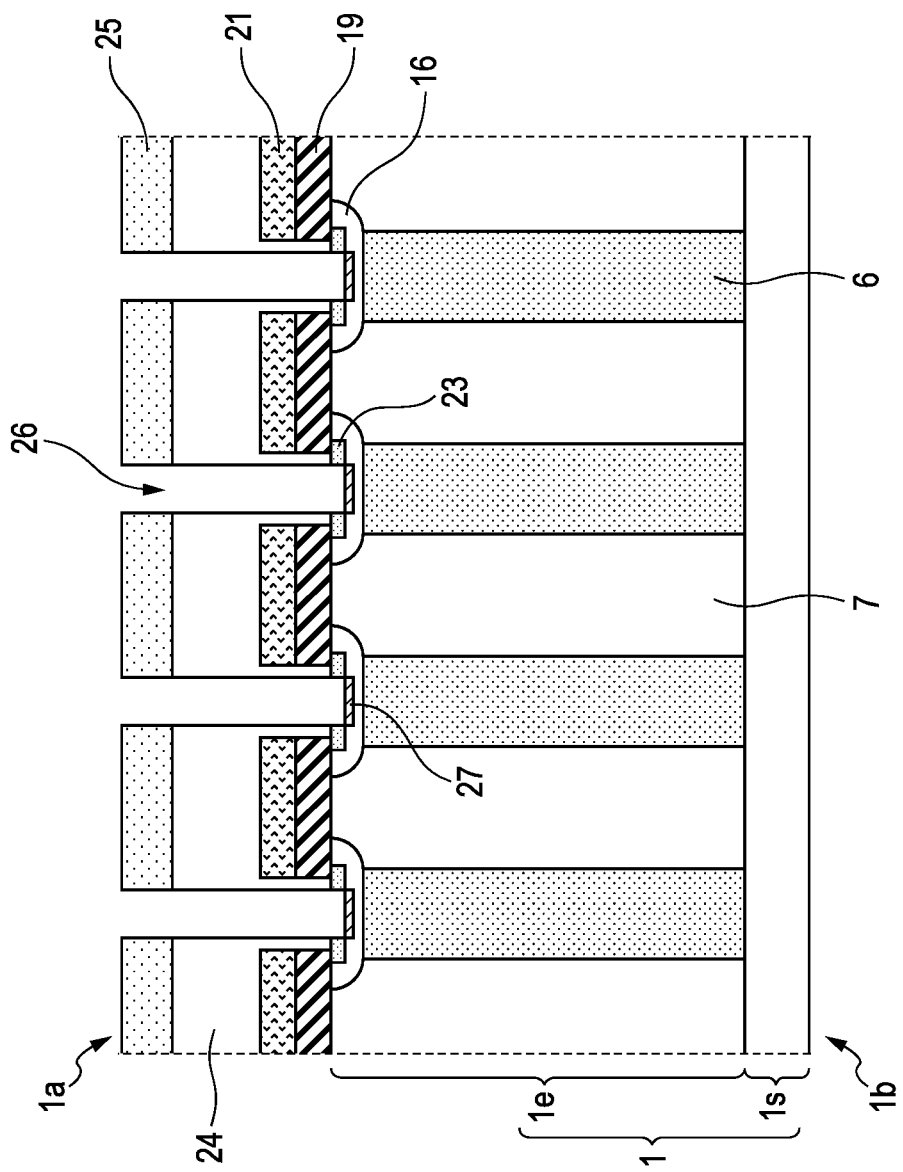
Figure 22:
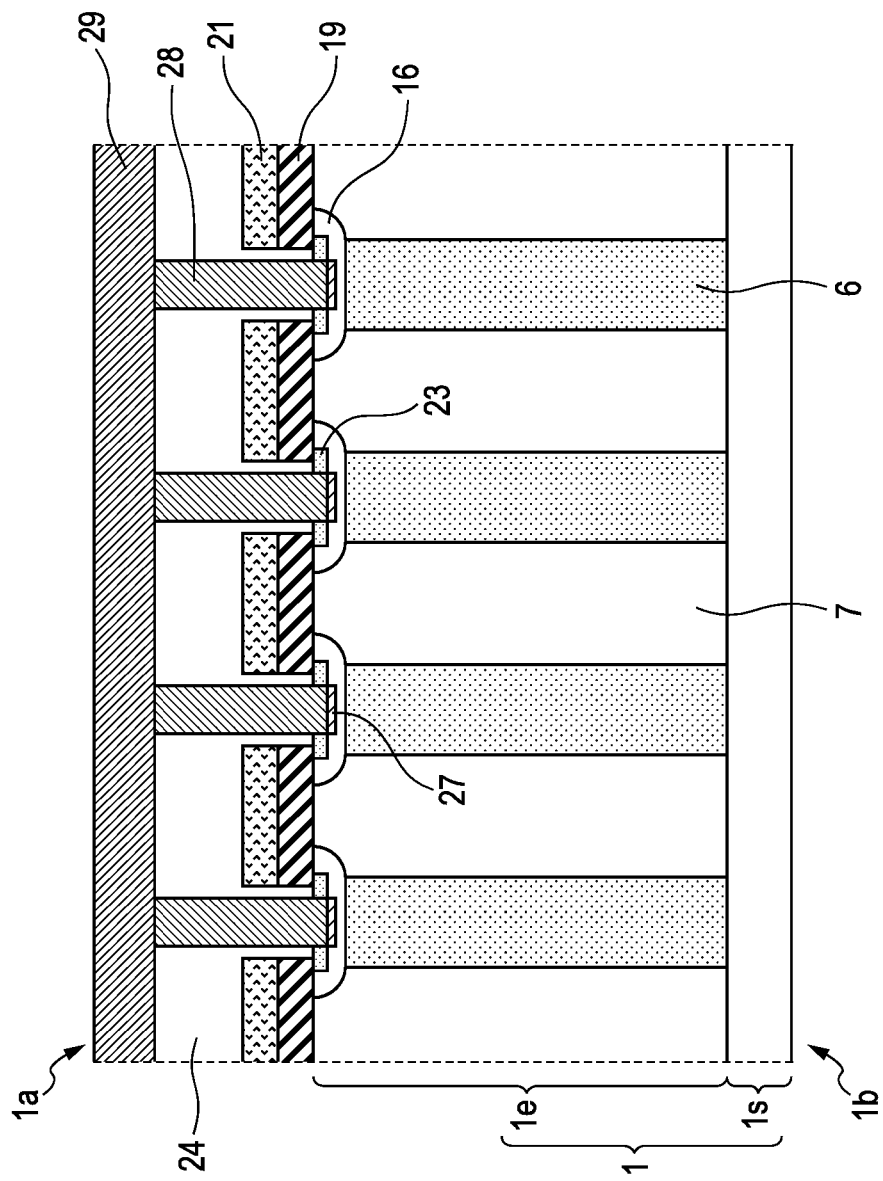
Figure 23:
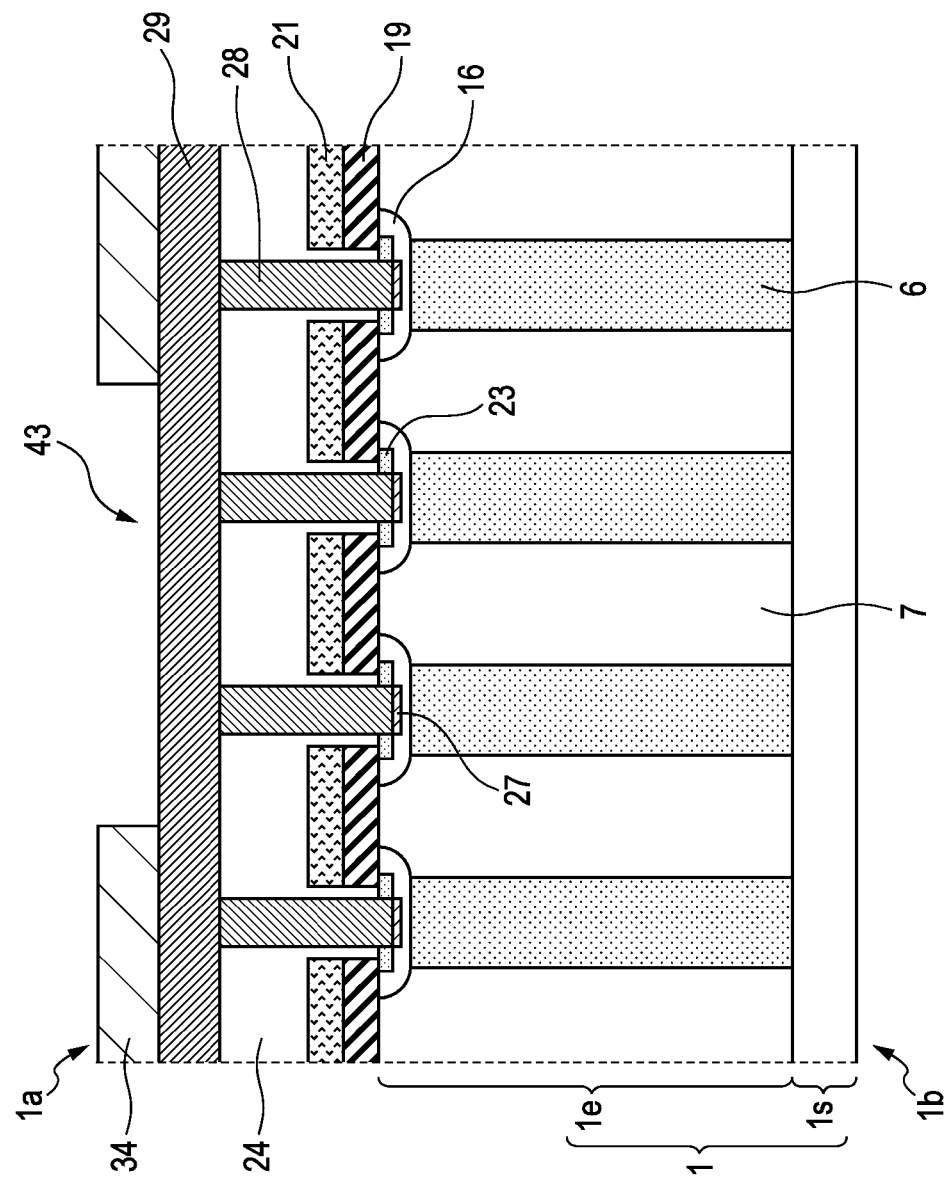
Figure 24:
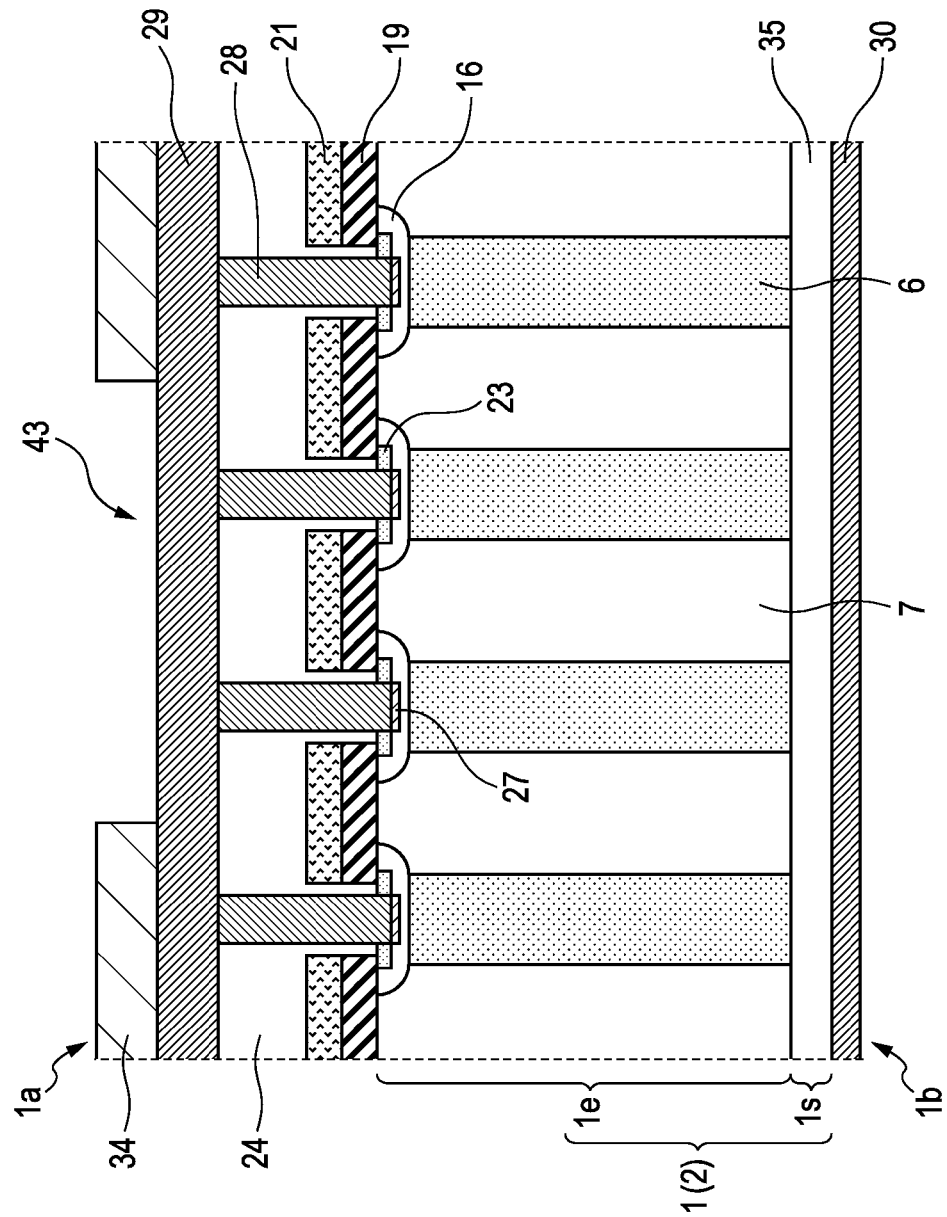
Figure 25:
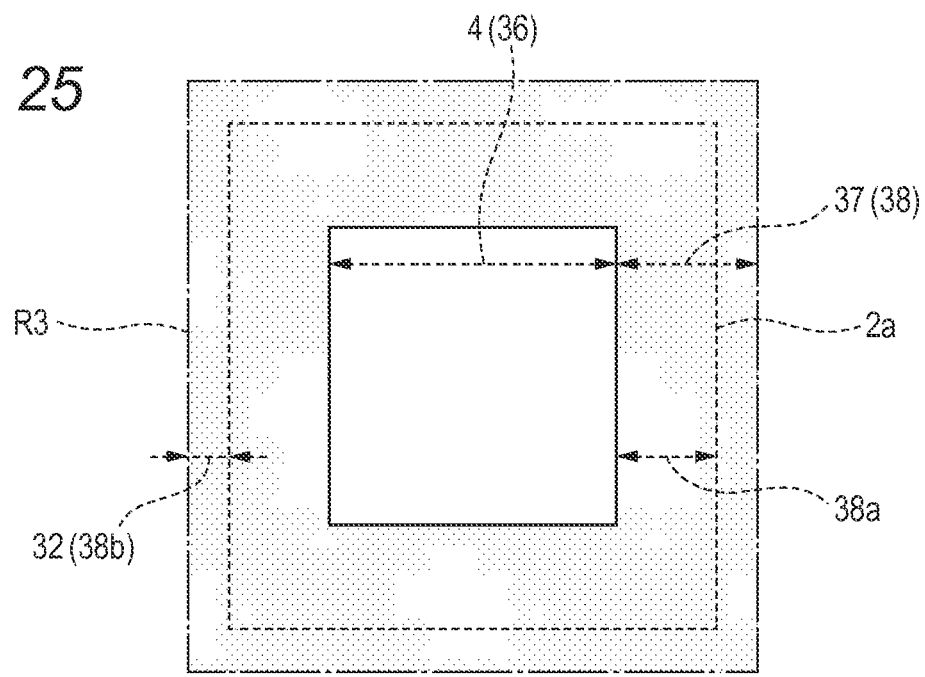
Figure 26:
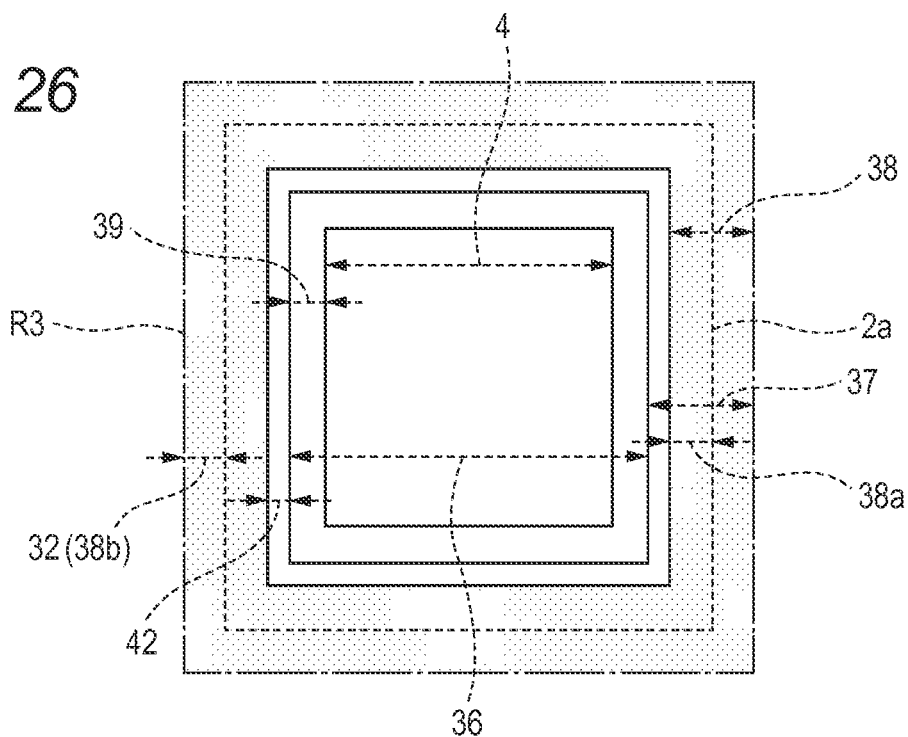
Figure 27:
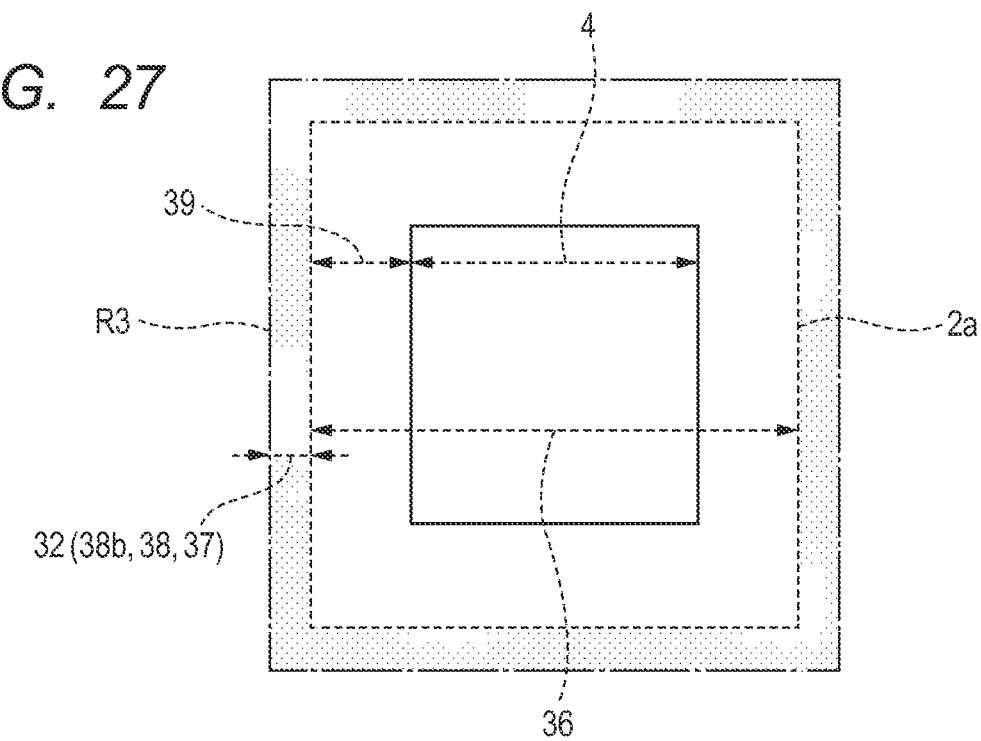
Figure 28:
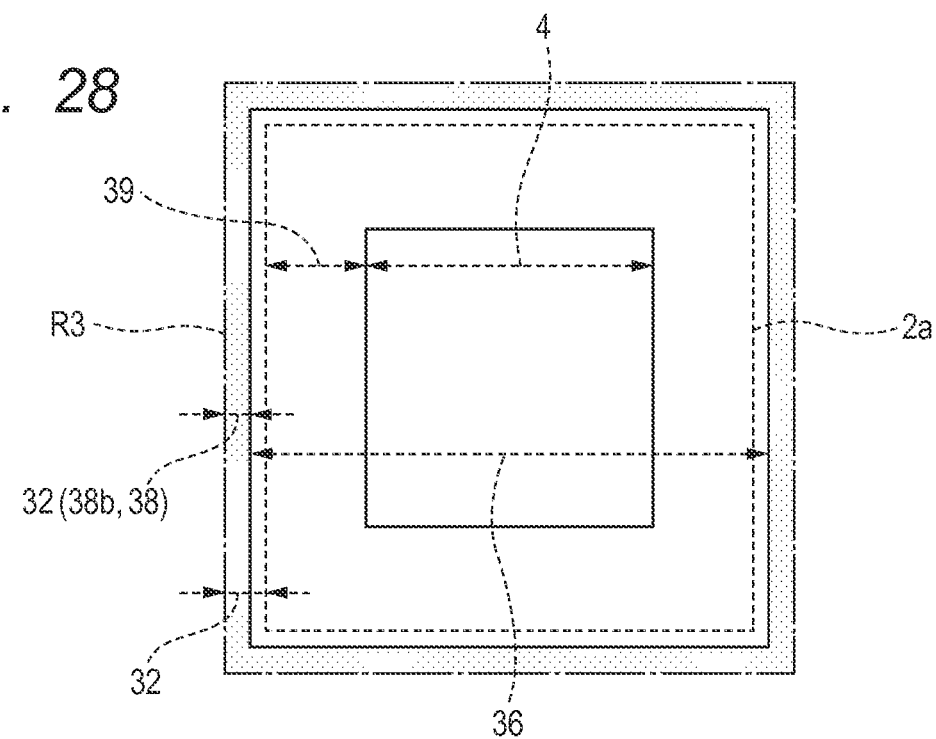
Figure 29:
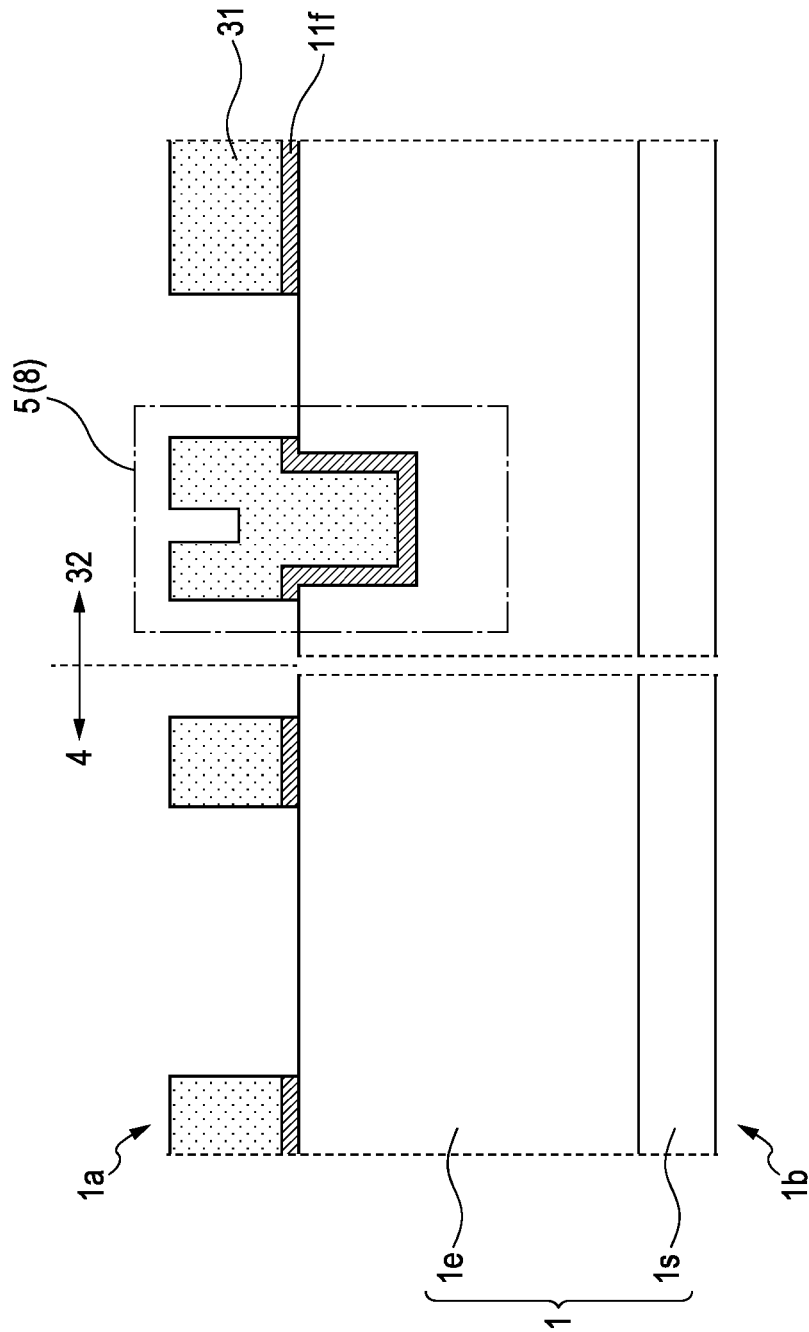
Figure 30:
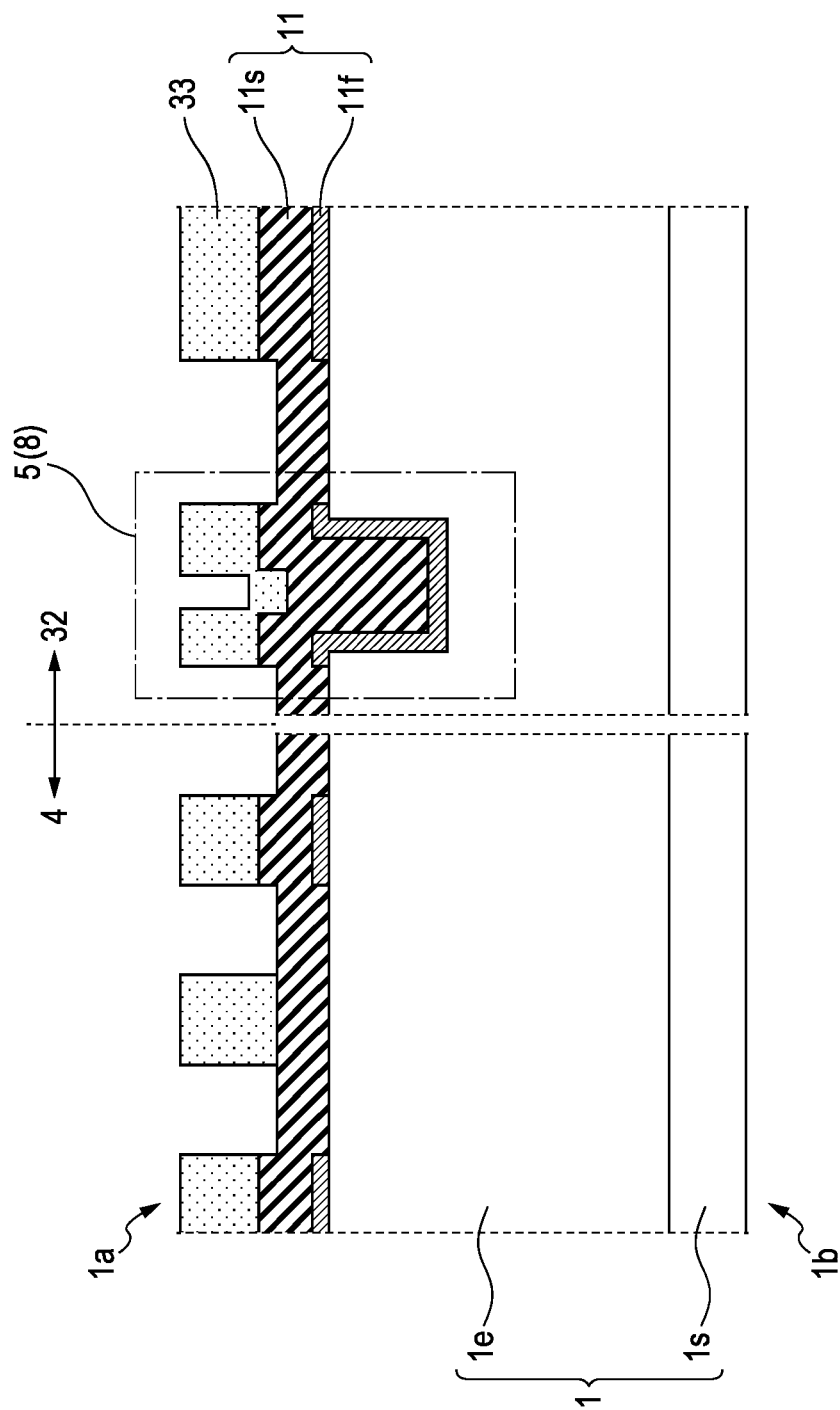
Figure 31:
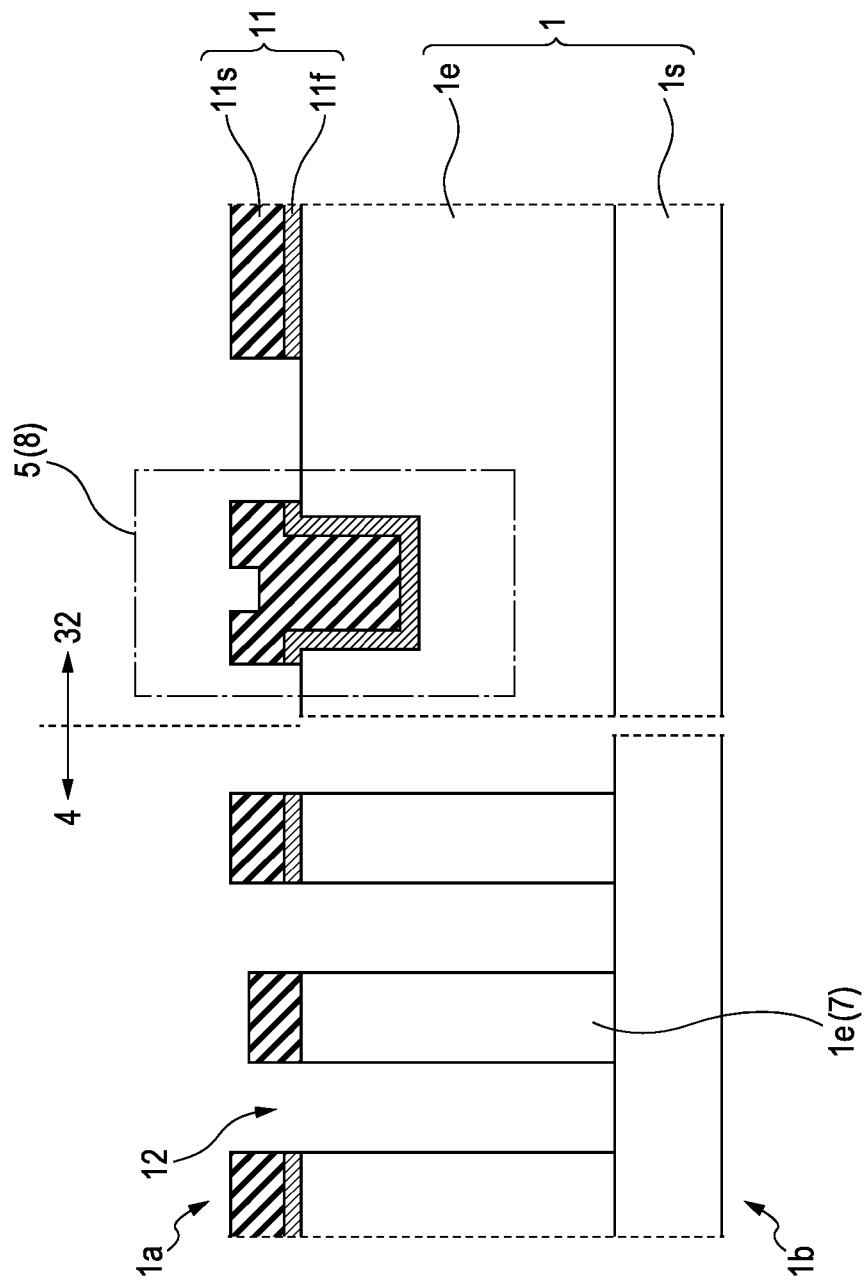
Figure 32:
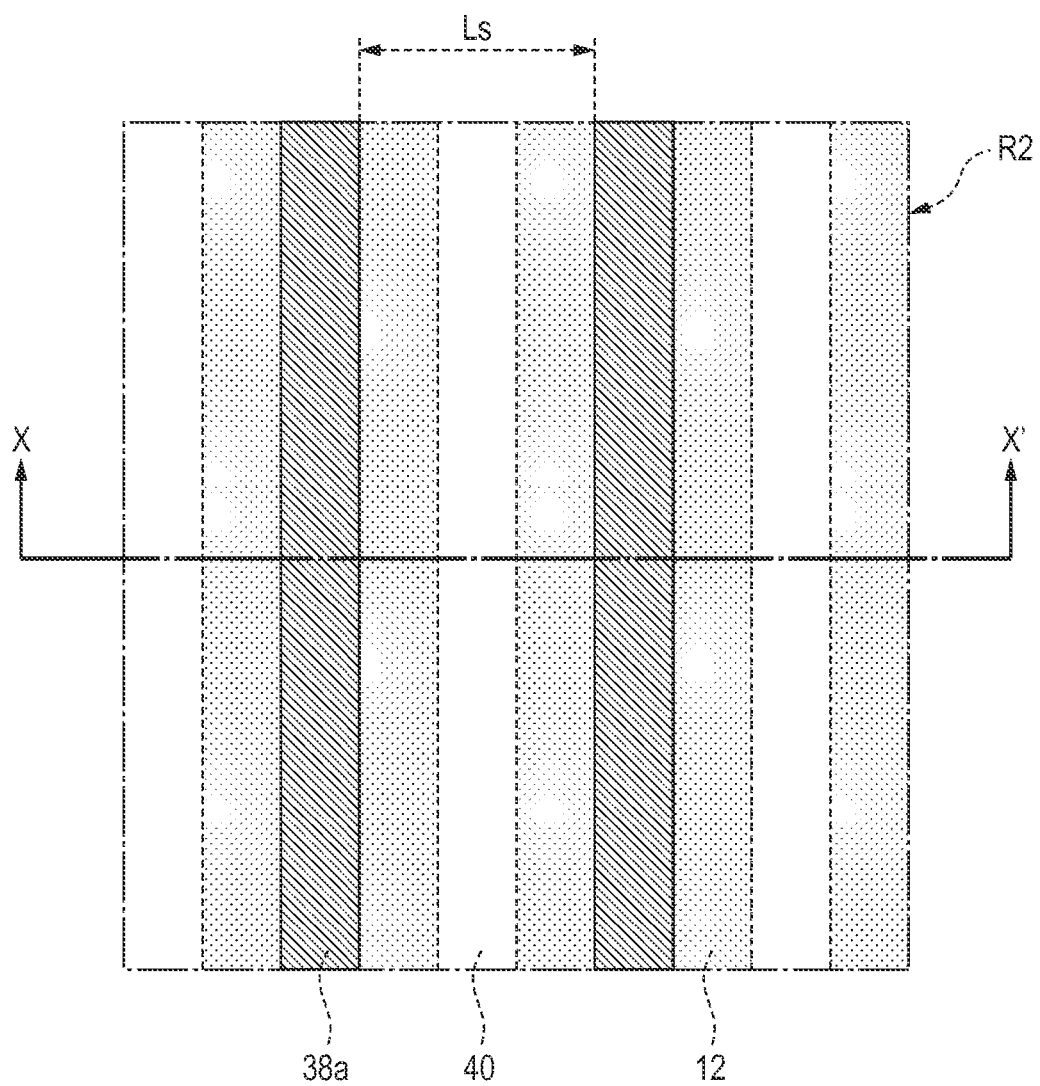
Figure 33:
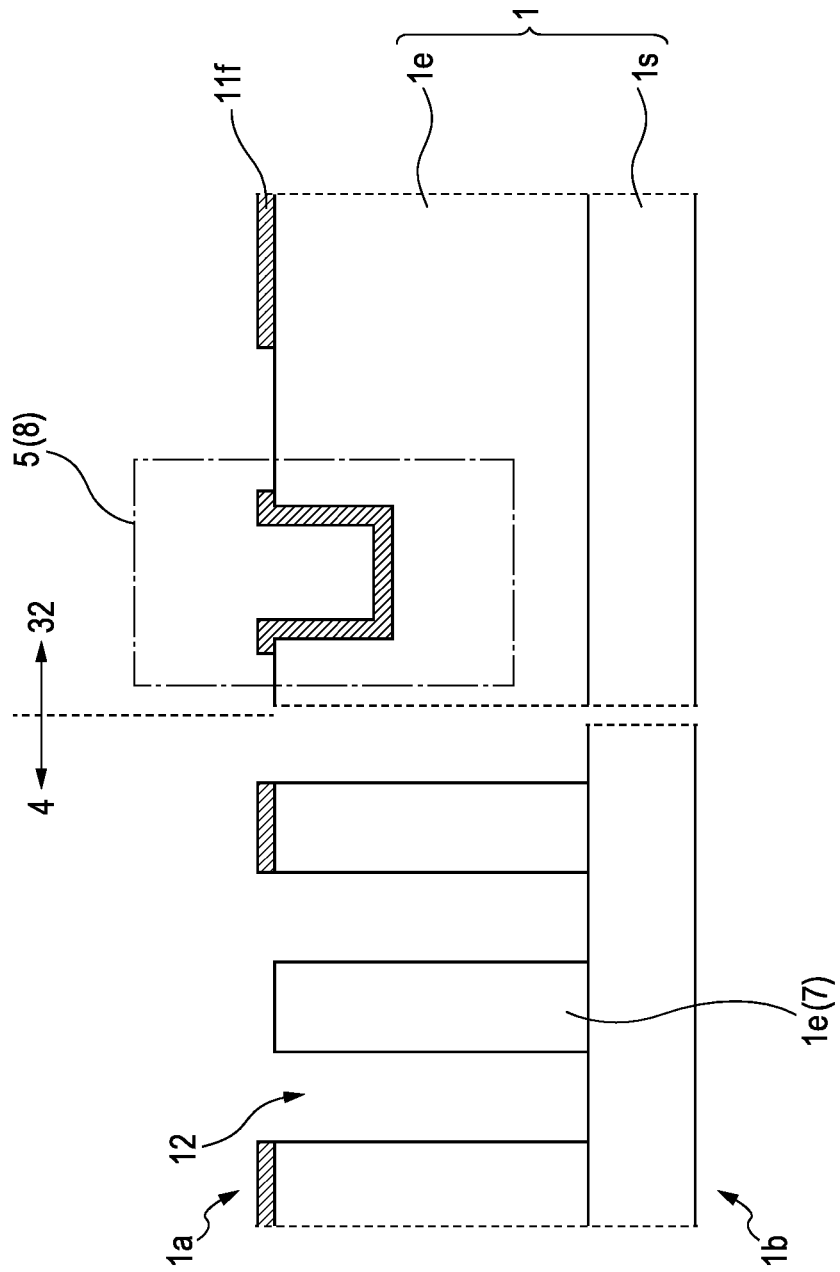
Figure 34:
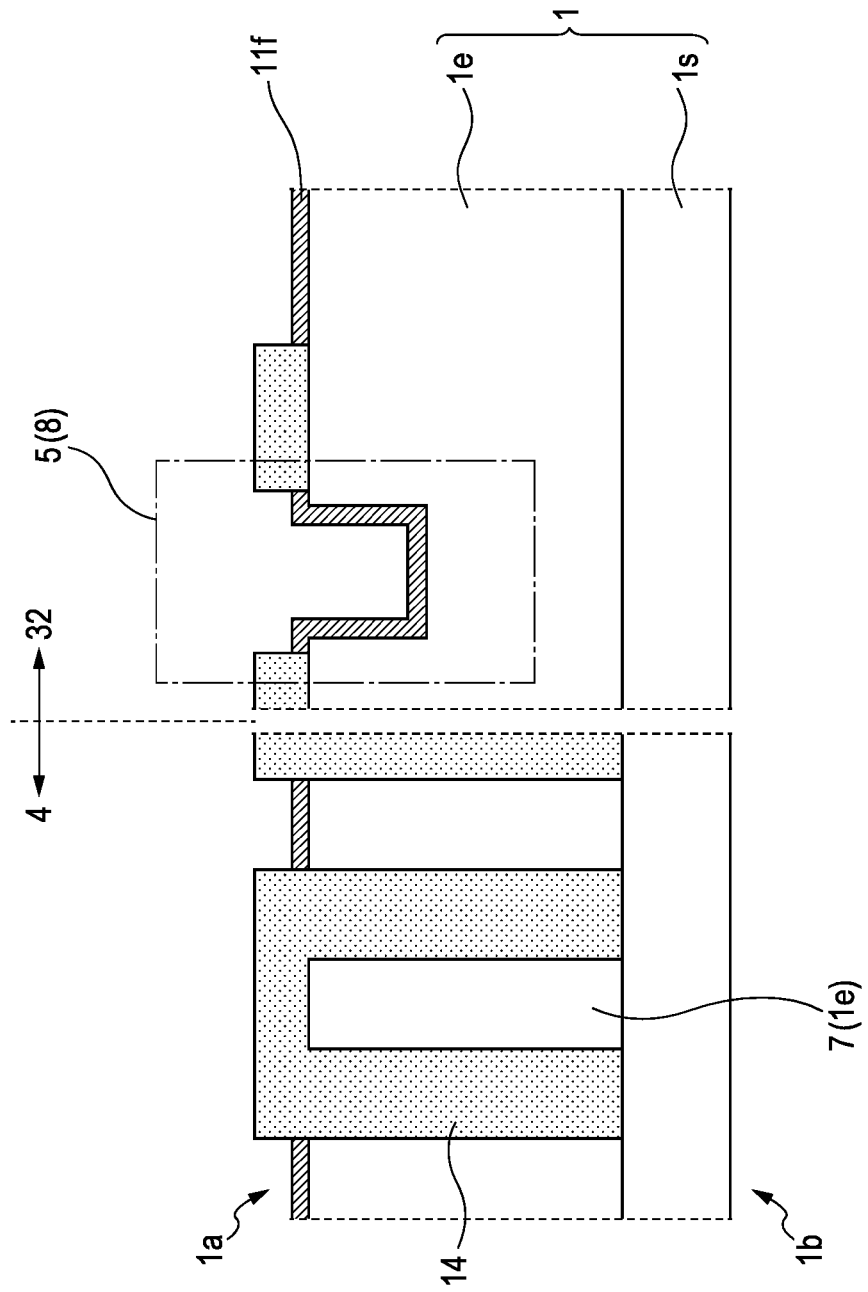
Figure 35:
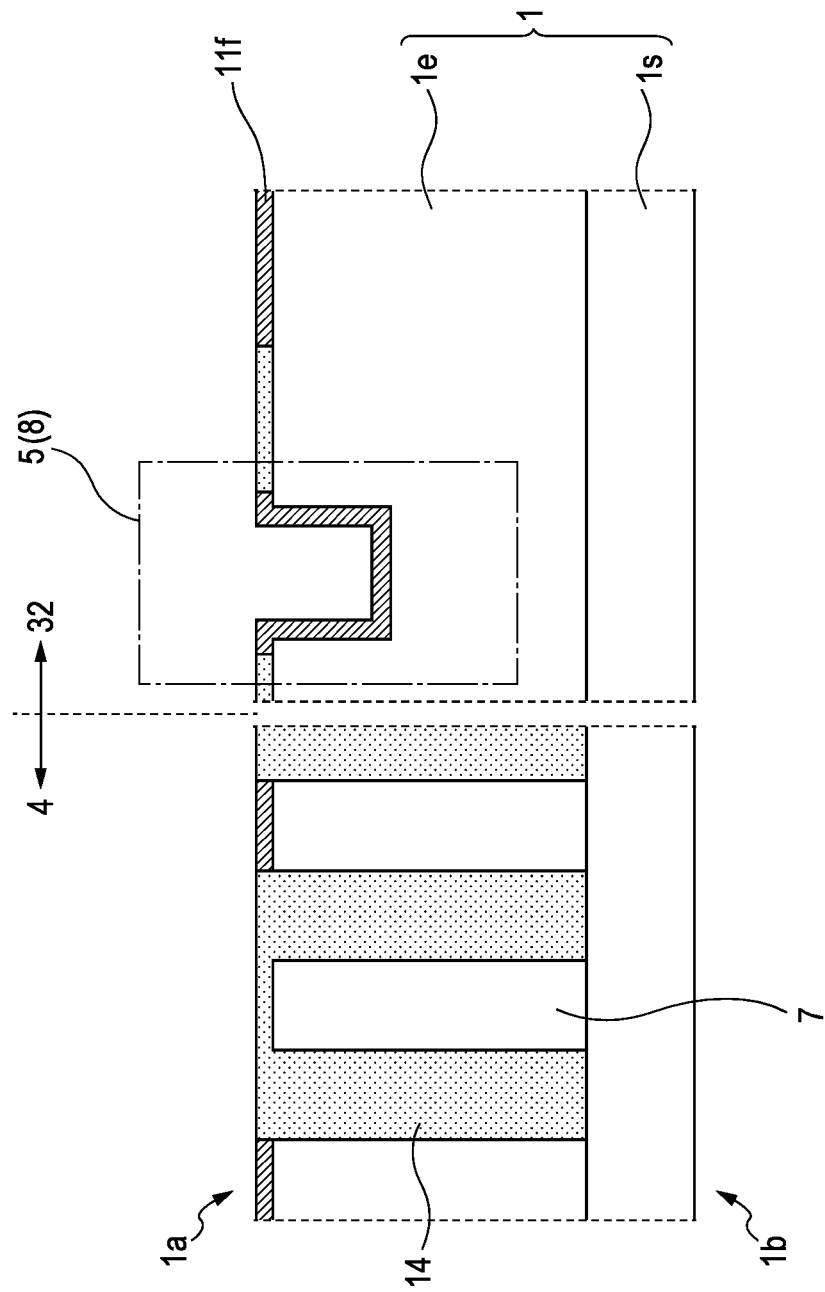
Figure 36:
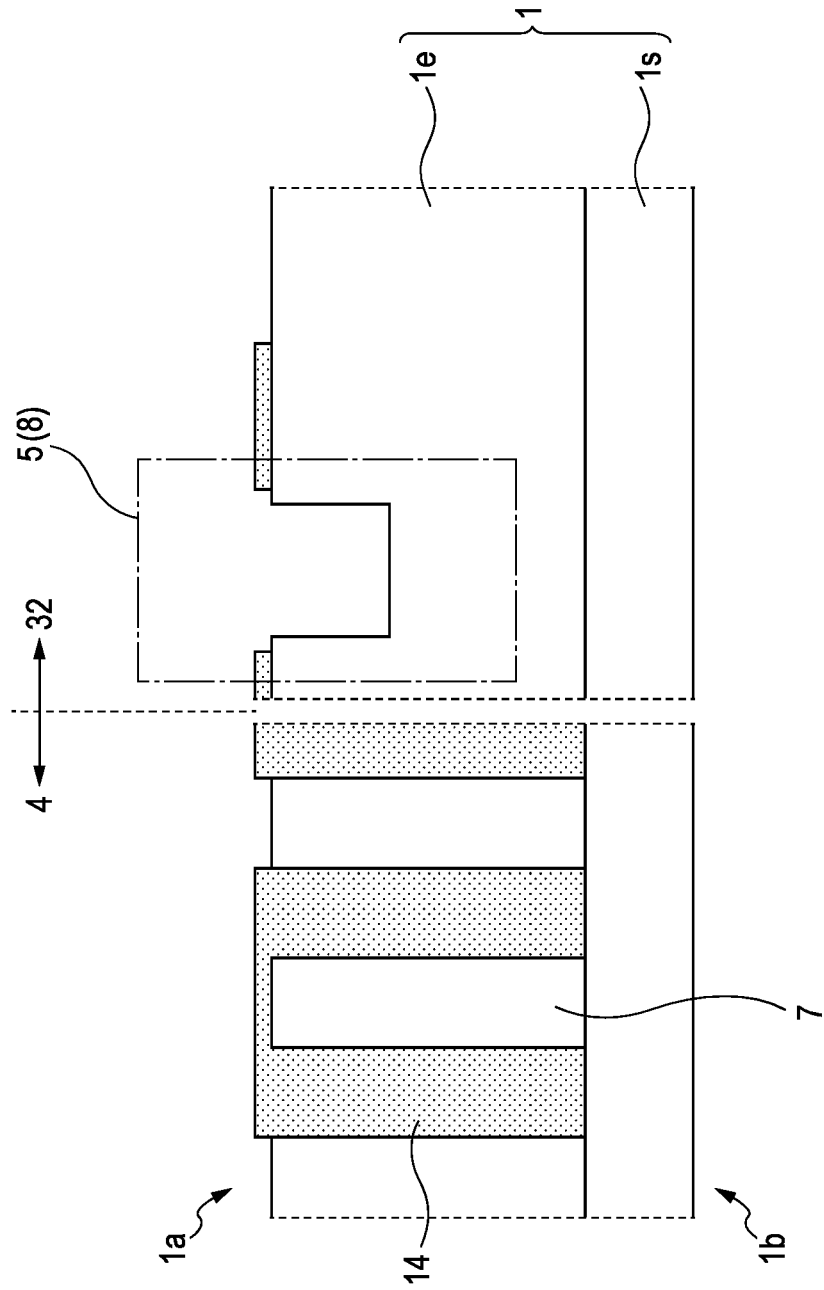
Figure 37:
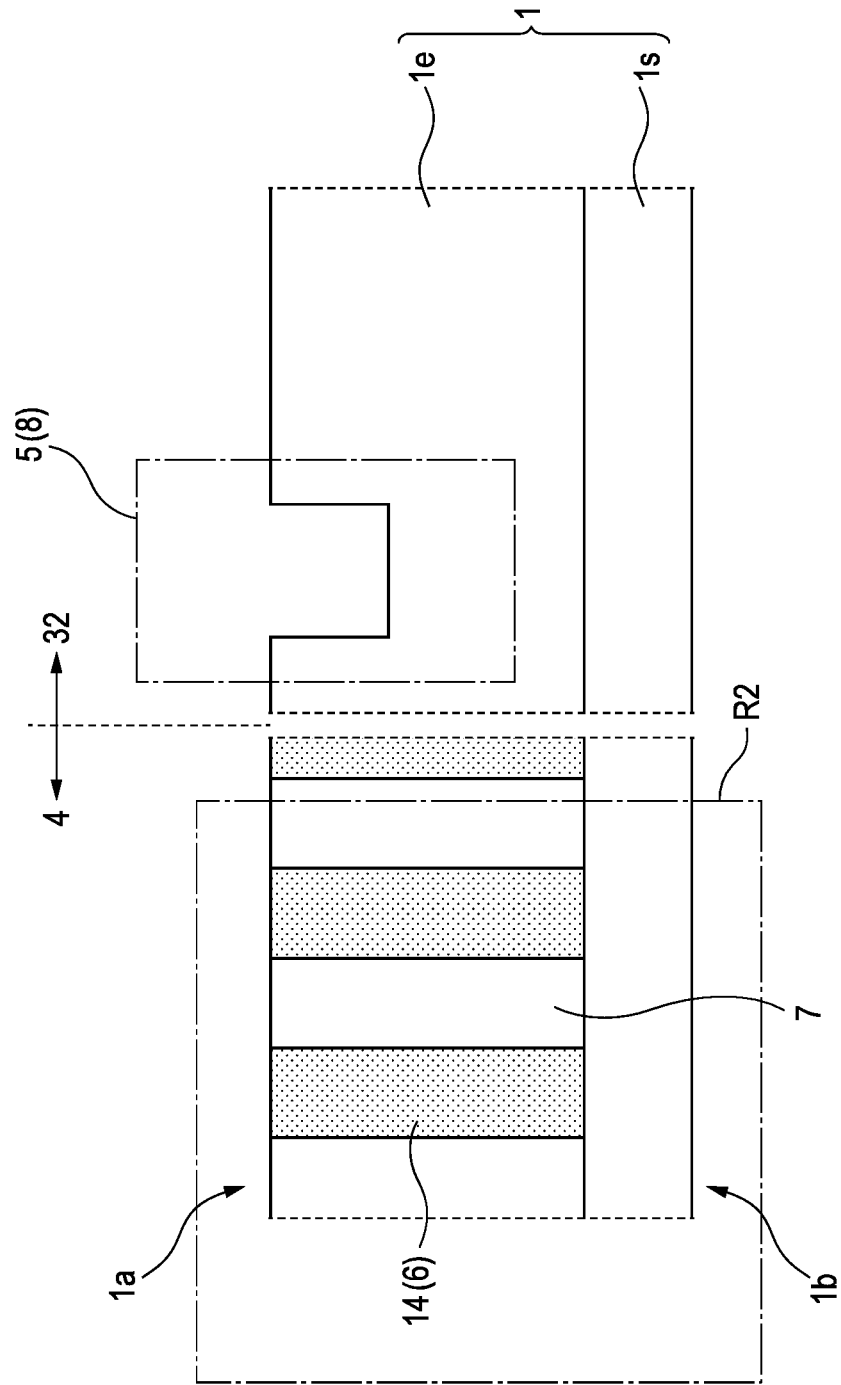
Figure 38:
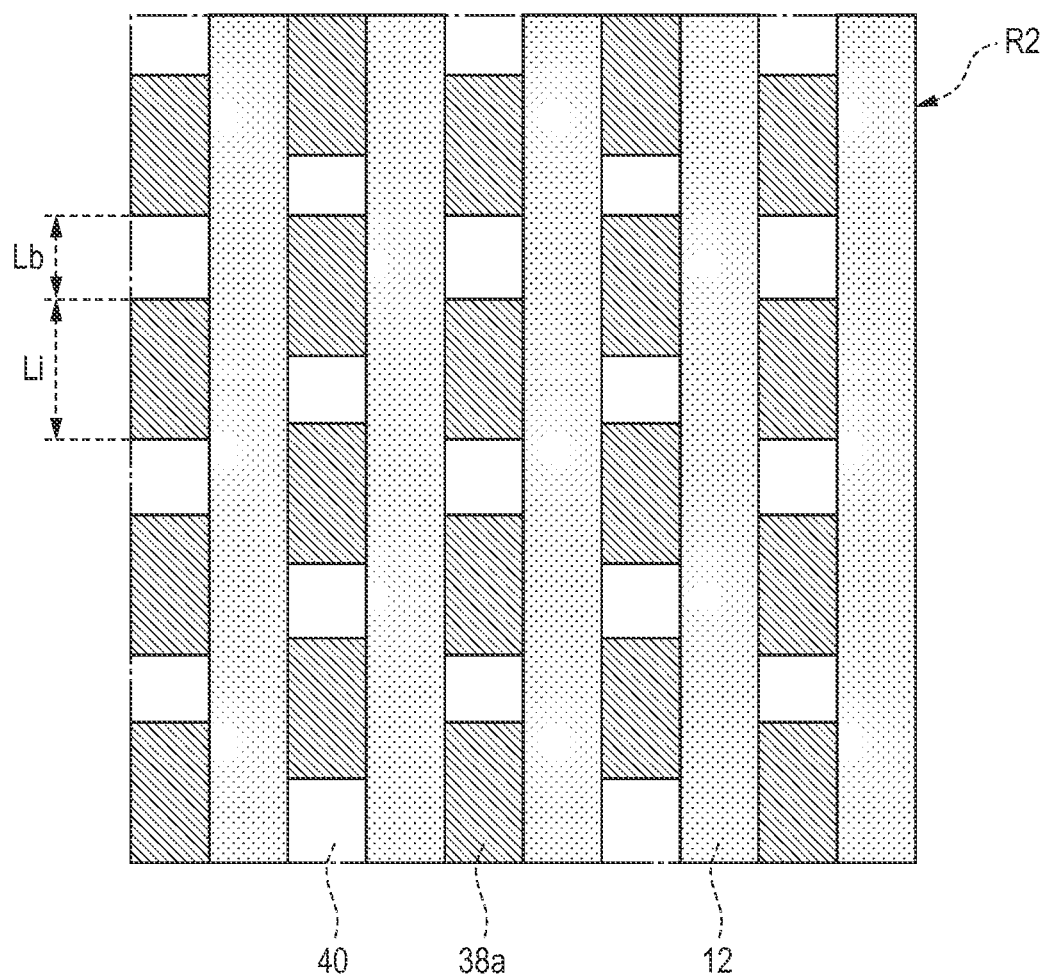
Figure 39:
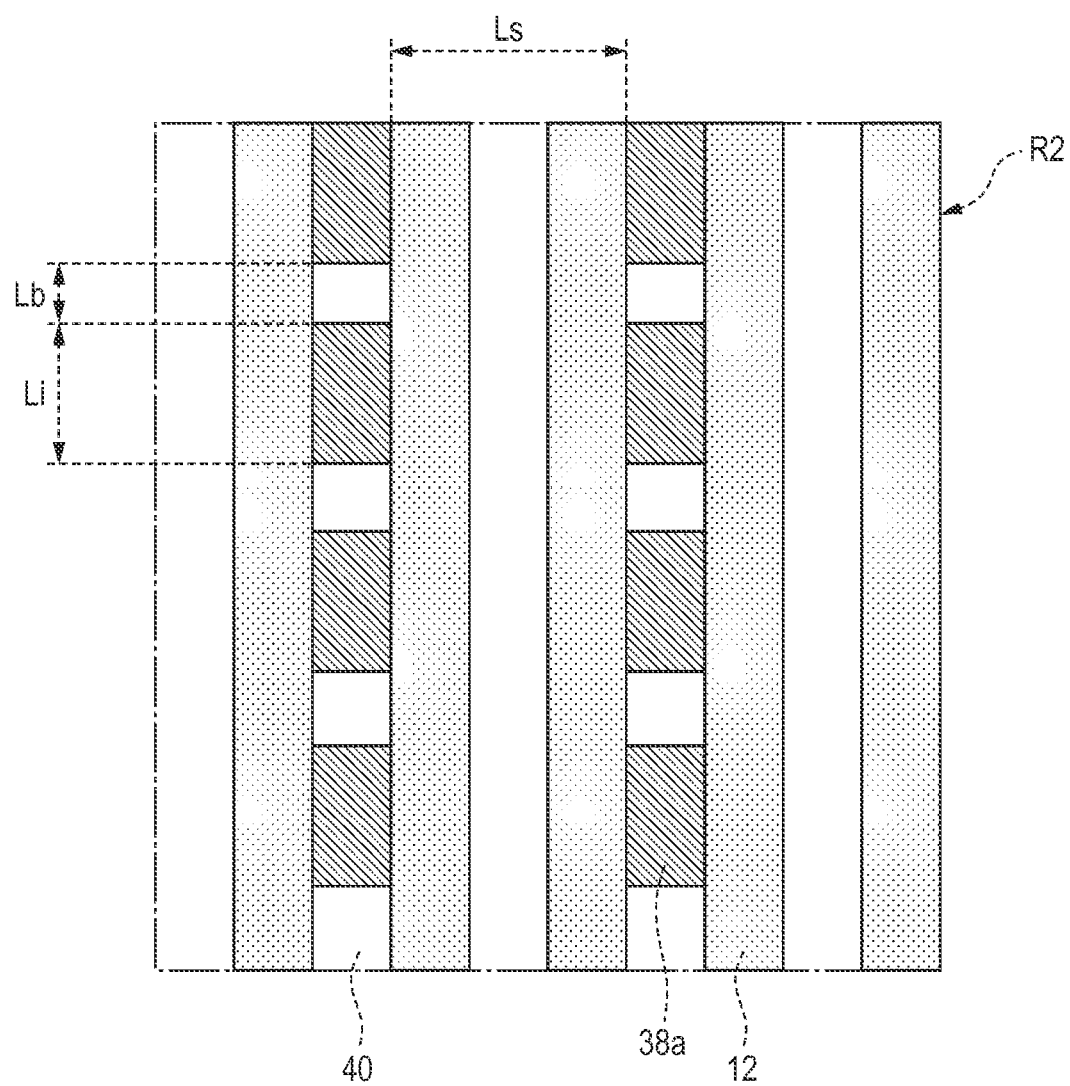
Figure 40:
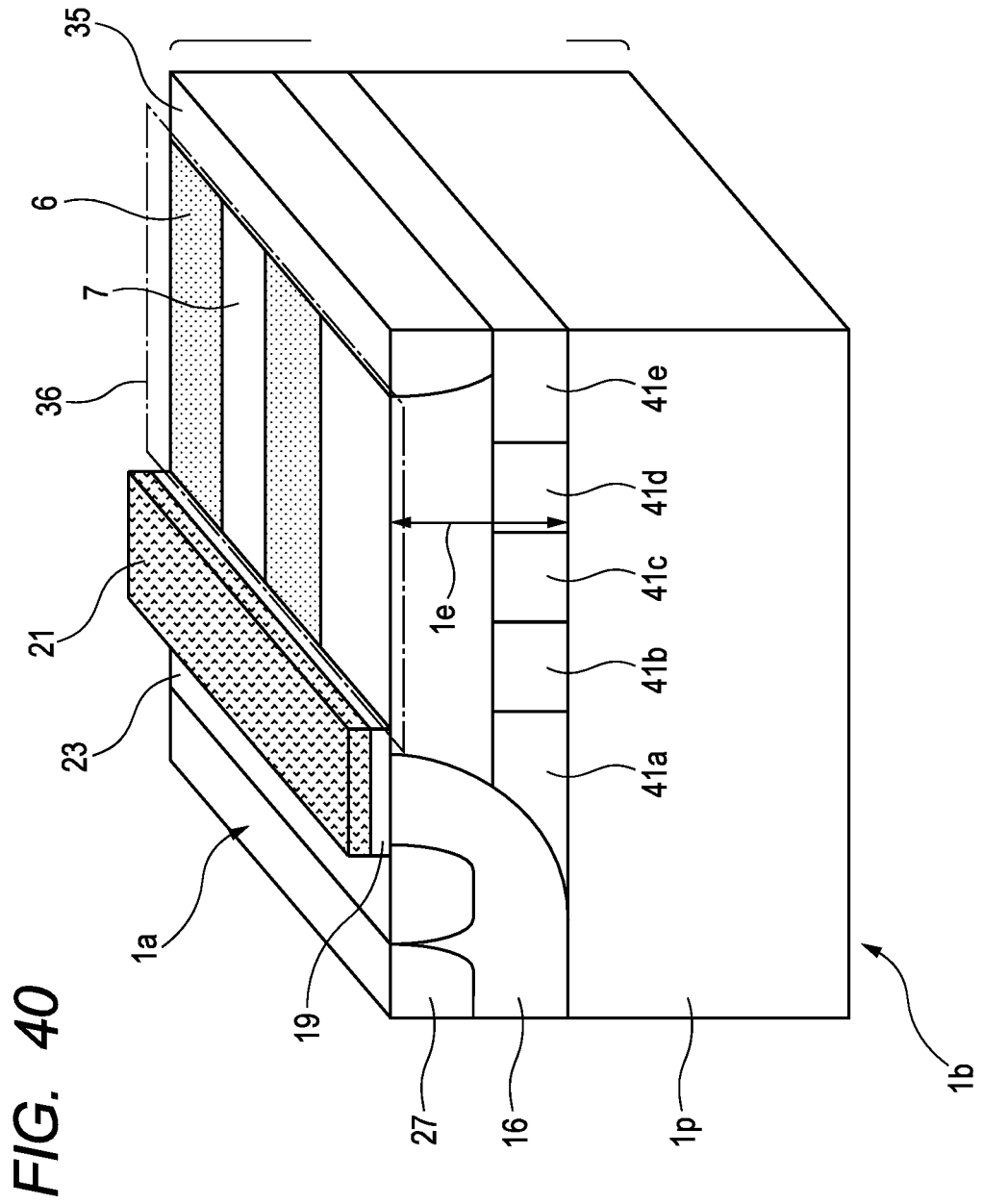
Figure 41:
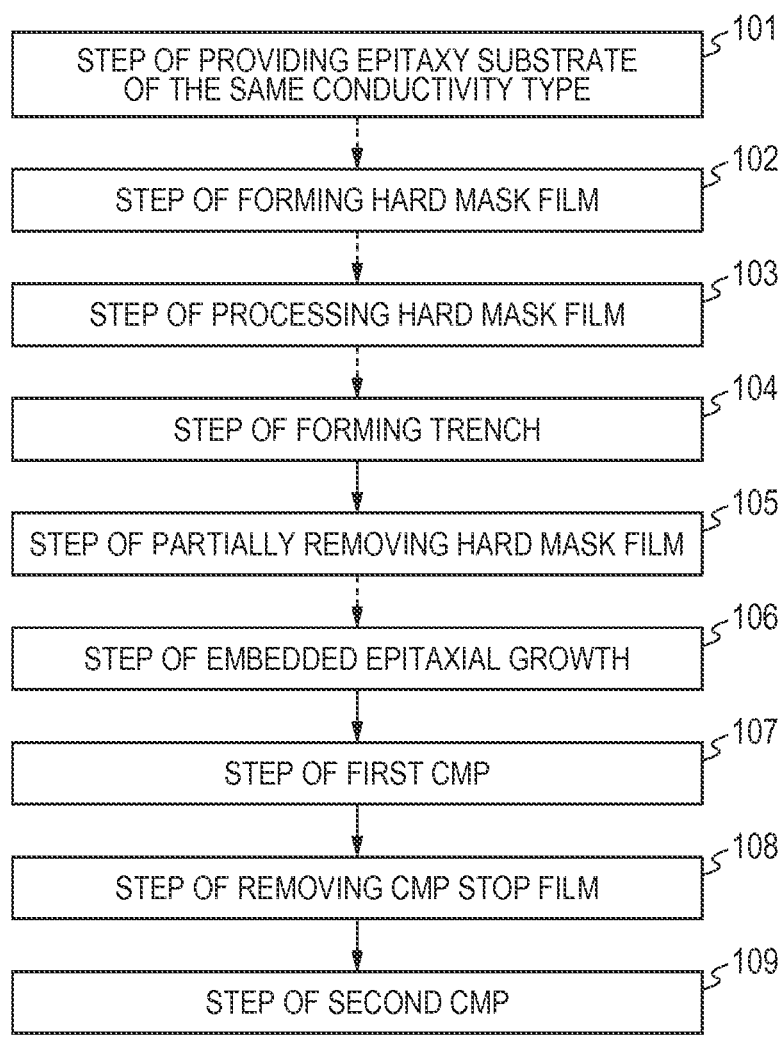
Figure 42:
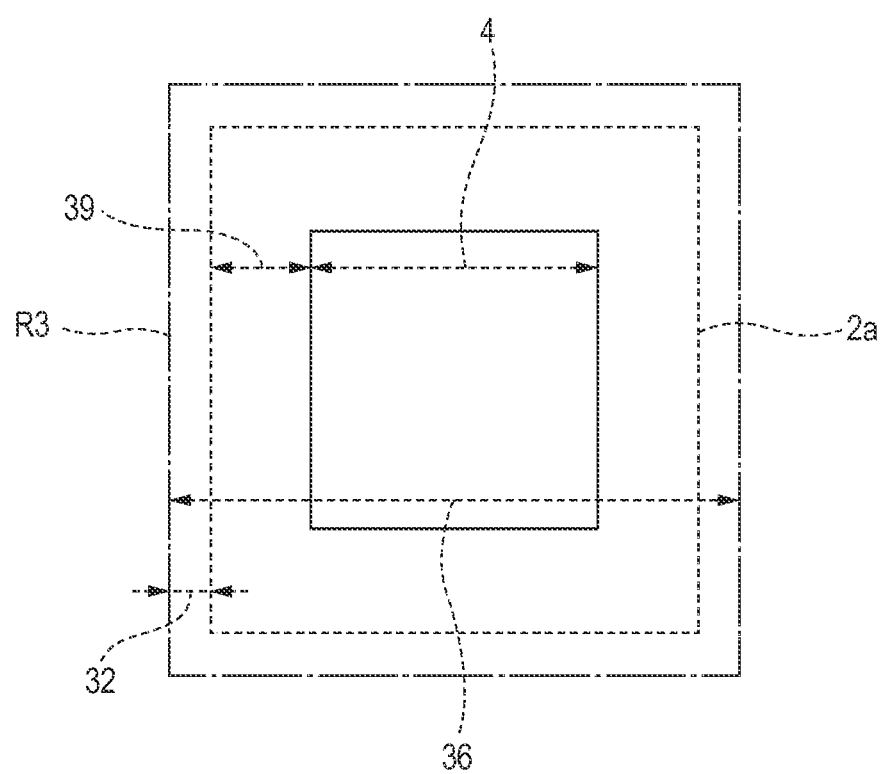

FIG. 21 is a sectional view of the device approximately corresponding to the X-X' section of the cut-out region R2 of the active cell in FIG. 2, the device being during a manufacturing process (step of forming contact groove and introducing P+-type body contact region), by which a wafer process, etc., in the manufacturing method of a power MOSFET according to the one embodiment of the application is described;

FIG. 22 is a sectional view of the device approximately corresponding to the X-X' section of the cut-out region R2 of the active cell in FIG. 2, the device being during a manufacturing process (step of embedding plug and forming surface metal film), by which a wafer process, etc., in the manufacturing method of a power MOSFET according to the one embodiment of the application is described;

FIG. 23 is a sectional view of the device approximately corresponding to the X-X' section of the cut-out region R2 of the active cell in FIG. 2, the device being during a manufacturing process (step of forming and processing final passivation film), by which a wafer process, etc., in the manufacturing method of a power MOSFET according to the one embodiment of the application is described;

FIG. 24 is a sectional view of the device approximately corresponding to the X-X' section of the cut-out region R2 of the active cell in FIG. 2, the device being during a manufacturing process (step of forming rear surface metal electrode film), by which a wafer process, etc., in the manufacturing method of a power MOSFET according to the one embodiment of the application is described;

FIG. 25 is a top view of the wafer corresponding to a cut-out region R3 of the whole of a chip periphery in FIG. 4, by which a variation with respect to a device structure in the manufacturing method of a power MOSFET according to the one embodiment of the application, in particular, with respect to a range, etc., where the super junction structure is formed (method of forming super junction limited to inside of the cell region), is described;

FIG. 26 is a top view of the wafer corresponding to the cut-out region R3 of the whole of a chip periphery in FIG. 4, by which a variation with respect to a device structure in the manufacturing method of a power MOSFET according to the one embodiment of the application, in particular, with respect to a range, etc., where the super junction structure is formed (buffer-type layout between the super junction formation region and the hard mask remaining region), is described;

FIG. 27 is a top view of the wafer corresponding to the cut-out region R3 of the whole of a chip periphery in FIG. 4, by which a variation with respect to a device structure in the manufacturing method of a power MOSFET according to the one embodiment of the application, in particular, with respect to a range, etc., where the super junction structure is formed (method of forming super junction limited to whole chip region), is described;

FIG. 28 is a top view of the wafer corresponding to the cut-out region R3 of the whole of a chip periphery in FIG. 4, by which a variation with respect to a device structure in the manufacturing method of a power MOSFET according to the one embodiment of the application, in particular, with respect to a range, etc., where the super junction structure is formed (method of forming super junction limited to whole chip region and to outside periphery), is described;

FIG. 29 is a sectional view of the device corresponding to FIG. 8, by which a wafer process, etc., regarding a variation 1 (method of thinning out stripe hard mask) with respect to a hard mask layout within the cell region in the manufacturing method of a power MOSFET according to the one embodiment of the application, is described;

FIG. 30 is a sectional view of the device (step of processing underlying hard mask for trench etch) corresponding to FIG. 8, by which a wafer process, etc., regarding the variation 1 (method of thinning out stripe hard mask) with respect to the hard mask layout within the cell region in the manufacturing method of a power MOSFET according to the one embodiment of the present application, is described;

FIG. 31 is a sectional view of the device (step of processing overlying hard mask for trench etch) approximately corresponding to FIG. 10, by which a wafer process, etc., regarding the variation 1 (method of thinning out stripe hard mask) with respect to the hard mask layout within the cell region in the manufacturing method of a power MOSFET according to the one embodiment of the application, is described;

FIG. 32 is a plan view of the cell region in the step in FIG. 33 corresponding to FIG. 12 (corresponding to the cut-out region R2 of the active cell in FIG. 2), by which a wafer process, etc., regarding the variation 1 (method of thinning out stripe hard mask) with respect to the hard mask layout within the cell region in the manufacturing method of a power MOSFET according to the one embodiment of the application, is described;

FIG. 33 is a sectional view of the device corresponding to FIG. 13 (step of removing overlying hard mask for trench etch), by which a wafer process, etc., regarding the variation 1 (method of thinning out stripe hard mask) with respect to the hard mask layout within the cell region in the manufacturing method of a power MOSFET according to the one embodiment of the application, is described;

FIG. 34 is a sectional view of the device corresponding to FIG. 14 (step of embedded epitaxial growth), by which a wafer process, etc., regarding the variation 1 (method of thinning out stripe hard mask) with respect to the hard mask layout within the cell region in the manufacturing method of a power MOSFET according to the one embodiment of the application, is described;

FIG. 35 is a sectional view of the device corresponding to FIG. 15 (step of first CMP), by which a wafer process, etc., regarding the variation 1 (method of thinning out stripe hard mask) with respect to the hard mask layout within the cell region in the manufacturing method of a power MOSFET according to the one embodiment of the application, is described;

FIG. 36 is a sectional view of the device corresponding to FIG. 16 (step of removing underlying hard mask for trench etch), by which a wafer process, etc., regarding the variation 1 (method of thinning out stripe hard mask) with respect to the hard mask layout within the cell region in the manufacturing method of a power MOSFET according to the one embodiment of the application, is described;

FIG. 37 is a sectional view of the device corresponding to FIG. 17 (step of second CMP), by which a wafer process, etc., regarding the variation 1 (method of thinning out stripe hard mask) with respect to the hard mask layout within the cell region in the manufacturing method of a power MOSFET according to the one embodiment of the application, is described;

FIG. 38 is a plan view of the cell region (corresponding to the cut-out region R2 of the active cell in FIG. 2) in a step of trench etch corresponding to FIG. 12, by which a variation 2 (method of covering island hard mask) with respect to the hard mask layout within the cell region in the manufacturing method of a power MOSFET according to the one embodiment of the application is described;

FIG. 39 is a plan view of the cell region (corresponding to the cut-out region R2 of the active cell in FIG. 2) in the step of trench etch corresponding to FIG. 12, by which a variation 3 (method of thinning out island hard mask) with respect to the hard mask layout within the cell region in the manufacturing method of a power MOSFET according to the one embodiment of the application is described;

FIG. 40 is a perspective view of an essential part of a device, by which a variation (LDMOSFET) with respect to the device structure in the manufacturing method of a power MOSFET according to the one embodiment of the application is described;

FIG. 41 is a process block flow view by which the outline of the manufacturing method of a power MOSFET according to the one embodiment of the application is described; and FIG. 42 is a top view of the wafer corresponding to the cut-out region R3 of the whole of a chip periphery in FIG. 4, by which additional description with respect to a method of forming super junction over whole wafer is made.

DETAILED DESCRIPTION

Outlines of Embodiments

Outlines of typical embodiments disclosed in the present application will be first described.

1. A manufacturing method of a power MOSFET comprising the steps of: (a) providing a semiconductor wafer having both an over-substrate epitaxy layer of a first conductivity type on a first main surface side and a substrate layer of the first conductivity type on a second main surface side; (b) forming a hard mask film over the first main surface of the semiconductor wafer; (c) patterning the hard mask film; (d) forming many trenches over the first main surface of the semiconductor wafer by using the patterned hard mask film as a mask; (e) after the step (d) above, removing the hard mask film so as to leave, as a CMP stop film, the hard mask film in a hard mask film remaining region of a scribe region adjacent to each of many chip regions that are arranged over the first main surface in a lattice pattern; (f) depositing, in a state where the CMP stop film is present in the scribe region, an embedded epitaxy layer of a second conductivity type opposite to the first conductivity type, over the first main surface of the semiconductor wafer by embedded epitaxial growth; (g) after the step (f) above, performing a first CMP treatment on the first main surface of the semiconductor wafer by using the CMP stop film as a CMP stopper; (h) after the step (g) above, removing the CMP stop film; and (i) after the step (h) above, performing a second CMP treatment on the first main surface of the semiconductor wafer.

2. In the manufacturing method of a power MOSFET according to the item 1, the step (b) includes the steps of: (b1) forming a first insulating film over the first main surface of the semiconductor wafer; (b2) removing the first insulating film so as to leave, as a remaining insulating film, the first insulating film in the hard mask film remaining region; and (b3) after the step (b2) above, forming a second insulating film, which forms the hard mask film along with the remaining insulating film, over the first main surface of the semiconductor wafer.

3. In the manufacturing method of a power MOSFET according to the item 1 or the item 2, the hard mask film remaining region includes an alignment mark region.

4. In the manufacturing method of a power MOSFET according to the item 2 or the item 3, the first insulating film is a silicon nitride-based insulating film, and the second insulating film is a silicon oxide-based insulating film.

5. In the manufacturing method of a power MOSFET according to any one of the items 1 to 4, a polishing amount in the second CMP treatment is smaller than that in the first CMP treatment.

6. In the manufacturing method of a power MOSFET according to any one of the items 1 to 5, both the over-substrate epitaxy layer and the embedded epitaxy layer are polished in the second CMP treatment.

7. A manufacturing method of a power MOSFET comprising the steps of: (a) providing a semiconductor wafer having both an over-substrate epitaxy layer of a first conductivity type on a first main surface side and a substrate layer of the first conductivity type on a second main surface side; (b) forming a hard mask film over the first main surface of the semiconductor wafer; (c) patterning the hard mask film; (d) forming many trenches over the first main surface of the semiconductor wafer by using the patterned hard mask film as a mask; (e) after the step (d) above, removing the hard mask film so as to leave, as a CMP stop film, the hard mask film in both: a first hard mask film remaining region inside each of many chip regions that are arranged over the first main surface in a lattice pattern; and a second hard mask film remaining region of a scribe region adjacent to each of the chip regions; (f) depositing, in a state where the CMP stop film is present in each of the chip regions and the scribe region, an embedded epitaxy layer of a second conductivity type opposite to the first conductivity type, over the first main surface of the semiconductor wafer by embedded epitaxial growth; (g) after the step (f) above, performing a first CMP treatment on the first main surface of the semiconductor wafer by using the CMP stop film as a CMP stopper; (h) after the step (g) above, removing the CMP stop film; and (i) after the step (h) above, performing a second CMP treatment on the first main surface of the semiconductor wafer.

8. In the manufacturing method of a power MOSFET according to the item 7, the first hard mask film remaining region is also provided in a cell region within each of the chip regions.

9. In the manufacturing method of a power MOSFET according to the item 7 or the item 8, the step (b) includes the steps of: (b1) forming a first insulating film over the first main surface of the semiconductor wafer; (b2) removing the first insulating film so as to leave, as a remaining insulating film, the first insulating film in both the first hard mask film remaining region and the second hard mask film remaining region; and (b3) after the step (b2) above, forming a second insulating film, which forms the hard mask film along with the remaining insulating film, over the first main surface of the semiconductor wafer.

10. In the manufacturing method of a power MOSFET according to any one of the items 7 to 9, the second hard mask film remaining region includes an alignment mark region.

11. In the manufacturing method of a power MOSFET according to the item 9 or the item 10, the first insulating film is a silicon nitride-based insulating film, and the second insulating film is a silicon oxide-based insulating film.

12. In the manufacturing method of a power MOSFET according to any one of the items 7 to 11, a polishing amount in the second CMP treatment is smaller than that in the first CMP treatment.

13. In the manufacturing method of a power MOSFET according to any one of the items 8 to 12, the first hard mask film remaining region presents a stripe-like form in the cell region.

14. In the manufacturing method of a power MOSFET according to any one of the items 8 to 12, the first hard mask film remaining region presents an island-like form in the cell region.

15. In the manufacturing method of a power MOSFET according to the item 13, an interval between the first hard mask film remaining regions each presenting the stripe-like form is approximately 10 μm to 100 μm.

16. In the manufacturing method of a power MOSFET according to the item 14, an interval between the first hard mask film remaining regions each presenting the island-like form is approximately 10 μm to 100 μm.

17. A manufacturing method of a power MOSFET comprising the steps of: (a) providing a semiconductor wafer having both an over-substrate epitaxy layer of a first conductivity type on a first main surface side and a substrate layer of a second conductivity type opposite to the first conductivity type, on a second main surface side; (b) forming a hard mask film over the first main surface of the semiconductor wafer; (c) patterning the hard mask film; (d) forming a plurality of trenches over the first main surface of the semiconductor wafer by using the patterned hard mask film as a mask; (e) after the step (d) above, removing the hard mask film so as to leave, as a CMP stop film, the hard mask film in a hard mask film remaining region of a scribe region adjacent to each of a plurality of chip regions that are arranged over the first main surface in a lattice pattern; (f) depositing, in a state where the CMP stop film is present in the scribe region, an embedded epitaxy layer of the second conductivity type over the first main surface of the semiconductor wafer by embedded epitaxial growth; (g) after the step (f) above, performing a first CMP treatment on the first main surface of the semiconductor wafer by using the CMP stop film as a CMP stopper; (h) after the step (g) above, removing the CMP stop film; and (i) after the step (h) above, performing a second CMP treatment on the first main surface of the semiconductor wafer.

18. In the manufacturing method of a power MOSFET according to the item 17, the step (b) includes the steps of: (b1) forming a first insulating film over the first main surface of the semiconductor wafer; (b2) removing the first insulating film so as to leave, as a remaining insulating film, the first insulating film in the hard mask film remaining region; and (b3) after the step (b2) above, forming a second insulating film, which forms the hard mask film along with the remaining insulating film, over the first main surface of the semiconductor wafer.

19. In the manufacturing method of a power MOSFET according to the item 17 or the item 18, the hard mask film remaining region includes an alignment mark region.

20. In the manufacturing method of a power MOSFET according to the item 18 or the item 19, the first insulating film is a silicon nitride-based insulating film, and the second insulating film is a silicon oxide-based insulating film.

[Explanation of Description Form, Basic Terms, and Usage Thereof in Present Application]

1. In the present application, an embodiment is sometimes described by being divided into multiple sections, if necessary and for convenience. However, unless otherwise indicated explicitly, these are not independently separated from each other, but they form respective parts of an example, or one represents a partial detailed description of the others or represents a variation of part or all of the others. In addition, description of like parts will not be repeated in principle. In addition, respective components in an embodiment are not essential, except the cases where: otherwise indicated explicitly; it is theoretically limited to the number; and it is obviously not true from the context.

In addition, the "semiconductor device" referred to in the present application mainly means a single body of various transistors (active elements) or an article in which the single body that is a main part, a resistor, a capacitor, etc., are integrated over a semiconductor chip, etc., (e.g., single crystalline silicon substrate) (the article including a package body in which one or more such chips are included). Herein, typical transistors of the various transistors can be exemplified by MISFETs (Metal Insulator Semiconductor Field Effect Transistors) represented by MOSFETs (Metal Oxide Semiconductor Field Effect Transistors). A power system semiconductor device is described in the application, but the "power system semiconductor device" mainly means one of various semiconductor devices in each of which a power of 5 watts or more is handled, such as, for example, a power MOSFET, IGBT (Insulated Gate Bipolar Transistor), power diode, and compound device including at least one of them.

The power MOSFETs can be sorted out into horizontal power MOSFETs (generally referred to as "LDMOSFETs") and vertical power MOSFETs (generally referred to as "Vertical MOSFETs"). The vertical power MOSFETs are further sorted out into a planar type and a trench type. In the application, the planar type is mainly described in detail as one example, but it is needless to say that the description made herein can be similarly applied to the trench type.

2. Similarly, when a material, composition, or the like, is described in such a way that "X is comprised of A" in the description of embodiments, etc., a material, composition, or the like including an element other than A as one of major components should not be excluded, except the cases where: otherwise indicated explicitly; or it is obviously not true from the context. For example, with respect to a component, the "X is comprised of A" means that "X includes A as a major component", etc. For example, when it is described as "a silicon member", etc., it should not be limited to pure silicon, and it is needless to say that SiGe alloy, a multi-component alloy whose major component is silicon, and a member including other additives, are also included.

Similarly, even when it is described as a "silicon oxide film", "silicon oxide-based insulating film", or the like, not only an insulating film including relatively pure undoped silicon dioxide, but also an insulating film whose major component is another silicon oxide are included. For example, the silicon oxide films include silicon oxide-based insulating films in which impurities are doped, examples of the impurities including, for example: TEOS-based silicon oxide, PSG (Phosphorus Silicate Glass), and BPSG (Borophosphosilicate Glass). In addition, thermal oxide films, CVD oxide films, and coated films, such as SOG (Spin On Glass) and NSC (Nano-Clustering Silica) are included in the silicon oxide film or the silicon oxide-based insulating film. Other than those, low-k insulating films, such as FSG (Fluorosilicate Glass), SiOC (Silicon Oxicarbide), carbondoped silicon oxide, or OSG (Organosilicate Glass) are also included in the silicon oxide film or the silicon oxide-based insulating film. In addition, silica-based low-k insulating films (porous insulating films, when referred to as a "porous material", a molecular porous material is also included), the silica-based low-k insulating film being obtained by introducing holes in the members similar to those mentioned above, are also included in the silicon oxide film or the silicon oxide-based insulating film.

In addition, as silicon-based insulating films that are normally used along with the silicon oxide-based insulating films, silicon nitride-based insulating films can be mentioned. Examples of the material that belongs to this system include SiN, SiCN, SiNH, and SiCNH, etc. The "silicon nitride" referred to herein includes both SiN and SiNH, unless otherwise indicated explicitly. Similarly, the "SiCN" referred to herein includes both SiCN and SiCNH, unless otherwise indicated explicitly.

3. When it is referred to as a "wafer", it normally means a single crystalline silicon wafer over which a semiconductor integrated circuit (a "semiconductor device" or an "electronic device" is the same) is formed, but it is needless to say that it includes compound wafers in which a semiconductor layer is formed over an insulating substrate, such as an epitaxial wafer, SOI substrate, LCD glass substrate, or the like.

4. Views, positions, and attributes, etc., are exemplified by preferred examples, and it is needless to say that they should not be limited thereto, except the cases where: otherwise indicated explicitly; or it is obviously not true from the context. Accordingly, for example, a "square" includes an approximate square, "intersection at right angles" includes intersection at approximately right angles, and "match" includes approximate match. The same is true for "parallel" and "right angle". Accordingly, the case where two objects are shifted from each other by approximately 10° from a completely parallel state is included in a parallel state.

When a region is referred to as "whole of a region" or "all of a region", it includes "almost the whole of a region" or "almost all of a region". Accordingly, for example, 80% or more of a region" can be referred to as "the whole of a region" or "all of a region". The same is true for "whole circumference" and "whole length", etc.

When the shape of an object is referred to as a "rectangle", it includes an "approximate rectangle". Accordingly, an area of a portion different from a rectangle is smaller than approximately 20% with respect to the total area, it can be referred to as a rectangle. In this case, the same is true for "annularity". When an annular object is separated in this case, a portion obtaining by interpolating or extrapolating the separated element portion is assumed to be part of the annular object.

When it is referred to as being "periodic", it includes being approximately periodic, and each element, the period of which is shifted, for example, by approximately 20%, can be referred to as being "periodic". In addition, when the number of elements, the period of each of which is out of this range, is smaller than approximately 20% with respect to the number of the whole elements that are the targets of the period, it can be referred to as being "periodic" as a whole.

The definitions made in this section are common, and when a different definition is made in the following specific description, the different definition is preferentially adopted in the portion where the specific description is applied. However, in a portion where the specific description is not applied, the definitions and stipulations made in this section are still effective, unless they are denied explicitly.

5. Even when a specific value or amount is referred to, a value that is larger or smaller than the specific value may be acceptable, except the cases where: otherwise indicated explicitly; it is theoretically limited to the number; and it is obviously not true from the context.

6. A super junction structure generally has a structure in which pillar-shaped or plate-shaped column regions each having a first conductivity type is inserted into a semiconductor region of a second conductivity type, opposite to the first conductivity type, at the same intervals so as to maintain a charge balance. When a "super junction structure" of a trench fill method is referred to in the present application, the super junction structure has a structure in which, in principle, plate-shaped (normally a plate shape, but a bent or inflected shape is acceptable) "column regions" each having a certain conductivity type are inserted into a semiconductor region of another conductivity type, opposite to the certain conductivity type, at almost the same intervals so as to maintain a charge balance. In the one embodiment, a structure, which is formed by placing P-type column regions in parallel to each other and at the same intervals over an N-type semiconductor layer (e.g., drift region), will be described.

Roughly speaking, there are three methods for introducing super junction structure, as follows: (1) a multi-epitaxial method; (2) a trench insulating film embedding method; and (3) a trench fill method (embedded epitaxial method, trench filling method, autofill method, or trench epitaxial embedding method). The multi-epitaxial method, in which epitaxial growth and ion implantation are repeated many times, has increased cost due to the complicated steps, but has increased flexibility in process and design. In the trench insulating film embedding method, after ions are implanted obliquely with respect to a trench, an insulating film is embedded into the trench by CVD (Chemical Vapor Deposition). The process is simpler, but disadvantageous in terms of the on-resistance (Ron) between a source and a drain as much as the area of the trench. In contrast with these, the trench fill method has the advantage that the steps are simple, while the flexibility in the process and design is relatively low due to the restrictions on the growth conditions of the embedded epitaxial growth.

In the super junction structure, the "orientation" means the longitudinal direction, when a P-type column or N-type column, which forms the super junction structure, is viewed two-dimensionally with respect to the main surface of a chip (in a plane parallel to the main surface of the chip or wafer).

The super junction structure can be applied to drift regions (or regions corresponding thereto or major current passages) not only in power MOSFETs, but also in the whole of power system semiconductor devices (e.g., power diodes), with no significant change or a required change.

In the present application, the drift region includes not only an epitaxy layer portion, which serves as a current passage when a power system semiconductor device, such as a power MOSFET, is in an on-state, but also a peripheral epitaxy layer portion (including the P-type column region and N-type column region), which contributes to holding a backward withstand voltage when the power system semiconductor device is in an off-state.

7. In the present application, the crystal face referred to, for example, as (100), etc., is intended to include one equivalent thereto. Similarly, the crystal orientation referred to as <100>, <110>, or the like is intended to include one equivalent thereto.

8. In the present application, the "over-substrate epitaxy layer" means a layer formed over a relatively flat substrate by epitaxial growth. On the other hand, the "embedded epitaxy layer" means a layer formed with a concave portion, which is present over a surface having relatively large concavities and convexities in which the depth thereof is larger than the average groove width, being filled by epitaxial growth.

The "chip region" means a region that is to become a chip when a wafer is separated into chips. On the other hand, the "scribe region" means a portion to be removed by dicing, etc.

The "hard mask film" means an etching-resistant mask film other than a resist film, which is not used as a mask simultaneously with the resist film. The "hard mask film remaining region" means a region where the hard mask film remains after a hard mask film for forming trench is partially removed after trenches are formed. On the other hand, the "hard mask removed region" means a region where the hard mask film is to be removed when the hard mask film for forming trench is partially removed after the trenches are formed.

Details of Embodiments

The embodiments will be further described in detail. The same or similar parts in each view will be denoted with the same or similar symbols or reference numerals, and description thereof will not be repeated in principle.

In the accompanying drawings, there are sometimes the cases where, even in a sectional view, hatching lines, etc., are omitted when the view becomes complicated or the distinction from a space is clear. In relation to this, when it is clear from the description, etc., the contour line of a background is sometimes omitted even with a planarly-closed hole. Conversely, hatching lines are sometimes drawn even in a non-sectional view, in order to explicitly illustrate that the portion is not a space.

Examples of a related patent document in which a power MOSFET using a super junction structure, etc., is disclosed include, for example: Japanese Unexamined Patent Publication Nos. 2011-108906, 2011-146429, and 2011-216587; and Japanese Patent Application Nos. 2012-13030 (filed with JPO on Jan. 25, 2012) and 2013-384 (filed with JPO on Jan. 7, 2013), etc.

1. Description of Manufacturing Steps in Manufacturing Method of Power MOSFET (Cell Periphery SJ Termination Type) According to One Embodiment of Present Application and Mutual Relationship Among Wafer, Chip Region, and Other Internal and External Parts when Device is Completed (Mainly FIGS. 1 to 5)

In this example, a planar power MOSFET having a source-drain withstand voltage of approximately 600 V, the MOSFET being formed over a silicon-based semiconductor substrate, will be described in detail as an example (the planar power MOSFET is in accordance with the following sections); however, it is needless to say that this content can be applied to power MOSFETs having different withstand voltages and other devices.

A chip, having a size of approximately 3 mm×3 mm to 10 mm×10 mm, will be mainly described herein; however, it is needless to say that the size is arbitrary. In addition, a chip, having a planar shape of an approximate square, will be mainly described; however, it is needless to say that the chip may have a rectangular shape.

Figure 1:
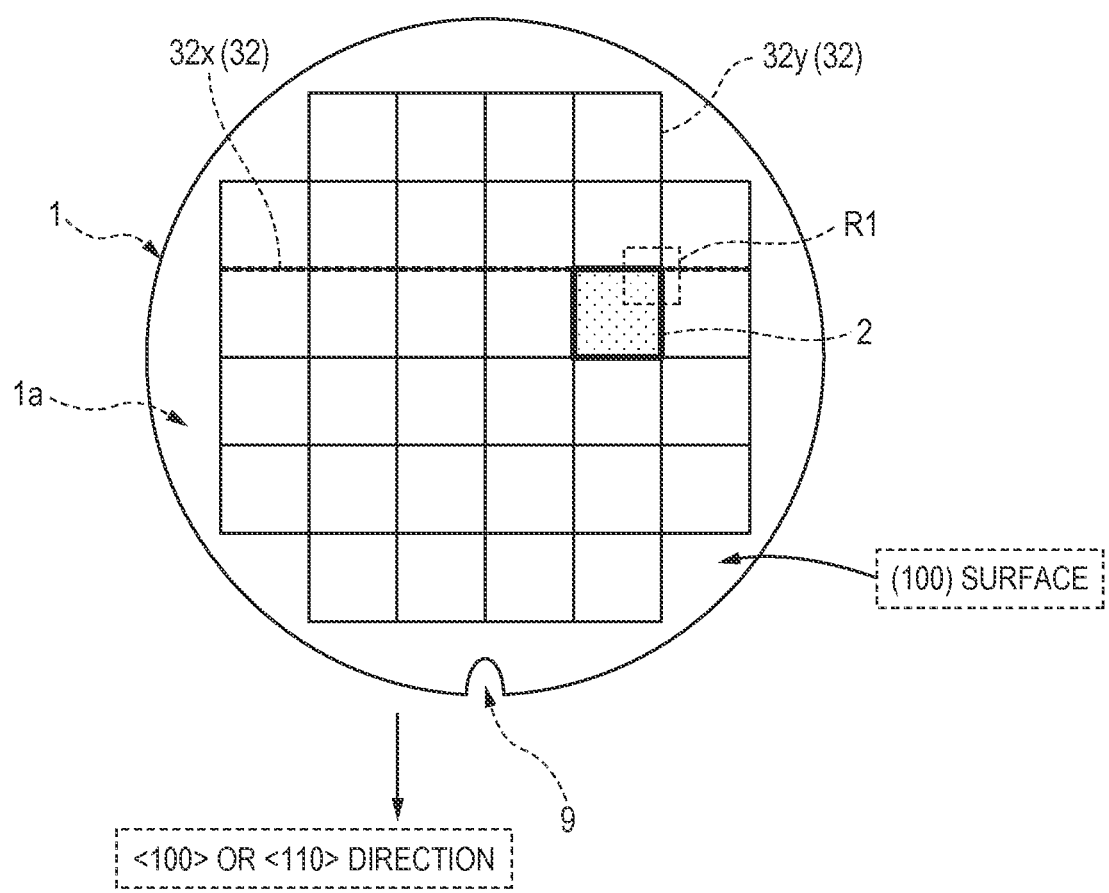
FIG. 1 is a view illustrating the whole upper surface of a wafer, by which manufacturing steps in a manufacturing method of a power MOSFET (cell periphery SJ termination type) according to one embodiment of the present application, and mutual relationships among the wafer, a chip region, and other internal and external parts, when a device is completed, are described.
Figure 3:
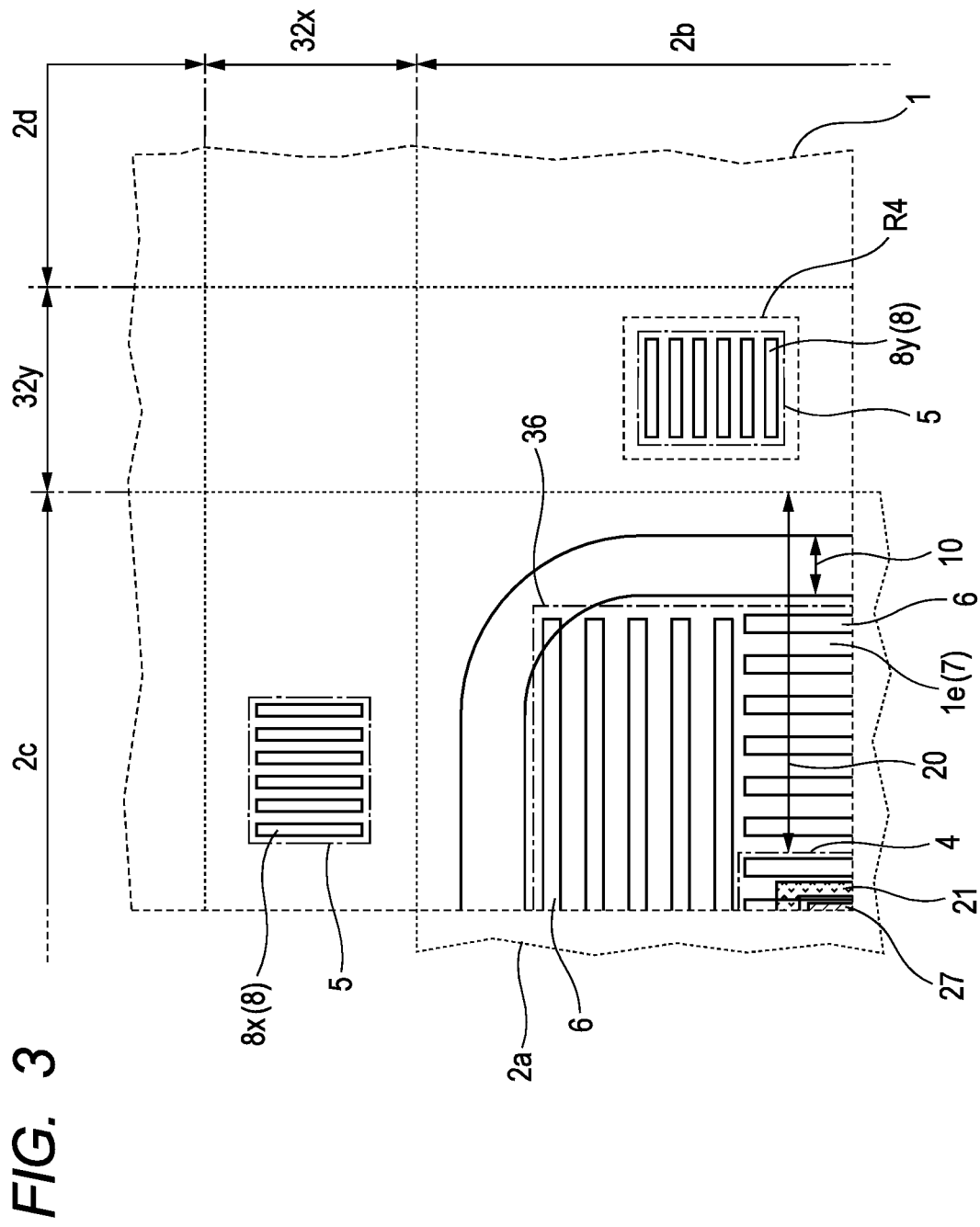
FIG. 3 is an enlarged plan view of a cut-out region R1 of the periphery of a chip corner illustrated in FIGS. 1 and 2.
Figure 5:
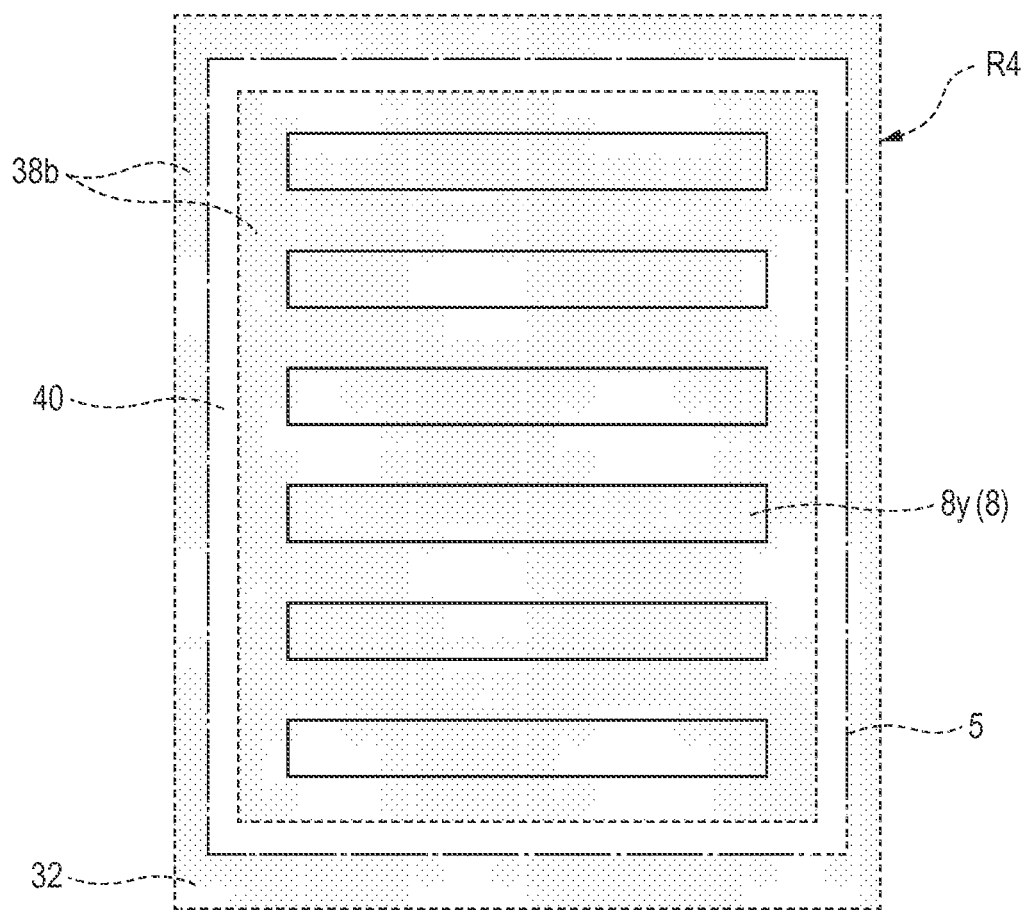
FIG. 5 is a top view of the wafer, in which a state of the alignment mark region omitted in FIG. 4 is illustrated.

FIG. 1 is a view illustrating the whole upper surface of a wafer, by which manufacturing steps in a manufacturing method of a power MOSFET (cell periphery SJ termination type) according to one embodiment of the present application, and mutual relationships among the wafer, a chip region, and other internal and external parts when a device is completed, are described. FIG. 2 is an enlarged plan view of a single chip region in FIG. 1 and a periphery thereof (where the device is almost completed, but a metal source electrode, etc., is removed in order for a super junction structure, etc., to be seen easily). FIG. 3 is an enlarged plan view of a cut-out region R1 of the periphery of the chip corner illustrated in FIGS. 1 and 2. FIG. 4 is a top view of the wafer (however, the structure of an alignment mark region, etc., is omitted), in which the relationship between a hard mask remaining region and a cell region, etc., in a process of forming trench in an area approximately corresponding to FIG. 2, is illustrated. FIG. 5 is a top view of the wafer, in which a state of the alignment mark region omitted in FIG. 4 is illustrated.

Based on these views, manufacturing steps in the manufacturing method of a power MOSFET (cell periphery SJ termination type) according to one embodiment of the application, and mutual relationships among the wafer, the chip region, and other internal and external parts when the device is completed, will be described.

FIG. 1 illustrates a layout of chip regions 2, etc., over a device main surface 1a of a wafer 1 (when it is assumed that the size of the wafer is 200 mm and the size of the chip is approximately 3 mm×3 mm, the actual number of the chips is approximately 100 times the number illustrated herein, but the size of the chip is illustrated in an exaggerated way for convenience of illustration). As illustrated in FIG. 1, many chip regions 2 or regions to become chip regions are provided in an almost matrix pattern over the main surface 1a on the front side of the wafer 1 (device main surface, main surface on the source side, i.e., first main surface). The chip regions, which are adjacent to each other, are spaced apart from each other by scribe regions 32 that intersect, at right angles, with each other in the X-direction and in the Y-direction (X-direction scribe regions 32x and Y-direction scribe regions 32y). In this example, the crystal face of the main surface 1a on the front side of the wafer 1 is, for example, (100), and the crystal orientation in the direction of a notch 9 is, for example, <100> or <110> (of course, other crystal faces and crystal orientations are acceptable, if necessary).

FIG. 2 illustrates (a metal layer in an internal region of the chip is removed in order for the view to be easily seen) a planar layout of the whole of the upper surface (corresponding to the main surface 1a on the front side of the wafer 1) of the chip 2 (chip region), occurring when the device is almost completed. As illustrated in the view, the chip 2 has an approximate square shape or a rectangular shape close to a square, and a guard ring 10 is provided in a chip peripheral region 20 and an active cell region 4 (cell region) is provided in the central portion thereof. Herein, it is needless to say that a chip having an elongated rectangular shape is not excluded. A polysilicon film (gate electrode) 21 having a multiply-connected structure (sheet-shaped structure having many identical openings) is provided in the active cell region 4. The whole of the active cell region 4 and a predetermined region of the chip peripheral region 20 are covered with a P-type column region 6 that forms the super junction structure. It is needless to say that the planar structure of the gate electrode may be a single connected structure, if necessary. Herein, an alignment mark region 5 is provided in the scribe region 32, and an alignment mark 8 (8y) is provided in the alignment mark region 5. A cell region outside peripheral super junction formation region 39 is provided around the cell region 4, which forms a super junction formation region 36 along with the cell region 4 in this example. In addition, when it is limited to the chip region 2, a portion that is not the super junction formation region 36 is a super junction non-formation region 37. In this example, the super junction formation region 36 is not present outside the chip region 2. In this example, the case where the alignment mark region 5 is provided inside the scribe region 32, that is the case where all of the alignment mark region 5 is removed by dicing, etc., has been described, but it is needless to say that all or part of the alignment mark region 5 may be provided in the chip region 2.

FIG. 3 illustrates the cut-out region R1 of the periphery of the chip corner illustrated in FIGS. 1 and 2. As illustrated in the view, a P+-type body contact region 27 is provided in the active cell region 4 of a chip region 2a, and many P-type column regions 6 are formed in an N-type silicon epitaxy layer 1e present from the active cell region 4 to the chip peripheral region 20. The super junction structure is formed by these P-type column regions 6 and the N-type column regions 7 (N-type silicon epitaxy layer 1e) between them. The chip region 2a is adjacent: to a chip region 2b by sandwiching the Y-direction scribe region 32y; to a chip region 2c by sandwiching the X-direction scribe region 32x; and to a chip region 2d by sandwiching an intersection region between both the scribe regions 32x and 32y. The alignment mark region 5 (wherein the size thereof can be exemplified, for example, by approximately 36 μm×32 μm), which is used in forming the alignment mark 8 for aligning the super junction structure with the position of the subsequent process layer, is provided in each of the scribe regions 32x and 32y. An X-direction alignment mark 8x and a Y-direction alignment mark 8y are provided in the alignment mark region 5 of the X-direction scribe region 32x and in that of the Y-direction scribe region 32y, respectively.

Subsequently, FIG. 4 illustrates the outline of a state of the upper surface of the wafer 1. Over the wafer 1 both a single chip region 2a, which is formed by partially removing a hard mask film after a trench, (an essential portion in the wafer process in the manufacturing method of a power MOSFET according to one embodiment of the present application), is formed, and the periphery (chip regions 2b, 2c, 2d, 2e, 2f, 2g, 2h, and 2i and the scribe region 32) are formed. As illustrated in the view, the super junction formation region 36 is spread across the whole of the cell region 4 and the periphery thereof in this example. That is, the super junction structure is also provided in a junction termination region. From the definition of each region, a portion other than the super junction formation region 36 becomes the super junction non-formation region 37. Roughly speaking (which means that the peripheral portion, etc., of the alignment mark region 5 is excluded), the super junction non-formation region 37 almost corresponds to a hard mask remaining region 38. In addition, almost the whole of the scribe region 32 is a hard mask remaining region 38b (second hard mask remaining region) of the scribe region, and the chip region 2 other than the super junction formation region 36 structure becomes a hard mask remaining region 38a (first hard mask remaining region) of the chip region. Such a layout of the super junction formation region and the hard mask remaining region is effective in securing junction termination characteristics.

Subsequently, FIG. 5 is an enlarged plan view illustrating the peripheral portion of the alignment mark region 5 omitted in FIG. 4 (cut-out region R4 of the periphery of the alignment mark region in FIG. 3). As illustrated in the view, the ring-shaped edge portion of the alignment mark region 5 becomes a hard mask removed region 40. The whole of the alignment mark region 5 (other than the hard mask removed region 40) and the whole of the scribe region 32 other than the alignment mark region 5 (excluding an TEG pattern region and other alignment mark regions) together become the hard mask remaining region 38b (second hard mask remaining region).

2. Description of Wafer Process, Etc., in Manufacturing Method of Power MOSFET According to One Embodiment of Present Application (Mainly FIGS. 6 to 24)

An example of the wafer process corresponding to the device structure described in Section 1 will be described hereinafter. However, it is needless to say that the following process is one example and various modifications may be made thereto.

The dimension and film thickness, etc., of each part described in Sections 1 and 2 are not basically different in Section 3, and they will not be described repeatedly in principle, unless particularly different.

FIGS. 6-24 illustrate steps of the wafer process, etc., in the manufacturing method of a power MOSFET, according to one embodiment of the application.

Figure 6:
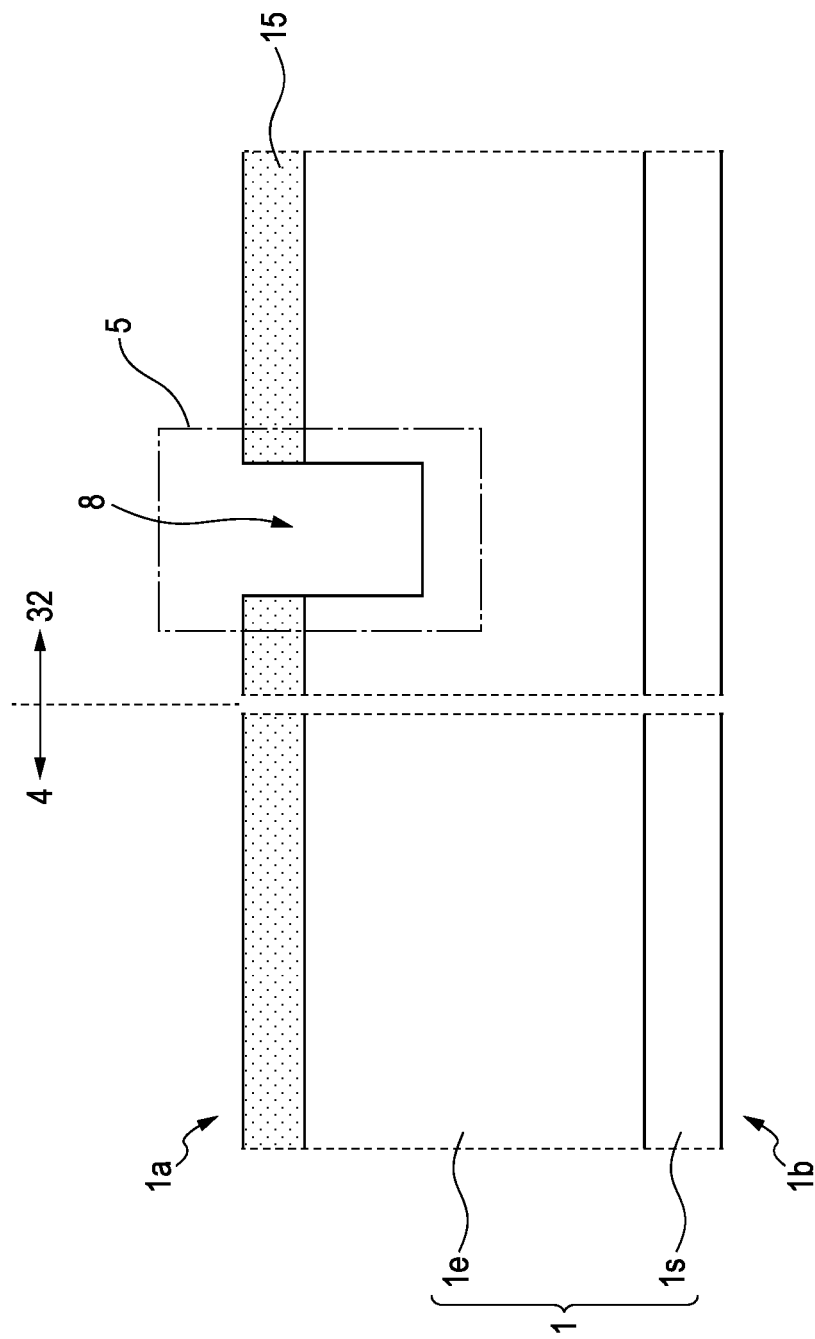
FIG. 6 is a sectional view (corresponding to the X-X' section in FIG. 2) of each of the cell region (or super junction formation region) and the scribe region (including the alignment mark region) in the wafer during a manufacturing process (step of forming alignment mark), by which a wafer process, etc., in the manufacturing method of a power MOSFET according to the one embodiment of the application is described.

FIG. 6 is a sectional view (corresponding to the X-X' section in FIG. 2) of both the cell region (or super junction formation region) and the scribe region (including the alignment mark region) in the wafer during a manufacturing process step of forming alignment mark.

Figure 7:
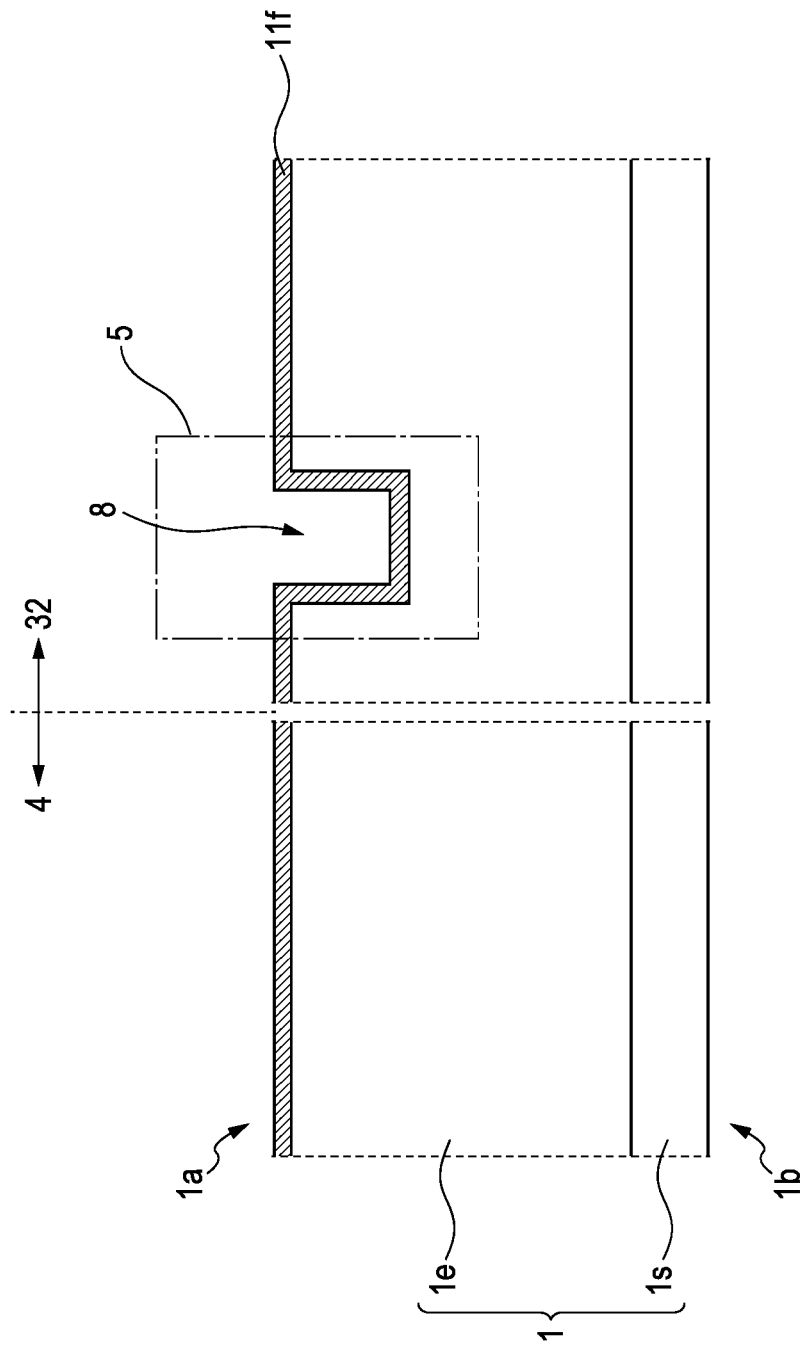
FIG. 7 is a sectional view (corresponding to the X-X' section in FIG. 2) of each of the cell region (or the super junction formation region) and the scribe region (including the alignment mark region) in the wafer during a manufacturing process (step of forming underlying hard mask film for trench etch), by which a wafer process, etc., in the manufacturing method of a power MOSFET according to the one embodiment of the application is described.

FIG. 7 is a sectional view (corresponding to the X-X' section in FIG. 2) of both the cell region (or the super junction formation region) and the scribe region (including the alignment mark region) in the wafer during a manufacturing process step of forming underlying hard mask film for trench etch.

FIG. 8 is a sectional view (corresponding to the X-X' section in FIG. 2) of both the cell region (or the super junction formation region) and the scribe region (including the alignment mark region) in the wafer during a manufacturing process step of processing underlying hard mask for trench etch.

Figure 9:
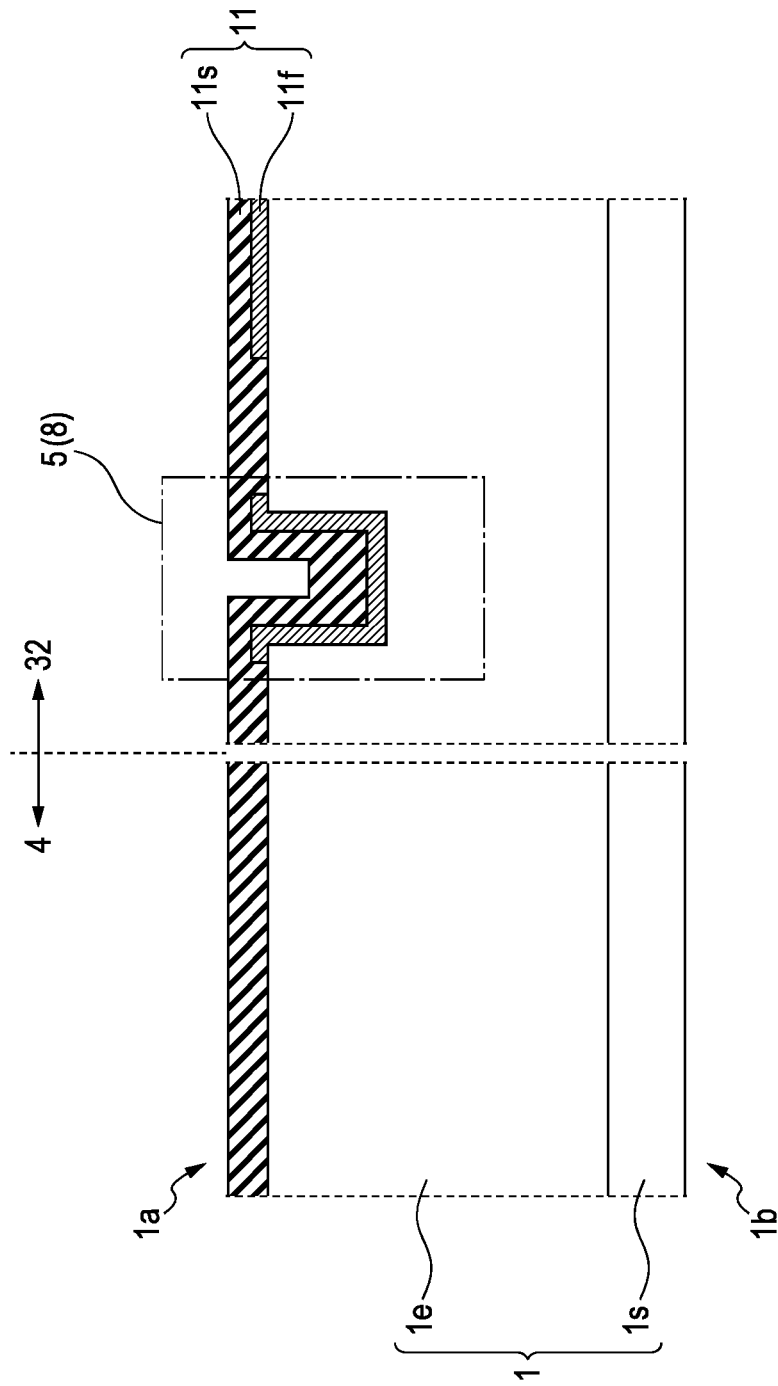
FIG. 9 is a sectional view (corresponding to the X-X' section in FIG. 2) of each of the cell region (or the super junction formation region) and the scribe region (including the alignment mark region) in the wafer during a manufacturing process (step of forming overlying hard mask film for trench etch), by which a wafer process, etc., in the manufacturing method of a power MOSFET according to the one embodiment of the application is described.

FIG. 9 is a sectional view (corresponding to the X-X' section in FIG. 2) of both the cell region (or the super junction formation region) and the scribe region (including the alignment mark region) in the wafer during a manufacturing process step of forming overlying hard mask film for trench etch.

FIG. 10 is a sectional view (corresponding to the X-X' section in FIG. 2) of both the cell region (or the super junction formation region) and the scribe region (including the alignment mark region) in the wafer during a manufacturing process step of processing overlying hard mask for trench etch.

Figure 11:
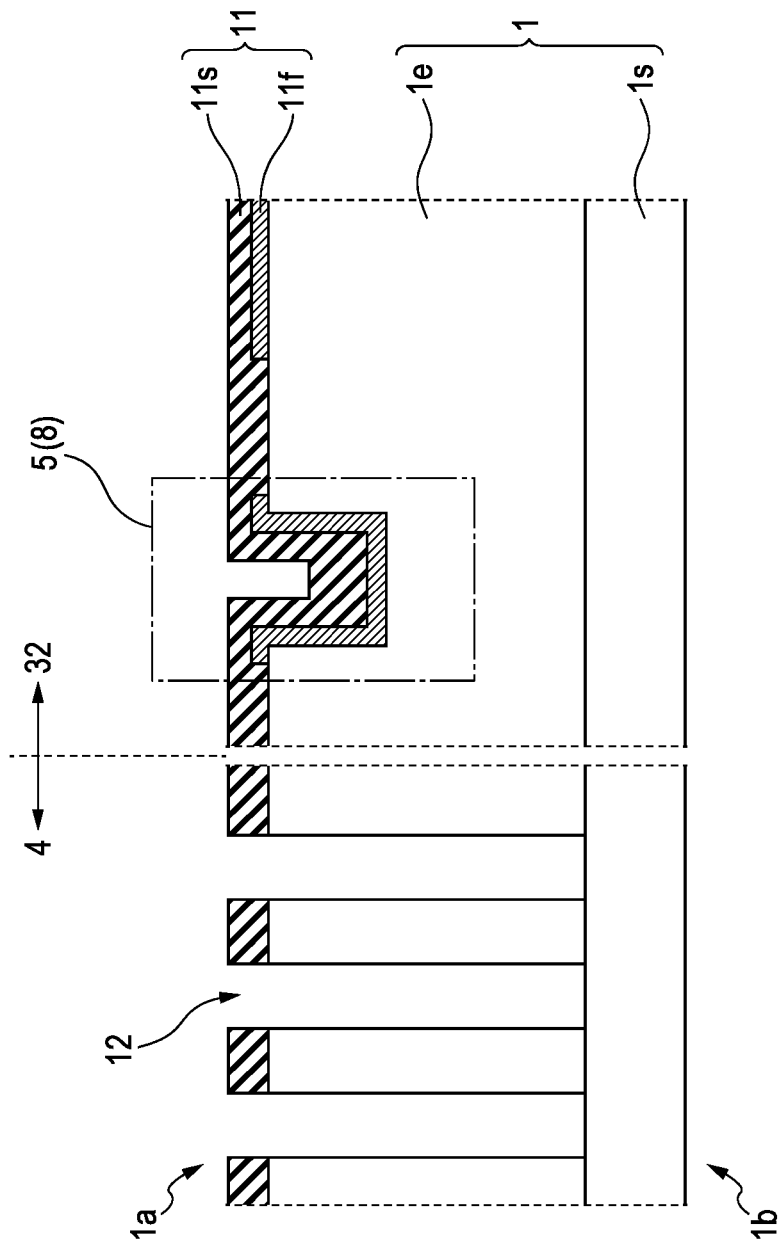
FIG. 11 is a sectional view (corresponding to the X-X' section in FIG. 2) of each of the cell region (or the super junction formation region) and the scribe region (including the alignment mark region) in the wafer during a manufacturing process (step of trench etch), by which a wafer process, etc., in the manufacturing method of a power MOSFET according to the one embodiment of the application is described.

FIG. 11 is a sectional view (corresponding to the X-X' section in FIG. 2) of both the cell region (or the super junction formation region) and the scribe region (including the alignment mark region) in the wafer during a manufacturing process step of trench etch.

FIG. 12 is a plan view of a cell region in the step in FIG. 13 (corresponding to the cut-out region R2 of the active cell in FIG. 2).

FIG. 13 is a sectional view (corresponding to the X-X' section in FIG. 2) of both the cell region (or the super junction formation region) and the scribe region (including the alignment mark region) in the wafer during a manufacturing process (step of removing overlying hard mask for trench etch.

FIG. 14 is a sectional view (corresponding to the X-X' section in FIG. 2) of both the cell region (or the super junction formation region) and the scribe region (including the alignment mark region) in the wafer during a manufacturing process step of embedded epitaxial growth.

FIG. 15 is a sectional view (corresponding to the X-X' section in FIG. 2) of both the cell region (or the super junction formation region) and the scribe region (including the alignment mark region) in the wafer during a manufacturing process step of first CMP.

FIG. 16 is a sectional view (corresponding to the X-X' section in FIG. 2) of both the cell region (or the super junction formation region) and the scribe region (including the alignment mark region) in the wafer during a manufacturing process step of removing underlying hard mask for trench etch.

FIG. 17 is a sectional view (corresponding to the X-X' section in FIG. 2) of both the cell region (or the super junction formation region) and the scribe region (including the alignment mark region) in the wafer during a manufacturing process step of second CMP.

Figure 18:
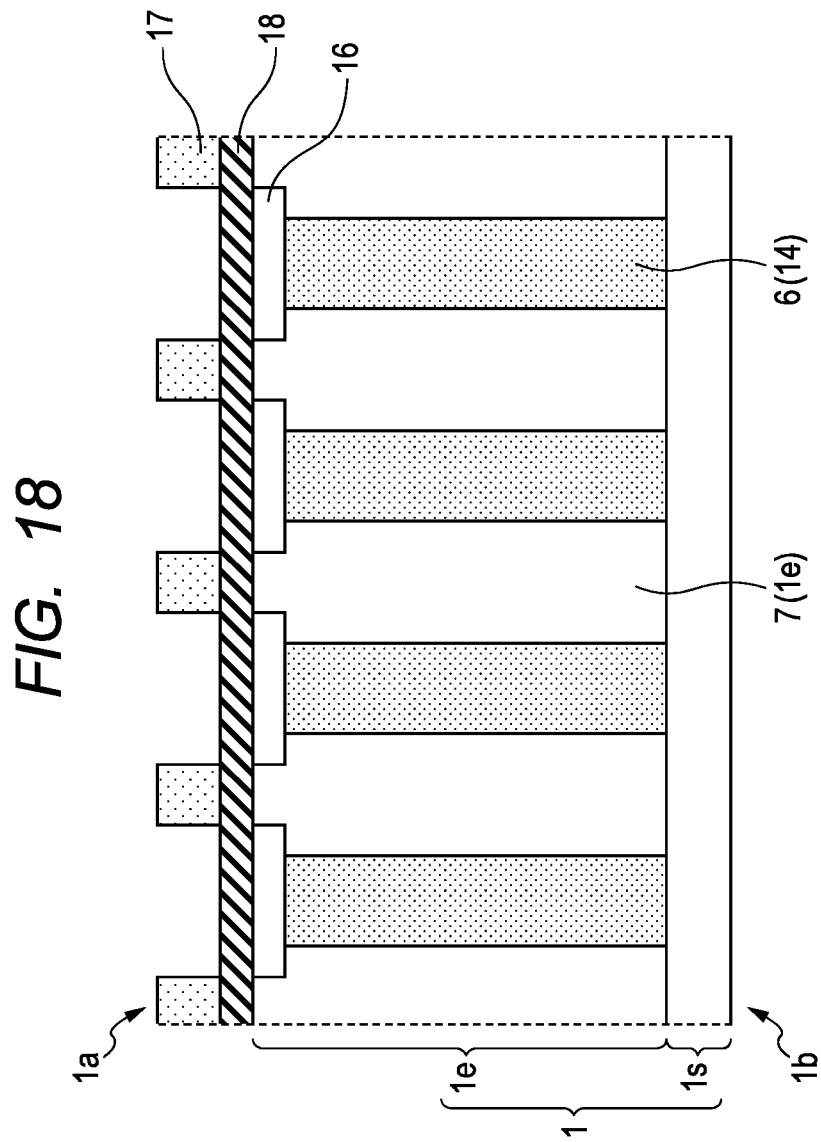
FIG. 18 is a sectional view of a device approximately corresponding to the X-X' section of the cut-out region R2 of the active cell in FIG. 2, the device being during a manufacturing process (step of introducing P-type body region), by which a wafer process, etc., in the manufacturing method of a power MOSFET according to the one embodiment of the application is described.

FIG. 18 is a sectional view of a device approximately corresponding to the X-X' section of the cut-out region R2 of the active cell in FIG. 2, during a manufacturing process step of introducing P-type body region.

Figure 19:
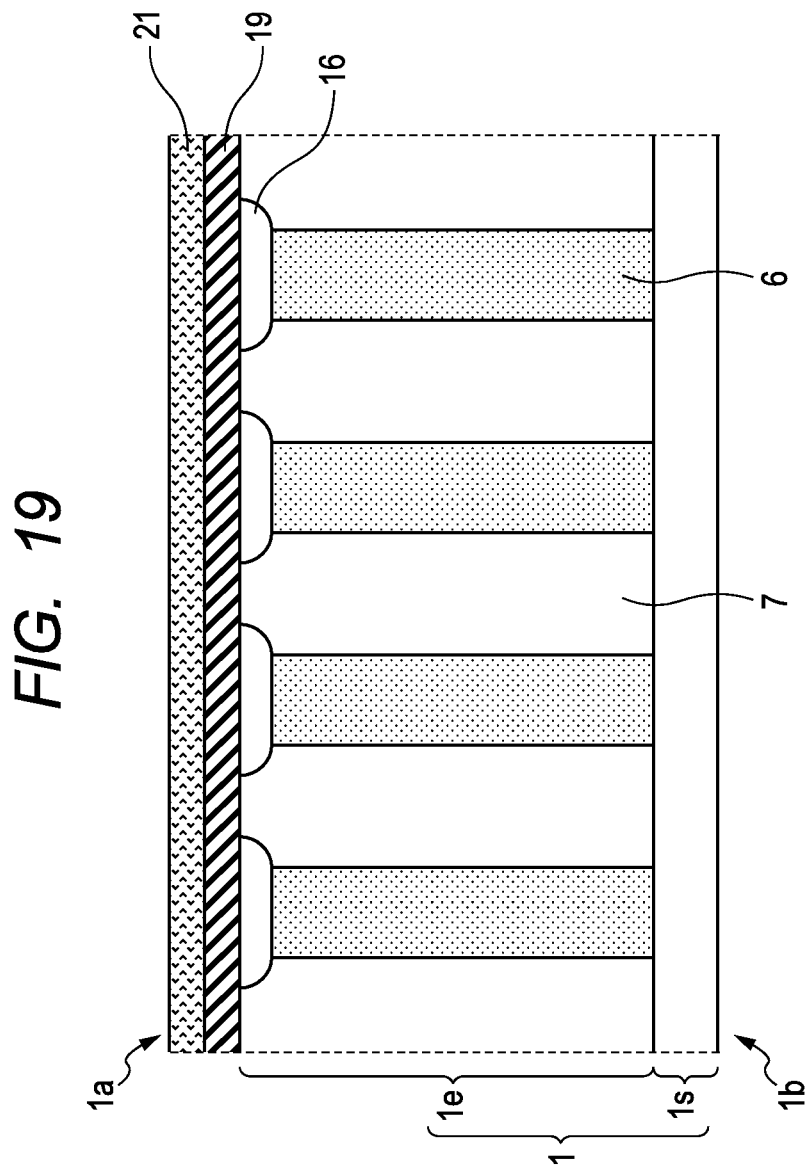
FIG. 19 is a sectional view of the device approximately corresponding to the X-X' section of the cut-out region R2 of the active cell in FIG. 2, the device being during a manufacturing process (step of forming polysilicon film), by which a wafer process, etc., in the manufacturing method of a power MOSFET according to the one embodiment of the application is described.

FIG. 19 is a sectional view of the device approximately corresponding to the X-X' section of the cut-out region R2 of the active cell in FIG. 2, during a manufacturing process step of forming polysilicon film.

Figure 20:
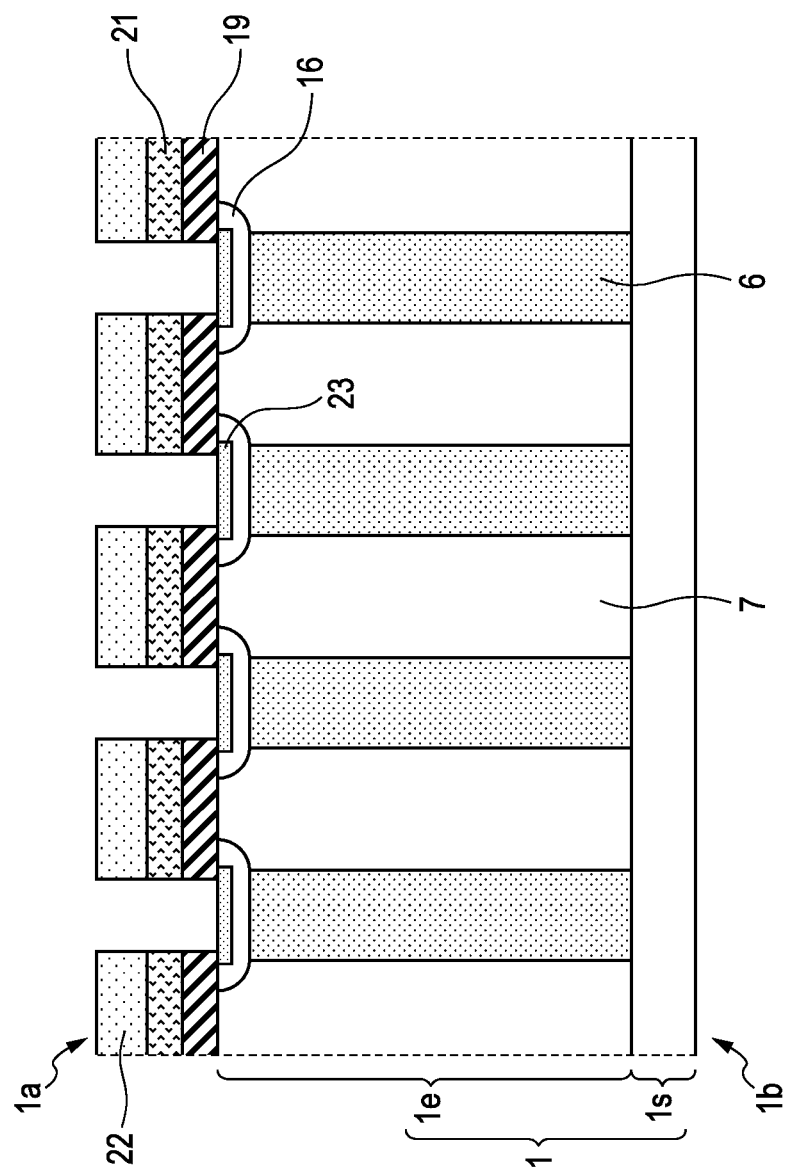

FIG. 20 is a sectional view of the device approximately corresponding to the X-X' section of the cut-out region R2 of the active cell in FIG. 2, during a manufacturing process step of processing gate and introducing N+-type source region.

FIG. 21 is a sectional view of the device approximately corresponding to the X-X' section of the cut-out region R2 of the active cell in FIG. 2, during a manufacturing process step of forming contact groove and introducing P+-type body contact region.

FIG. 22 is a sectional view of the device approximately corresponding to the X-X' section of the cut-out region R2 of the active cell in FIG. 2, during a manufacturing process step of embedding plug and forming surface metal film.

FIG. 23 is a sectional view of the device approximately corresponding to the X-X' section of the cut-out region R2 of the active cell in FIG. 2, during a manufacturing process step of forming and processing final passivation film.

FIG. 24 is a sectional view of the device approximately corresponding to the X-X' section of the cut-out region R2 of the active cell in FIG. 2, during a manufacturing process step of forming rear surface metal electrode film.

Based on these views, the wafer process, etc., in the manufacturing method of a power MOSFET according to one embodiment of the application will be described.

The wafer 1 is first provided as illustrated in FIG. 6, in which, for example, the N-type silicon epitaxy layer 1e (over-substrate epitaxy layer) is formed over the surface on the first main surface 1a side of an N+-type single crystalline silicon substrate portion 1s (substrate layer). The first main surface side 1a is shown to have a cell region 4 and a scribe region 32. Herein, description will be made, assuming that the diameter of the wafer is, for example, approximately 200 mm, but the diameter may be approximately 150 mm, approximately 300 mm, or other diameters. In addition, description will be made, assuming that the thickness of the wafer is, for example, approximately 700 μm, but the thickness may be some other amount (preferred range is approximately 300 to 1200 μm). With respect to the impurity doping into the substrate portion 1s of the wafer, an N+ single crystalline silicon substrate can be mentioned as a preferred example, in which, for example, antimony has been doped in an amount on the order of approximately $10^{18}$ to $10^{19}/cm^3$. The thickness of the over-substrate epitaxy layer 1e is, for example, approximately 50 μm, when a withstand voltage is approximately 600 V.

Subsequently, a first resist film 15 for forming alignment mark is formed over almost the whole of the surface on the first main surface 1a side of the wafer 1 by, for example, coating, etc. Subsequently, the first resist film 15 for forming alignment mark is patterned by, for example, normal lithography, etc., and the alignment mark 8 (e.g., the width thereof is approximately 2 μm and the depth is approximately 5 μm) is then formed over the first main surface 1a of the wafer 1 by performing anisotropic dry etching using the patterned first resist film 15 as a mask and using, for example, a halogen-based etching gas, etc. Thereafter, the first resist film 15 for forming the alignment mark, which has become unnecessary, is removed by, for example, ashing, etc. The cell region 4 is illustrated on the left side of each of FIGS. 6 to 17, but the portion may be used as the super junction formation region 36 in this example.

Subsequently, for example, a silicon nitride film (e.g., the thickness thereof is approximately 500 nm) is formed, as an underlying hard mask layer 11f for trench etch, over the whole of the surface on the surface 1a side of the wafer 1 by, for example, CVD (Chemical Vapor Deposition), etc., as illustrated in FIG. 7. Optionally, a silicon oxide film (e.g., the thickness thereof is approximately 100 nm), etc., may be formed as an underlying film of the silicon nitride film (which is effective in preventing peeling).

Subsequently, a second resist film 31 for processing underlying hard mask for trench etch is formed over almost the whole of the surface on the surface 1a side of the wafer 1 by, for example, coating, etc., as illustrated in FIG. 8. Subsequently, the second resist film 31 for processing underlying hard mask for trench etch is patterned by, for example, normal lithography, etc., and the underlying hard mask layer 11f for trench etch is then patterned by performing anisotropic dry etching using, for example, a fluorocarbon-based etching gas, etc. Thereafter, the second resist film 31 for processing the underlying hard mask layer 11f for trench etch, which has become unnecessary, is remove by, for example, ashing, etc.

Subsequently, for example, a silicon oxide film (e.g., the thickness thereof is approximately 1.0 μm) is formed, as an overlying hard mask layer 11s for trench etch, over almost the whole of the surface on the surface 1a side of the wafer 1 by, for example, CVD, as illustrated in FIG. 9. Thus, the underlying hard mask layer 11f for trench etch and the overlying hard mask layer 11s for trench etch together form a hard mask 11 for trench etch (hard mask film) in this example.

Subsequently, a third resist film 33 for processing overlying hard mask layer 11s for trench etch is formed over almost the whole of the surface on the surface 1a side of the wafer 1 by, for example, coating, etc., as illustrated in FIG. 10. Subsequently, the third resist film 33 is patterned by for, example, normal lithography, etc., and the overlying hard mask layer 11s for trench etch is then patterned by performing anisotropic dry etching using, for example, a fluorocarbon-based etching gas, etc. In this step, and as seen in FIG. 10, the overlying hard mask layer 11s for trench etch is patterned without etching the underlying hard mask layer 11f for trench etch. Thereafter, the third resist film 33, which has become unnecessary, is removed by, for example, ashing, etc.

Subsequently, a plurality of trenches 12 for embedding P-type column regions (for example, the depth thereof is approximately 55 µm and the width is approximately 4 µm) are formed over the first main surface 1a side of the wafer 1 by performing anisotropic dry etching using the patterned hard mask 11 for trench etch as an etching-resistant mask and using, for example, a halogen-based etching gas, etc., as illustrated in FIG. 11. Herein, it is desirable that the trenches 12 for embedding P-type column region reaches the N-type single crystalline silicon substrate 1s. Even if the trenches 12 do not reach substrate 1s, it is acceptable if the trenches 12 draw near to it.

Subsequently, the overlying hard mask layer 11s for trench etch is removed by, for example, wet etching using a fluoric acid-based etching solution, etc., as illustrated in FIGS. 12 and 13. That is, the hard mask film 11 is removed so as to leave, as a CMP stop film, the hard mask film (or, more specifically, the underlying hard mask layer 11f) in the hard mask remaining region of the scribe region adjacent to each of the plurality of chip regions 2, which are arranged in a lattice pattern. Thereby, a hard mask removed region 40 is formed in the cell region 4. When the whole wafer is viewed, the CMP stop film is left in a lattice pattern, as illustrated herein, and hence it becomes possible to absorb a variation in overgrowth amounts by the later-described CMP treatment. In addition, because the hard mask film 11 has a double structure and is formed by films having properties different from each other (mainly, a silicon nitride-based insulating film and a silicon oxide-based insulating film), there is the advantage that an etching treatment performed in the middle becomes simple. Further, because the remaining hard mask film covers almost the whole of the alignment mark region, the integrity of the alignment mark can be held even in the course of the embedded epitaxial growth, etc.

Subsequently, an embedded epitaxy layer 14 is formed by performing embedded epitaxial growth on almost the whole of at least the cell region 4 on the surface on the first main surface 1a side of the wafer 1, as illustrated in FIG. 14. It is understood that in some embodiments, the epitaxial growth may occur on both the cell region 4 and the scribe region 32. In the cell region 4, the embedded epitaxial layer 14 fills the trenches 12 and overgrows the first main surface 1a side. In this case, the overgrowth amount can be preferably exemplified by a thickness of, for example, approximately 5 µm.

Subsequently, a first CMP (Chemical Mechanical Polishing) treatment is performed on the surface on the first main surface 1a side of the wafer 1 by using the hard mask 11 (11f) for trench etch as a CMP stop film, as illustrated in FIG. 15. In this case, a polishing amount is, for example, approximately 4.5 µm. In this step, the height of the embedded epitaxial layer 14 in the chip region 4 is reduced to the height of the remaining hard mask 11, i.e., to the height of the underlying hard mask layer 11f, serving as the CMP stop film.

Subsequently, the remaining hard mask 11 (hard mask underlying layer 11f) for trench etch is removed by wet etching (of course, dry etching may be adopted) using a silicon nitride film etching solution, such as, for example, hot phosphoric acid, as illustrated in FIG. 16. At the time, a level difference of the upper surface 1a of the wafer is, for example, approximately 0.5 µm.

Subsequently, both the embedded epitaxy layer 14 and the over-substrate epitaxy layer 1e are polished by performing a second CMP treatment, thereby allowing the surface to be flattened, as illustrated in FIG. 17. In this case, a polishing amount is, for example, approximately 1.5 µm. Thus, the polishing amount in the second CMP treatment is smaller than that in the first CMP treatment. This is because, in the second CMP treatment, the surface can be flattened when a level difference becomes approximately three times the level difference remaining after the first CMP treatment. By performing the CMP treatment in two stages, it becomes easier to make the polishing amount of each embedded epitaxy layer 14 in the cell region 4 to be uniform than the case where the CMP treatment is performed in one stage, as described above. That is, if the CMP treatment is performed only in one stage, the polishing amount of the embedded epitaxy layer 14 in the central portion of the cell region 4 is, in particular, likely to be larger than that in a peripheral portion of the cell region 4. Accordingly, there is the fear that a variation may be caused in the characteristics of each MOSFET in the cell region 4, if only one CMP treatment is performed.

Thereby, the P-type column region 6 and the N-type column regions 7 are formed. After this, the process will be described by taking only the cell region 4 (specifically, the cut-out region R2 of the active cell in FIG. 17) as an example.

As illustrated in FIG. 18, a silicon oxide film 18 for forming P-type body region is formed over almost the whole of the first main surface 1a of the wafer 1 by, for example, thermal oxidation, etc. Subsequently, a resist film 17 for forming the P-type body region is, for example, coated or patterned (e.g., by normal lithography), and a P-type body region 16 (P-type channel region) is formed by ion implantation using the patterned resist film 17 as a mask (an ion species is, for example, boron and the content is, for example, in an order of approximately $10^{17}/cm^3$). Thereafter, the resist film 17 for forming the P-type body region, which has become unnecessary, is removed by, for example, ashing, etc., and then the silicon oxide film 18 for forming the P-type body region is removed by wet etching (dry etching may be adopted) using, for example, a fluoric acid-based etching solution, etc.

Subsequently, a gate oxide film 19 (for example, the thickness is approximately 100 nm) is formed over the first main surface 1a of the semiconductor wafer 1 by thermal oxidation (for example, wet oxidation at 950° C.), and a gate polysilicon film 21 (for example, a phosphorus-doped polysilicon film having a thickness of approximately 500 nm) is formed thereover by, for example, low-pressure CVD (Chemical Vapor Deposition), as illustrated in FIG. 19. Herein, wet cleaning, in which, for example, a first cleaning solution including ammonia:hydrogen peroxide:pure water=1:1:5 (volume ratio) and a second cleaning solution including hydrochloric acid:hydrogen peroxide:pure water=1:1:6 (volume ratio) are used, can be adopted as the wafer cleaning before gate oxidation.

A fourth resist film 22 is formed first main surface 1a. Subsequently, a gate electrode 21 is patterned (by normal lithography) by performing dry etching (for example, $SF_6$-based or $O_2$-based etching gas for polysilicon, and for example, $CHF_3$-based or $CF_4$-based etching gas for oxide film), as illustrated in FIG. 20. Subsequently, an N+ source region 23 is introduced (an ion species is, for example, arsenic and the content is, for example, in an order of approximately $10^{20}/cm^3$). Thereafter, the fourth resist film 22, which has become unnecessary, is wholly removed.

Subsequently, a PSG (Phospho-Silicate-Glass) film 24 (interlayer insulating film) having a thickness, for example, of approximately 900 nm is formed over almost the whole of the first main surface 1a of the semiconductor wafer 1 by CVD, etc., as illustrated in FIG. 21 (alternatively, the PSG film 24 may be flattened by overlapping an SOG film thereover). Subsequently, a fifth resist film 25 for opening source contact groove is formed over the first main surface 1a of the semiconductor wafer 1 (by normal lithography), and a source contact groove 26 is opened by performing anisotropic dry etching using the fifth resist film 25 as a mask, and the source contact groove 26 is extended into the substrate by performing, for example, anisotropic dry etching on the surface of the silicon substrate. Herein, such etching of the substrate is, of course, not essential. Thereafter, the P+ body contact region 27 is introduced into the hole bottom of the source contact groove 26 (contact hole) by ion implantation (e.g., $BF_2$) (the content is, for example, in on order of approximately $10^{19}/cm^3$). The fifth resist film 25, which has become unnecessary, is then wholly removed.

Subsequently, a tungsten plug 28 is embedded into the source contact groove 26 via, for example, a titanium-based barrier metal film, etc., as illustrated in FIG. 22. Subsequently, a metal source electrode 29 and the guard ring electrode 10 (FIG. 2), etc., are formed by forming, for example, an aluminum-based metal layer with sputtering, etc., and patterning it (with, for example, normal lithography). Herein, an example of using the tungsten plug 28 has been described, but it is needless to say that an aluminum-based metal layer may be directly formed by sputtering via a barrier metal, etc.

Next, a final passivation film 34, such as, for example, an inorganic final passivation film, an organic-inorganic final passivation film, or the like, is formed. Subsequently, a source pad opening 43, etc., is opened (for example, by normal lithography) in the final passivation film 34. Examples of the final passivation film 34 include: a single layer film comprised of an inorganic final passivation film, an organic-inorganic final passivation film, or the like; and a laminated film in which an organic-inorganic final passivation film, etc., is laminated over an underlying inorganic final passivation film.

Subsequently, the thickness of the wafer is reduced (the thickness of the substrate portion alone is, for example, approximately 700 µm) to a thickness approximately 20 µm to 200 µm, if necessary, by performing, for example, back grinding on the rear surface 1b of the wafer 1, as illustrated in FIG. 24. Subsequently, a rear surface metal electrode 30 is formed over the rear surface 1b of the wafer 1 (surface of a drain region 35) by sputtering film formation.

Subsequently, the wafer 1 is divided into the individual chip regions 2 by, for example, dicing, etc., (alternatively, laser dicing, laser grooving, or a combination of the above two and blade dicing may be adopted). Thereby, the scribe region 32 is removed and the wafer 1 is divided into many chips 2.

3. Description of Various Variations with Respect to Device Structure, in Particular, with Respect to Range where Super Junction Structure is Formed, Etc., in Manufacturing Method of Power MOSFET According to One Embodiment of Present Application (Mainly FIGS. 25 to 28)

In this section, various variations with respect to the ranges of the super junction formation region 36 and the hard mask remaining region 38, with respect to the cut-out region R3 of the whole of a chip periphery described in the section 1, will be described. Herein, the basic structures and the process are not different from those described in the sections 1 and 2 (basic example: standard cell region peripheral super junction termination method), and hence only different parts will be described in principle.

FIG. 25 is a top view of the wafer corresponding to a cut-out region R3 of the whole of a chip periphery in FIG. 4, where the super junction structure is formed only inside of the cell region.

FIG. 26 is a top view of the wafer corresponding to the cut-out region R3 of the whole of a chip periphery in FIG. 4, where the super junction structure is formed with a buffer-type layout between the super junction formation region and the hard mask remaining region.

FIG. 27 is a top view of the wafer corresponding to the cut-out region R3 of the whole of a chip periphery in FIG. 4, where the super junction structure is formed in the whole chip region.

FIG. 28 is a top view of the wafer corresponding to the cut-out region R3 of the whole of a chip periphery in FIG. 4, where the super junction structure is formed in the whole chip region and in the outside periphery), is described.

Based on these views, various variations with respect to the device structure in the manufacturing method of a power MOSFET according to one embodiment of the application, in particular, with respect to the range, etc., where the super junction structure is formed, will be described.

(1) Description of Method of Forming Super Junction Limited to Inside of Cell Region (Mainly FIG. 25):

In this example, the super junction formation region 36 is not present outside the cell region 4, and hence almost the whole of the outside of the cell region 4, excluding an exceptional portion, becomes the hard mask remaining region 38, as illustrated in FIG. 25, which is different from the standard cell region peripheral super junction termination method (FIG. 4). Such a layout is effective in forming a junction termination structure mainly by a field plate, etc.

(2) Description of Buffer-Type Layout Between Super Junction Formation Region and Hard Mask Remaining Region (Mainly FIG. 26):

In this example, the super junction formation region 36 is also provided outside the cell region 4 (i.e., cell region outside peripheral super junction formation region 39), as illustrated in FIG. 26, which is similar to the standard cell region peripheral super junction termination method (FIG. 4). However, unlike the standard cell region peripheral super junction termination method (FIG. 4), a buffer region 42, which is a portion of the super junction non-formation region 37 but is not a portion of the hard mask remaining region 38, is provided between the super junction formation region 36 and the hard mask remaining region 38.

Thus, by providing the buffer region 42, i.e., a portion that is the super junction non-formation region 37 but is not the hard mask remaining region 38 between the super junction formation region 36 and the hard mask remaining region 38, an influence by a crystal defect caused in the hard mask remaining region 38 can be prevented from affecting the nearby super junction formation region 36.

Such a buffer region 42 can be provided not only in the case in FIG. 4 (specific layout to which the buffer region 42 is applied is illustrated in FIG. 26), but also in the cases in FIGS. 25, 27, and 28, etc.

(3) Description of Method of Forming Super Junction in Whole Chip Region (Mainly FIG. 27):

In this example, the super junction formation region 36 is also provided outside the cell region 4 (i.e., in the cell region outside peripheral super junction formation region 39), as illustrated in FIG. 27, which is similar to the standard cell region peripheral super junction termination method (FIG. 4). However, unlike the standard cell region peripheral super junction termination method (FIG. 4), the super junction formation region 36 in this instance includes the cell region 4 and the cell region outside peripheral super junction formation region 39, and thus covers almost the whole of the chip region 2. Accordingly, in this example, the hard mask remaining region 38 matches the scribe region 32 excluding an exceptional portion. Such a layout is effective in intending to make embedding characteristics, etc., to be uniform in the chip region.

(4) Description of Forming Super Junction in Whole Chip Region and Outside Periphery (Mainly FIG. 28):

In this example, part of the super junction formation region 36 is expanded to the outside of the chip region 2, as illustrated in FIG. 28, which is similar to the example (method of forming super junction in the whole chip region of FIG. 27) but different therefrom in the above point. Accordingly, of the scribe region 32, almost the whole of a portion, which is not the super junction formation region 36, becomes the hard mask remaining region 38 in this example. Such a layout is effective in intending to make the embedding characteristics to be uniform even in an end portion of the chip region. Herein, the "almost" means that an exceptional portion is excluded (the same is true for other portions).

As the variations, the case (method of forming super junction over whole wafer), where the super junction formation region 36 covers almost the whole region of the wafer 1, can be considered; however, such a case will be described in the section 7.

It is needless to say that the various variations described in this section and the method of forming super junction over whole wafer described in the section 7 can be applied not only to the examples described in the sections 1 and 2, but also to the examples described in other sections (e.g., example described in the section 4, etc.).

4. Description of Wafer Process, Etc., Regarding Variation 1 (Method of Thinning Out Stripe Hard Mask) with Respect to Hard Mask Layout within Cell Region in Manufacturing Method of Power MOSFET According to One Embodiment of Present Application (Mainly FIGS. 29 to 37):

In each of the examples described above, the hard mask remaining region 38 is not arranged in the super junction formation region 36 in principle. In this section, however, the hard mask remaining region 38 is partially (which means that all of the hard mask in region 36 is not made to remain) provided also in the super junction formation region 36.

In this example, almost of the basic portions are the same as those described above, and hence only different portions will be described hereinafter in principle. The same is true for the next section.

FIG. 29 is a sectional view of the device corresponding to FIG. 8, by which a wafer process, etc., regarding the variation 1 (method of thinning out stripe hard mask) with respect to a hard mask layout within the cell region in the manufacturing method of a power MOSFET according to the embodiment of the application, is described.

FIG. 30 is a sectional view of the device (step of processing underlying hard mask for trench etch) corresponding to FIG. 8.

FIG. 31 is a sectional view of the device (step of processing overlying hard mask for trench etch) approximately corresponding to FIG. 10.

FIG. 32 is a plan view of the cell region in the step in FIG. 33 corresponding to FIG. 12 (corresponding to the cut-out region R2 of the active cell in FIG. 2).

FIG. 33 is a sectional view of the device corresponding to FIG. 13 (step of removing overlying hard mask for trench etch).

FIG. 34 is a sectional view of the device corresponding to FIG. 14 (step of embedded epitaxial growth).

FIG. 35 is a sectional view of the device corresponding to FIG. 15 (step of first CMP).

FIG. 36 is a sectional view of the device corresponding to FIG. 16 (step of removing underlying hard mask for trench etch).

FIG. 37 is a sectional view of the device corresponding to FIG. 17 (step of second CMP).

Based on these views, a wafer process, etc., regarding the variation 1 (method of thinning out stripe hard mask) with respect to the hard mask layout within the cell region in the manufacturing method of a power MOSFET according to the one embodiment of the application, is described.

After the treatment described with respect to FIGS. 6 and 7 in the section 2, the second resist film 31 for processing underlying hard mask for trench etch is formed over almost the whole of the surface on the first main surface 1a side of the wafer 1 by, for example, coating, etc., as illustrated in FIG. 29. Subsequently, the second resist film 31 for processing underlying hard mask for trench etch is patterned by, for example, normal lithography, etc., and then the underlying hard mask layer 11f for trench etch is patterned by performing anisotropic dry etching using the patterned second resist film 31 as a mask and using, for example, a fluorocarbon-based etching gas, etc. This results in portions of the second resist film 31 over portions of the underlying hard mask layer 11f, in both the cell region 4 and in the scribe region 32. Thereafter, the second resist film 31 for processing underlying hard mask layer 11f for trench etch, which has become unnecessary, is removed by, for example, ashing, etc.

Subsequently, for example, a silicon oxide film is formed, as the overlying hard mask layer 11s for trench etch, over almost the whole of the surface on the first main surface 1a side of the wafer 1 by, for example, CVD, etc., as illustrated in FIG. 30. Thus, the underlying hard mask layer 11f for trench etch and the overlying hard mask layer 11s for trench etch together form the hard mask 11 for trench etch (hard mask film) in this example. Subsequently, the third resist film 33 for processing the overlying hard mask layer 11s for trench etch is formed over almost the whole of the surface on the first main surface 1a side of the wafer 1 by, for example, coating, etc. Subsequently, the third resist film 33 is patterned by, for example, normal lithography, etc.

Subsequently, the overlying hard mask layer 11s for trench etch is patterned by performing anisotropic dry etching using the patterned third resist film 33 as a mask and using, for example, a fluorocarbon-based etching gas, etc., as illustrated in FIG. 31. In this step, and as seen in FIG. 31, the overlying hard mask layer 11s for trench etch is patterned without etching the underlying hard mask layer 11f for trench etch. Thereafter, the third resist film 33, which has become unnecessary, is removed by, for example, ashing, etc.

Subsequently, trenches 12 for embedding P-type column region are formed over the first main surface 1a of the wafer 1 by performing anisotropic dry etching using the patterned hard mask 11 for trench etch as an etching-resistant mask and using, for example, a halogen-based etching gas, etc.

As seen in FIG. 31, in the cell region 4, upon formation of the trenches 12, some of N-type column regions 7 between adjacent trenches 12 are covered by both an underlying hard mask layer 11f and then an overlying hard mask layer 11s, other N-type column regions are covered only by an underlying hard mask layer 11f.

Subsequently, the overlying hard mask 11s for trench etch is removed by, for example, wet etching using a fluoric acid-based etching solution, etc., as illustrated in FIGS. 32 and 33. Thereby, the hard mask removed region 40 and the hard mask remaining region 38a (first hard mask remaining region) within the chip region 2 are formed also in the cell region 4. Herein, a stripe thinning out interval Ls can be preferably exemplified by, for example, approximately 15 μm (the range thereof is approximately 10 to 100 μm). Herein, an example, in which the hard mask remaining regions 38a are arranged in every other region between the trenches 12, has been described, but they may be arranged in a plurality of intervals.

Thus, the interval between the first hard mask film remaining regions each having a stripe shape is approximately 10 μm to 100 μm, which is sufficiently smaller than the dimension of the cell region, etc., (super junction formation region), and hence it is effective in securing the flatness in the cell region, etc., (super junction formation region).

When the whole wafer is viewed, the CMP stop film is left in a lattice pattern (cell region, etc., is stripe-shaped), as illustrated herein. Hence, it becomes possible to absorb a variation in the overgrowth amounts, including that in the cell region, etc., by the later-described CMP treatment. In addition, because the hard mask film has a double structure and is formed by film layers having properties different from each other (mainly, a silicon nitride-based insulating film and a silicon oxide-based insulating film), there is the advantage that selective etching treatment performed between application or removal of the film layers becomes simple. Further, because the remaining hard mask film covers almost the whole of the alignment mark region, the integrity of the alignment mark can be held even in the course of the embedded epitaxial growth, etc.

Subsequently, the embedded epitaxy layer 14 is formed by performing embedded epitaxial growth on almost the whole of the surface on the first main surface 1a side of the wafer 1, as illustrated in FIG. 34. In this case, the overgrowth amount can be preferably exemplified by, for example, a thickness of approximately 5 μm. Here, the epitaxial growth may be limited to those regions of the first main surface 1a not covered by the underlying hard mask layer 11f.

Subsequently, the first CMP (Chemical Mechanical Polishing) treatment is performed on the surface on the surface 1a side of the wafer 1 by using the hard mask 11 (11f) for trench etch as a CMP stop film, as illustrated in FIG. 35. In this case, a polishing amount is, for example, approximately 4.5 μm.

Subsequently, the hard mask 11 (11f) for trench etch is removed by wet etching (of course, dry etching may be adopted) using a silicon nitride film etching solution, such as, for example, hot phosphoric acid, as illustrated in FIG. 36. At the time, a level difference of the upper surface 1a of the wafer is, for example, approximately 0.5 μm or smaller. This is because the CMP stop film is present also in the cell region, etc., and is present uniformly from a macroscopic viewpoint (which corresponds to being distributed almost periodically) in this region.

Subsequently, both the embedded epitaxy layer 14 and the over-substrate epitaxy layer 1e are polished by performing the second CMP treatment, thereby allowing the surface to be flattened, as illustrated in FIG. 37. Thereby, the P-type column region 6 and the N-type column region 7 are formed. There is the high possibility that a sufficient polishing amount in this case is, for example, approximately 1.5 μm or smaller. Thus, the polishing amount in the second CMP treatment is smaller than that in the first CMP treatment. This is because, in the second CMP treatment, the surface can be flattened when a level difference becomes approximately three times the remaining level difference occurring after the first CMP treatment.

After this, only the cell region 4 (active cell cut-out region R2 of FIG. 37) is taken for an example, and a process is explained.

The subsequent steps are completely the same as those described with respect to FIGS. 18 to 24 in the section 2.

5. Description of Variation 2 (Method of Covering Island Hard Mask) and Variation 3 (Method of Thinning Out Island Hard Mask) with Respect to Hard Mask Layout in Cell Region in Manufacturing Method of Power MOSFET According to One Embodiment of Present Application (Mainly FIGS. 38 and 39):

It is needless to say that the method of thinning out stripe hard mask described in the section 4 (e.g., FIG. 32) and each of the variations described hereinafter can be applied to the basic example described in the sections 1 and 2 and each of the variations described in the sections 3, 6, and 7, etc.

In this example, almost of the basic portions are the same as those described above, and hence only different portions will be described hereinafter in principle.

FIG. 38 is a plan view of the cell region (corresponding to the cut-out region R2 of the active cell in FIG. 2) in a step of trench etch corresponding to FIG. 12, by which the variation 2 (method of covering island hard mask) with respect to the hard mask layout within the cell region in the manufacturing method of a power MOSFET according to one embodiment of the application is described.

FIG. 39 is a plan view of the cell region (corresponding to the cut-out region R2 of the active cell in FIG. 2) in the step of trench etch corresponding to FIG. 12, by which a variation 3 (method of thinning out island hard mask) with respect to the hard mask layout within the cell region in the manufacturing method of a power MOSFET according to one embodiment of the application is described.

Based on these views, the variation 2 (method of covering island hard mask) and the variation 3 (method of thinning out island hard mask) with respect to a hard mask layout within the cell region in the manufacturing method of a power MOSFET according to one embodiment of the application will be described.

(1) Description of Method of Covering Island Hard Mask (Mainly FIG. 38):

In the example illustrated in FIG. 32, in the chip region 4, columns of stripe-shaped regions of hard mask remaining regions 38a (first hard mask remaining region) are thinned out in the horizontal direction by alternating with hard mask removed regions 40, with trenches 12 between adjacent region 38, 40. On the other hand, in the example illustrated in FIG. 38, in the chip region 4, columns of stripe-shaped regions of hard mask remaining regions 38a (first hard mask remaining region) are thinned out in the vertical direction by alternating with portions hard mask removed regions 40, for example, at every certain interval therein. Herein, an island thinning out interval Lb can be preferably exemplified by, for example, approximately 15 μm (the range thereof is approximately 10 to 100 μm). Thus, the interval between the island-shaped first hard mask film remaining regions is approximately 10 to 100 μm, which is sufficiently smaller than the dimension of the cell region, etc., (super junction formation region), and it is effective in securing the flatness in the cell region, etc., (super junction formation region).

An island length Li can be preferably exemplified by, for example, approximately 200 μm (the range thereof is approximately 100 to 500 μm).

(2) Description of Method of Thinning Out Island Hard Mask (Mainly FIG. 39):

In this example, the examples of FIGS. 32 and 38 are combined together, as illustrated in FIG. 39. That is, a portion, where the hard mask remaining region 38a (first hard mask remaining region) is provided, is thinned out for one stripe-shaped region, and a portion, where the hard mask remaining region 38a (first hard mask remaining region) in the chip region is provided, is thinned out in the vertical direction in each stripe-shaped region, for example, at every certain interval therein.

Herein, the stripe thinning out interval Ls can be preferably exemplified by, for example, approximately 15 μm (the range thereof is approximately 10 to 100 μm). Thus, the interval between the stripe-shaped first hard mask film remaining region is approximately 10 to 100 μm, which is sufficiently smaller than the dimension of the cell region, etc., (super junction formation region), and hence it is effective in securing the flatness in the cell region, etc., (super junction formation region). Herein, an example, in which the hard mask remaining regions 38a are arranged in every other region between the trenches 12, has been described, but they may be arranged in a plurality of intervals.

In addition, the island thinning out interval Lb can be preferably exemplified by, for example, approximately 15 μm (the range thereof is approximately 10 to 100 μm). Thus, the interval between the island-shaped first hard mask film remaining regions is approximately 10 to 100 μm, which is sufficiently smaller than the dimension of the cell region, etc., (super junction formation region), and it is effective in securing the flatness in the cell region, etc., (super junction formation region).

The island length Li can be preferably exemplified by, for example, approximately 200 μm (the range thereof is approximately 100 to 500 μm).

6. Description of Variation (LDMOSFET) with Respect to Device Structure in Manufacturing Method of Power MOSFET According to One Embodiment of Present Application (Mainly FIG. 40):

Applications to a vertical power MOSFET have been mainly described above, but applications to a LDMOSFET will be described in this section.

FIG. 40 is a perspective view of an essential part of a device, by which a variation (LDMOSFET) with respect to the device structure in the manufacturing method of a power MOSFET according to the one embodiment of the present application is described. Based on this view, the variation (LDMOSFET) with respect to the device structure in the manufacturing method of a power MOSFET according to the one embodiment of the application will be described. Because the LDMOSFET is normally formed over a P-type substrate, it is suitable for being integrated in a chip the same as that of a CMOS integrated circuit.

The outline of the device structure will be first described. As illustrated in FIG. 40, a chip 2 (chip region of the wafer 1 before being divided), in which an LDMOSFET is formed, is formed over a P-type single crystalline silicon substrate portion 1p (substrate layer). An N-type silicon epitaxy layer 1e (over-substrate epitaxy layer) is formed over the surface on the first main surface 1a side of the P-type single crystalline silicon substrate portion 1p, and over the surface thereof, for example, the polysilicon film 21 (gate electrode) is provided via the gate insulating film 19. Under the gate electrode 21 and over the N-type silicon epitaxy layer 1e on one side thereof, the P-type body region 16 (P-type channel region) is provided, and the N+-type source region 23 is provided in the surface region of the P-type body region 16 so as to be along the gate electrode 21. This P-type body region 16 and the N+-type source region 23 form, for example, a so-called double diffusion structure. Further, the P+-type body contact region 27 is provided over the surface of the P-type body region 16 so as to be along the N+-type source region 23 and to contact it.

On the other hand, under the N-type silicon epitaxy layer 1e on the other side of the gate electrode 21, pillar-shaped N-type buffer regions 41a, 41b, 41c, 41d, and 41e are provided, and the N+-type drain region 35 is provided over the surface of the N-type silicon epitaxy layer 1e over an N-type buffer region 41e. A super junction structure, which is formed by the pillar-shaped P-type column region 6 and the N-type column region 7, is provided over the surface of the N-type silicon epitaxy layer 1e between the N+-type drain region 35 and the P-type body region 16, this region serving as the super junction formation region 36.

One example of a manufacturing process of this device can be briefly described as follows. That is, the P-type single crystalline silicon wafer 1p is first provided. Subsequently, the N-type over-substrate epitaxy layer 1e is formed, to the middle of the thickness, over almost the whole of the surface of the P-type single crystalline silicon wafer 1p, and the impurity concentration of each of the N-type buffer regions 41a, 41b, 41c, 41d, and 41e is adjusted by selective ion implantation, etc. Thereafter, the N-type over-substrate epitaxy layer 1e is formed to the top portion. Subsequently, for example, the trench 12 for embedding P-type column region is formed, as illustrated in FIG. 11, etc., and the P-type column region 6 is embedded therein, similarly to FIGS. 14 to 17. Subsequently, the P-type body region 16 and the N+-type source region 23 are introduced by processing the gate electrode 21 almost similarly to FIG. 20 and by a double diffusion method using the processed gate electrode 21 as a mask. Herein, the N+-type drain region 35 is introduced simultaneously with, for example, N+-type source region 23. The P+-type body contact region 27 is form before or after the formation of the N+-type source region 23 and the N+-type drain region 35.

Herein, with the embedding of the P-type column region 6, the methods described in the sections 1 and 2 have been mainly described, but it is needless to say that the methods described in other sections may be used.

7. Additional Description with Respect to One Embodiment (Including Variations) and Consideration with Respect to Above Whole Description (Mainly FIGS. 41 and 42):

FIG. 41 is a process block flow view by which the outline of the manufacturing method of a power MOSFET according to the one embodiment of the present application is described. FIG. 42 is a top view of the wafer corresponding to the cut-out region R3 of the whole of a chip periphery in FIG. 4, by which additional description with respect to a method of forming super junction over whole wafer is made. Based on these views, additional description with respect to the embodiment (including variations) and consideration with respect to the above whole description will be made.

(1) Technical Issues in Technique of Forming Super Junction Structure by Embedded Epitaxial Growth Method Methods of forming a super junction structure by an embedded epitaxial growth method is normally and broadly divided into a whole mask remaining method and a whole mask removed method. In order to absorb a variation in the film thickness of the embedded epitaxial growth by polishing, a CMP stop film is useful. On the other hand, the CMP stop film can cause a crystal defect while the embedded epitaxial growth is being performing.

From the results of the study with respect to the whole mask remaining method by the present inventors, it has been made clear that: when an overgrowth amount of an embedded epitaxy layer becomes large, a crystal defect can be caused near to the surface of the layer due to the difference of the coefficients of thermal expansion between the hard mask film (CMP stop film) and silicon; and the depth of the defect becomes large in proportion to the overgrowth amount. In addition, this crystal defect causes a decrease in the withstand voltage between the source and drain, and hence it is needed to polish the surface of the silicon (without limiting to the embedded epitaxy layer) from which the hard mask film is removed, thereby causing the polishing, in which a thickness exceeding the degree required for the flattening of an original purpose is polished, to be needed.

On the other hand, from the results of the study with respect to the whole mask removed method by the present inventors, it has been made clear that, because a hard mask film (CMP stop film) is not present while the embedded epitaxial growth is being performed, it becomes difficult to absorb a variation in the thickness of an embedded epitaxial film by polishing, although a crystal defect is not caused.

(2) Description of Outline of Manufacturing Method of Power MOSFET According to One Embodiment of Present Application, Etc. (Mainly FIG. 41):

The outline of the manufacturing method of a power MOSFET according to the one embodiment of the present application can be described as follows. That is, by leaving a hard mask film for forming trench in a scribe region, etc., occurrence of a crystal defect in a cell region, etc., is avoided; by performing a first CMP treatment using the remaining hard mask film as a CMP stop film, a variation in the thickness of an embedded epitaxial growth film is absorbed; and by performing a second CMP treatment after the remaining hard mask film is removed, final flattening and removal of a defect can be achieved.

This process will be described specifically. As illustrated in FIG. 41, the wafer 1 of the same conductivity type having an over-substrate epitaxy layer (see, for example, FIG. 6) is first provided (step of providing epitaxy substrate of the same conductivity type 101). Subsequently, the hard mask 11 for trench etch (see, for example, FIG. 9) is formed over the first main surface 1a of the wafer 1 (see, for example, FIG. 6) (step of forming hard mask film 102). Subsequently, the hard mask 11 (see, for example, FIG. 10) is patterned (step of processing hard mask film 103). Subsequently, the trench 12 (see, for example, FIG. 11) is formed by using the patterned hard mask 11 (step of forming trench 104). Subsequently, the hard mask 11 is partially removed so as to leave the hard mask 11 in the hard mask remaining region 38 (see, for example, FIG. 4) of the scribe region (see, for example, FIG. 13) (step of partially removing hard mask film 105). Subsequently, the embedded epitaxy layer 14 (see, for example, FIG. 14) is formed in the trench 12 by performing embedded epitaxial growth (step of embedded epitaxial growth 106). Subsequently, the first CMP treatment is performed on the first main surface 1a of the wafer 1 by using the remaining hard mask 11 as the CMP stop film (see, for example, FIG. 15) (step of first CMP 107). Subsequently, the remaining hard mask 11 (see, for example, FIG. 16) is removed (step of removing CMP stop film 108). Subsequently, the second CMP treatment (see, for example, FIG. 17) is performed on the first main surface 1a of the wafer 1 (step of second CMP 109). Herein, the blocks coupled by dotted lines in FIG. 41 mean that an anteroposterior relationship between them is arbitrary, unless theoretically or technically specified.

(3) Description of Other Outlines, Etc., of Manufacturing Method of Power MOSFET According to One Embodiment of Present Application (See Mainly FIG. 4):

The examples described in the sections 1 and 2 can also be described as follows. That is, as illustrated in FIG. 4, the super junction formation region 36 is made to be part of the chip region 2 and the whole of the super junction non-formation region 37, including both part of the chip region 2 and almost the whole of the scribe region 32, is made to be the hard mask remaining region 38.

(4) Description of Outline, Etc., of Each Example in Sections 4 and 5 (Mainly See FIGS. 32, 38, and 39):

Comprehensive outline, etc., of each example in the sections 4 and 5 will be described similarly in the subsection (3). That is, in the super junction formation region 36, the portions where the hard mask is formed are divided into the hard mask remaining region 38 and the hard mask removed region 40 according to an approximately constant periodic structure.

(5) Additional Description with Respect to Method of Forming Super Junction Over Whole Wafer (Mainly FIG. 42):

As described with respect to FIG. 28 (method of forming super junction limited to whole chip region and to outside periphery) in the subsection (4) of the section 3, the super junction formation region 36 can be extended to the outside of the chip region 2. When the region 36 is extended to the utmost limit, it also becomes possible that almost the whole of the wafer is made to be the super junction formation region 36. FIG. 42 corresponds to this example (method of forming super junction over whole wafer. In this case, the super junction non-formation region 37 is not substantially present, and hence the examples described in the sections 4 and 5, and variations of them can be adopted. Such a layout is effective in intending to secure uniformity even in the end portion of a chip by making the embedding characteristics to be uniform in the whole wafer.

8. Summary

The invention made by the present inventors has been described specifically based on the preferred embodiments, but the invention should not be limited to these embodiments, and it is needless to say that various modifications may be made within a range not departing from the gist of the invention.

For example, a MOS structure having a planar gate structure has been described, as an example, in the embodiment, but the present invention should not be limited thereto, and it is needless to say that the invention can also be applied to a trench gate structure in completely the same way. In addition, a layout of the MOSFET where the gates are arranged to be parallel to the pn column and in a stripe pattern has been described as an example, but various layouts, in which the gates are arranged in the direction perpendicular to the pn column, arranged in a lattice pattern, or the like, can be adopted.

A structure, in which an N channel device is mainly formed over the upper surface of an N epitaxial layer present over an N+ single crystalline silicon substrate, has been described specifically in the embodiment, but the present invention should not be limited thereto, and a structure, in which a P channel device is formed over the upper surface of a P epitaxial layer present over a P+ single crystalline silicon substrate, may be adopted.

A power MOSFET has been described specifically in the embodiment as an example, but the present invention should not be limited thereto, and it is needless to say that the invention can be applied to a power device having a super junction structure, i.e., to a diode, etc. Further, it is needless to say that the invention can be applied to a semiconductor integrated circuit device, etc., having a built-in diode, etc.

What is claimed is:

1. A manufacturing method of a power MOSFET comprising the steps of:
   (a) providing a semiconductor wafer having both an over-substrate epitaxy layer of a first conductivity type on a first main surface side and a substrate layer of the first conductivity type on a second main surface side;
   (b) forming a hard mask film over the first main surface of the semiconductor wafer;
   (c) patterning the hard mask film;
   (d) forming a plurality of trenches over the first main surface of the semiconductor wafer by using the patterned hard mask film as a mask;
   (e) after the step (d) above, removing a portion of the hard mask film so as to leave, as a CMP stop film, the hard mask film in both: a first hard mask film remaining region inside each of a plurality of chip regions that are arranged over the first main surface in a lattice pattern; and a second hard mask film remaining region of a scribe region adjacent to each of the chip regions;
   (f) depositing, in a state where the CMP stop film is present in each of the chip regions and the scribe region, an embedded epitaxy layer of a second conductivity type opposite to the first conductivity type, over the first main surface of the semiconductor wafer by embedded epitaxial growth;
   (g) after the step (f) above, performing a first CMP treatment on the first main surface of the semiconductor wafer by using the CMP stop film as a CMP stopper;
   (h) after the step (g) above, removing the CMP stop film; and
   (i) after the step (h) above, performing a second CMP treatment on the first main surface of the semiconductor wafer.

2. The manufacturing method of a power MOSFET according to claim 1,
   wherein the first hard mask film remaining region is also provided in a cell region within each of the chip regions.

3. The manufacturing method of a power MOSFET according to claim 2,
   wherein the step (b) includes the steps of:
   (b1) forming a first insulating film over the first main surface of the semiconductor wafer;
   (b2) removing a portion of the first insulating film so as to leave, as a remaining first insulating film, the first insulating film in both the first hard mask film remaining region and the second hard mask film remaining region; and
   (b3) after the step (b2) above, forming a second insulating film over the first main surface of the semiconductor wafer, including over the remaining first insulating film, the second insulating film and the remaining first insulating film together forming the hard mask film.

4. The manufacturing method of a power MOSFET according to claim 3,
   wherein the second hard mask film remaining region includes an alignment mark region.

5. The manufacturing method of a power MOSFET according to claim 4,
   wherein the first insulating film is a silicon nitride-based insulating film, and the second insulating film is a silicon oxide-based insulating film.

6. The manufacturing method of a power MOSFET according to claim 5,
   wherein a polishing thickness amount in the second CMP treatment is smaller than that in the first CMP treatment.

7. The manufacturing method of a power MOSFET according to claim 6,
   wherein the first hard mask film remaining region presents a stripe-like form in the cell region.

8. The manufacturing method of a power MOSFET according to claim 6,
   wherein the first hard mask film remaining region presents an island-like form in the cell region.

9. The manufacturing method of a power MOSFET according to claim 7,
   wherein an interval between the first hard mask film remaining regions each presenting the stripe-like form is approximately 10 µm to 100 µm.

10. The manufacturing method of a power MOSFET according to claim 8,
    wherein an interval between the first hard mask film remaining regions each presenting the island-like form is approximately 10 µm to 100 µm.

11. The manufacturing method of a power MOSFET according to claim 1,
    wherein the step (b) includes the steps of:
    (b1) forming a first insulating film over the first main surface of the semiconductor wafer;
    (b2) removing a portion of the first insulating film so as to leave, as a remaining first insulating film, the first insulating film in both the first hard mask film remaining region and the second hard mask film remaining region; and
    (b3) after the step (b2) above, forming a second insulating film over the first main surface of the semiconductor wafer, including over the remaining first insulating film, the second insulating film and the remaining first insulating film together forming the hard mask film.

12. The manufacturing method of a power MOSFET according to claim 11,
    wherein the first insulating film is a silicon nitride-based insulating film, and the second insulating film is a silicon oxide-based insulating film.

13. The manufacturing method of a power MOSFET according to claim 11,
    wherein the second hard mask film remaining region includes an alignment mark region.

14. The manufacturing method of a power MOSFET according to claim 11,
    wherein a polishing thickness amount in the second CMP treatment is smaller than that in the first CMP treatment.

15. The manufacturing method of a power MOSFET according to claim 11,
    wherein the first hard mask film remaining region presents a stripe-like form in the cell region.

16. The manufacturing method of a power MOSFET according to claim 11,
    wherein the first hard mask film remaining region presents an island-like form in the cell region.

17. The manufacturing method of a power MOSFET according to claim 1,
    wherein the second hard mask film remaining region includes an alignment mark region.

18. The manufacturing method of a power MOSFET according to claim 1,
   wherein a polishing thickness amount in the second CMP treatment is smaller than that in the first CMP treatment.

19. The manufacturing method of a power MOSFET according to claim 1,
   wherein the first hard mask film remaining region presents a stripe-like form in the cell region.

20. The manufacturing method of a power MOSFET according to claim 1,
   wherein the first hard mask film remaining region presents an island-like form in the cell region.

\* \* \* \* \*

UNITED STATES PATENT AND TRADEMARK OFFICE
CERTIFICATE OF CORRECTION

| | |
|---|---|
| PATENT NO. | : 9,589,810 B2 |
| APPLICATION NO. | : 14/950200 |
| DATED | : March 7, 2017 |
| INVENTOR(S) | : Satoshi Eguchi et al. |

Page 1 of 1

It is certified that error appears in the above-identified patent and that said Letters Patent is hereby corrected as shown below:

On the Title Page

Item (72), Inventors, "Daisuki Taniguchi" should be changed to --Daisuke Taniguchi--

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*